United States Patent
Burgener et al.

(10) Patent No.: US 10,622,993 B2
(45) Date of Patent: *Apr. 14, 2020

(54) SWITCH CIRCUIT AND METHOD OF SWITCHING RADIO FREQUENCY SIGNALS

(71) Applicant: pSemi Corporation, San Diego, CA (US)

(72) Inventors: Mark L. Burgener, San Diego, CA (US); James S. Cable, San Diego, CA (US); Robert H. Benton, Sunnyvale, CA (US)

(73) Assignee: pSemi Corporation, San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/167,389

(22) Filed: Oct. 22, 2018

(65) Prior Publication Data
US 2019/0058470 A1     Feb. 21, 2019

Related U.S. Application Data

(63) Continuation of application No. 15/656,953, filed on Jul. 21, 2017, now Pat. No. 10,153,767, which is a
(Continued)

(51) Int. Cl.
*H04B 1/28* (2006.01)
*H01L 29/76* (2006.01)
(Continued)

(52) U.S. Cl.
CPC ............ *H03K 17/6871* (2013.01); *H01P 1/15* (2013.01); *H03K 17/063* (2013.01);
(Continued)

(58) Field of Classification Search
CPC ........... H03K 7/687; H03K 2217/0036; H03K 17/063; H03K 17/6913; H03K 17/102;
(Continued)

(56) References Cited

U.S. PATENT DOCUMENTS 3,983,414 A    9/1976 Stafford
5,012,399 A *  4/1991 Takemura ............ H02M 3/3385
                                                       323/902
(Continued)

FOREIGN PATENT DOCUMENTS

CN        1256521        6/2000
CN     200680025128.7   11/2012
(Continued)

OTHER PUBLICATIONS

Tieu, Binh Kien, Office Action received from the USPTO dated Mar. 7, 2018 for U.S. Appl. No. 15/656,953, 14 pgs.
(Continued)

*Primary Examiner* — Binh Kien Tieu
(74) *Attorney, Agent, or Firm* — Berkeley Law & Technology Group, LLP

(57) ABSTRACT

An RF switch circuit and method for switching RF signals that may be fabricated using common integrated circuit materials such as silicon, particularly using insulating substrate technologies. The RF switch includes switching and shunting transistor groupings to alternatively couple RF input signals to a common RF node, each controlled by a switching control voltage (SW) or its inverse (SW_), which are approximately symmetrical about ground. The transistor groupings each comprise one or more insulating gate FET transistors connected together in a "stacked" series channel configuration, which increases the breakdown voltage across the series connected transistors and improves RF switch compression. A fully integrated RF switch is described including control logic and a negative voltage generator with the RF switch elements. In one embodiment, the fully integrated RF switch includes an oscillator, a charge pump, CMOS logic circuitry, level-shifting and voltage divider circuits, and an RF buffer circuit.

14 Claims, 13 Drawing Sheets

Related U.S. Application Data continuation of application No. 14/883,499, filed on Oct. 14, 2015, now Pat. No. 9,780,778, which is a continuation of application No. 14/062,791, filed on Oct. 24, 2013, now Pat. No. 9,225,378, which is a continuation of application No. 12/980,161, filed on Dec. 28, 2010, now Pat. No. 8,583,111, which is a continuation of application No. 12/315,395, filed on Dec. 1, 2008, now Pat. No. 7,860,499, which is a continuation of application No. 11/582,206, filed on Oct. 16, 2006, now Pat. No. 7,460,852, which is a continuation of application No. 10/922,135, filed on Aug. 18, 2004, now Pat. No. 7,123,898, which is a continuation of application No. 10/267,531, filed on Oct. 8, 2002, now Pat. No. 6,804,502.

(60) Provisional application No. 60/328,353, filed on Oct. 10, 2001.

(51) Int. Cl.
  *H04M 1/00* (2006.01)
  *H03K 17/687* (2006.01)
  *H01P 1/15* (2006.01)
  *H03K 17/06* (2006.01)
  *H03K 17/10* (2006.01)
  *H03K 17/693* (2006.01)
  *H03K 19/0185* (2006.01)
  *H03K 19/0944* (2006.01)
  *H04B 1/40* (2015.01)
  *H03K 17/08* (2006.01)

(52) U.S. Cl.
  CPC ......... *H03K 17/102* (2013.01); *H03K 17/693* (2013.01); *H03K 19/018521* (2013.01); *H03K 19/0944* (2013.01); *H04B 1/40* (2013.01); *H03K 2017/0803* (2013.01)

(58) Field of Classification Search
  CPC .... H03K 17/6871; H03K 17/693; H04B 1/44; H04B 1/006; H04B 1/48; H04B 1/40; H01L 27/088; H01L 29/1083; H01L 29/0615; H01L 29/0661; H01L 29/0878; H01L 29/1079; H01L 29/1087; H01P 1/15
  USPC .......... 455/26.1, 78, 333, 425, 550.1, 556.1, 455/560; 340/572.1, 571; 323/220, 226, 323/270, 274, 285; 237/280, 281, 241, 237/472; 379/412, 413
  See application file for complete search history.

(56) References Cited

U.S. PATENT DOCUMENTS

| | | | |
|---|---|---|---|
| 5,095,348 A | 3/1992 | Houston | |
| 5,587,604 A | 12/1996 | Ibm | |
| 5,767,721 A | 6/1998 | Crampton | |
| 5,784,311 A | 7/1998 | Assaderaghi | |
| 5,818,099 A | 10/1998 | Burghartz | |
| 5,821,769 A | 10/1998 | Douseki | |
| 5,878,331 A | 3/1999 | Yamamoto | |
| 5,892,400 A | 4/1999 | Van Saders | |
| 5,959,335 A | 9/1999 | Bryant | |
| 5,990,580 A | 11/1999 | Weigand | |
| 6,081,443 A | 6/2000 | Morishita | |
| 6,084,255 A | 7/2000 | Ueda | |
| 6,094,088 A | 7/2000 | Yano | |
| 6,100,564 A | 8/2000 | Bryant | |
| 6,111,778 A | 8/2000 | MacDonald | |
| 6,140,805 A * | 10/2000 | Kaneko | G11C 5/145 323/265 |
| 6,201,761 B1 | 3/2001 | Wollesen | |
| 6,281,737 B1 | 8/2001 | Kuang | |
| 6,341,087 B1 | 1/2002 | Kunikiyo | |
| 6,356,536 B1 | 3/2002 | Repke | |
| 6,486,511 B1 | 11/2002 | Nathanson | |
| 6,498,370 B1 | 12/2002 | Kim | |
| 6,519,191 B1 | 2/2003 | Morishita | |
| 6,521,959 B2 | 2/2003 | Kim | |
| 6,563,366 B1 | 5/2003 | Kohama | |
| 6,646,305 B2 | 11/2003 | Assaderaghi | |
| 6,730,953 B2 | 5/2004 | Brindle et al. | |
| 6,769,110 B2 | 7/2004 | Katoh | |
| 6,804,502 B2 | 10/2004 | Burgener | |
| 6,804,506 B1 | 10/2004 | Freitag | |
| 7,405,982 B1 | 7/2008 | Flaker | |
| 8,008,988 B1 | 8/2011 | Yang et al. | |
| 8,330,519 B2 | 12/2012 | Lam et al. | |
| 8,461,903 B1 | 6/2013 | Granger-Jones | |
| 8,649,741 B2 * | 2/2014 | Iijima | H03K 17/6221 333/103 |
| 8,954,902 B2 * | 2/2015 | Stuber | H01L 27/1203 716/100 |
| 9,438,223 B2 | 9/2016 | de Jongh | |
| 9,467,124 B2 | 10/2016 | Crandall | |
| 9,755,615 B2 | 9/2017 | Ranta et al. | |
| 9,948,281 B2 | 4/2018 | Ranta | |
| 10,122,356 B2 | 11/2018 | Kunishi et al. | |
| 10,153,763 B2 | 12/2018 | Brindle et al. | |
| 10,153,767 B2 | 12/2018 | Burgener et al. | |
| 2001/0045602 A1 | 11/2001 | Maeda | |
| 2002/0093064 A1 | 7/2002 | Inaba | |
| 2003/0227056 A1 | 12/2003 | Wang | |
| 2004/0183588 A1 | 9/2004 | Chandrakasan et al. | |
| 2007/0018247 A1 * | 1/2007 | Brindle | H01L 29/78609 257/347 |
| 2011/0002080 A1 | 1/2011 | Ranta | |
| 2011/0169550 A1 * | 7/2011 | Brindle | H01L 29/78609 327/434 |
| 2011/0260780 A1 | 10/2011 | Granger-Jones et al. | |
| 2012/0064952 A1 * | 3/2012 | Iijima | H03K 17/6221 455/571 |
| 2013/0009725 A1 | 1/2013 | Heaney et al. | |
| 2013/0278317 A1 | 10/2013 | Iversen et al. | |
| 2013/0293280 A1 * | 11/2013 | Brindle | H01L 29/78609 327/382 |
| 2015/0236691 A1 | 8/2015 | Cam et al. | |
| 2016/0329891 A1 | 11/2016 | Bakalski et al. | |
| 2017/0201250 A1 | 7/2017 | Heaney et al. | |
| 2019/0081655 A1 | 3/2019 | Burgener et al. | |
| 2019/0088781 A1 | 3/2019 | Brindle et al. | |
| 2019/0089348 A1 | 3/2019 | Brindle et al. | |
| 2019/0097612 A1 | 3/2019 | Burgener et al. | |
| 2020/0036377 A1 | 1/2020 | Brindle | |
| 2020/0036378 A1 | 1/2020 | Brindle | |
| 2020/0067504 | 2/2020 | Brindle | |

FOREIGN PATENT DOCUMENTS

| | | |
|---|---|---|
| DE | 19832565 | 8/1999 |
| DE | 112011103554 | 9/2013 |
| EP | 385641 | 9/1990 |
| EP | 622901 | 11/1994 |
| EP | 782267 | 7/1997 |
| EP | 788185 | 8/1997 |
| EP | 851561 | 1/1998 |
| EP | 913939 | 5/1999 |
| EP | 625831 | 11/1999 |
| EP | 1006584 | 6/2000 |
| EP | 1451890 | 2/2001 |
| EP | 1925030 | 5/2008 |
| EP | 2348532 | 7/2011 |
| EP | 2348533 | 7/2011 |
| EP | 2348534 | 7/2011 |
| EP | 2348535 | 7/2011 |
| EP | 2348536 | 7/2011 |
| EP | 2387094 | 11/2011 |
| EP | 1774620 | 10/2014 |
| EP | 2884586 | 6/2015 |

(56) References Cited

FOREIGN PATENT DOCUMENTS

| | | |
|---|---|---|
| EP | 3113280 | 1/2017 |
| EP | 1902474 | 4/2017 |
| JP | 5575348 | 6/1980 |
| JP | H01254014 | 10/1989 |
| JP | 2161769 | 6/1990 |
| JP | H0434980 | 2/1992 |
| JP | H04183008 | 6/1992 |
| JP | H05299995 | 11/1993 |
| JP | H06112795 | 4/1994 |
| JP | H06314985 | 11/1994 |
| JP | H06334506 | 12/1994 |
| JP | H07046109 | 2/1995 |
| JP | H07070245 | 3/1995 |
| JP | H07106937 | 4/1995 |
| JP | H08023270 | 1/1996 |
| JP | H08070245 | 3/1996 |
| JP | H08148949 | 6/1996 |
| JP | H08251012 | 9/1996 |
| JP | H08307305 | 11/1996 |
| JP | H08330930 | 12/1996 |
| JP | H098627 | 1/1997 |
| JP | H9041275 | 2/1997 |
| JP | H9055682 | 2/1997 |
| JP | H0992785 | 4/1997 |
| JP | H09148587 | 6/1997 |
| JP | H09163721 | 6/1997 |
| JP | H09181641 | 7/1997 |
| JP | H09186501 | 7/1997 |
| JP | H09200021 | 7/1997 |
| JP | H09200074 | 7/1997 |
| JP | H09238059 | 9/1997 |
| JP | H09243738 | 9/1997 |
| JP | H098621 | 10/1997 |
| JP | H09270659 | 10/1997 |
| JP | H09284114 | 10/1997 |
| JP | H09284170 | 10/1997 |
| JP | H09298493 | 10/1997 |
| JP | H09326642 | 12/1997 |
| JP | H1079467 | 3/1998 |
| JP | H1093471 | 4/1998 |
| JP | H10242477 | 9/1998 |
| JP | H10242826 | 9/1998 |
| JP | H10242829 | 9/1998 |
| JP | H10284736 | 10/1998 |
| JP | H10335901 | 12/1998 |
| JP | H1126776 | 1/1999 |
| JP | H11112316 | 4/1999 |
| JP | H11136111 | 5/1999 |
| JP | H11163642 | 6/1999 |
| JP | H11163704 | 6/1999 |
| JP | H11205188 | 7/1999 |
| JP | H11274804 | 10/1999 |
| JP | 2000031167 | 1/2000 |
| JP | 2000058842 | 2/2000 |
| JP | 2000101093 | 4/2000 |
| JP | 2000183353 | 6/2000 |
| JP | 19980344247 | 6/2000 |
| JP | 2000188501 | 7/2000 |
| JP | 2000208614 | 7/2000 |
| JP | 2000223713 | 8/2000 |
| JP | 2000243973 | 9/2000 |
| JP | 2000277703 | 10/2000 |
| JP | 2000294786 | 10/2000 |
| JP | 2000311986 | 11/2000 |
| JP | 2001007332 | 1/2001 |
| JP | 2003060451 | 2/2001 |
| JP | 2001094114 | 4/2001 |
| JP | 2001119281 | 4/2001 |
| JP | 2001157487 | 5/2001 |
| JP | 2001156182 | 6/2001 |
| JP | 2001274265 | 10/2001 |
| JP | 2002156602 | 5/2002 |
| JP | 2000358775 | 6/2002 |
| JP | 2002290104 | 10/2002 |
| JP | 2003143004 | 5/2003 |
| JP | 2003167615 | 6/2003 |
| JP | 2003332583 | 11/2003 |
| JP | 2003347553 | 12/2003 |
| JP | 2004515937 | 5/2004 |
| KR | 19940027615 | 12/1994 |
| WO | WO86/01037 | 2/1986 |
| WO | WO9523460 | 8/1995 |
| WO | WO9806174 | 2/1998 |
| WO | WO9935695 | 7/1999 |
| WO | WO0227920 | 4/2002 |

OTHER PUBLICATIONS

Tieu, Binh Kien, Final Office Action received from the USPTO dated May 16, 2018 for U.S. Appl. No. 15/656,953, 12 pgs.

Tieu, Binh Kien, Notice of Alloiwance received from the USPTO dated Aug. 1, 2018 for U.S. Appl. No. 15/656,953, 13 pgs.

Tieu, Binh Kien, Response to Rule 312 Communication received from the USPTO dated Sep. 27, 2018 for U.S. Appl. No. 15/656,953, 3 pgs.

Burgener, et al., Preliminary Amendment filed in the USPTO dated Nov. 17, 2017 for U.S. Appl. No. 15/656,953, 7 pgs.

Burgener, et al., Response filed in the USPTO dated Apr. 19, 2018 for U.S. Appl. No. 15/656,953, 3 pgs.

Burgener, et al., Preliminary Amendment filed in the USPTO dated Jul. 12, 2018 for U.S. Appl. No. 15/656,953, 3 pgs.

Burgener, et al., Amendment After Allowance Pursuant to 37 CFR 1.312 filed in the USPTO dated Sep. 19, 2018 for U.S. Appl. No. 15/656,953, 7 pgs.

Hoffmann, Niels, Communication pursuant to Article 94(3) EPC received from the EPO dated Oct. 17, 2018 for appln. No. 1153227.1.

Hoffmann, Niels, Communication pursuant to Article 94(3) EPC received from the EPO dated Oct. 17, 2018 for appln. No. 11153247.9.

Itoh, et al., English Translation of Decision to Refuse received from the JPO dated Oct. 30, 2018, 20 pgs.

Tat, Binh C., Final Office Action received from the USPTO dated Dec. 3, 2018 for U.S. Appl. No. 15/419,898, 24 pgs.

Kuhl, Eva, Communication under Rule 71(3) EPC received from the EPO dated Nov. 2, 2018 for appln. No. 14182150.4, 5 pgs.

RF Micro Devices Inc., Invalidity Contentions for U.S. Pat. No. 8,405,147, Dec. 10, 2013 (Civil Case #: 3:12-cv-00911-H-JLB), 324 pages, Doc 8000.

RF Micro Devices Inc., Invalidity Contentions for U.S. Pat. No. 7,910,993, Dec. 10, 2013 (Civil Case #: 3:12-cv-00911-H-JLB), 1697 pages, Doc 8001.

RF Micro Devices Inc., Exhibit listing prior art identified in connection with Invalidity Contentions for U.S. Pat. No. 7,910,993 and U.S. Pat. No. 8,405,147, Dec. 10, 2013, (Civil Case #: 3:12-cv-00911-H-JLB), 21 pages, Doc 8004.

RF Micro Devices Inc., Amended Invalidity Contentions for U.S. Pat. No. 8,405,147, Dec. 10, 2013 (Civil Case #: 3:12-cv-00911-H-JLB), 362 pages, Doc 8006.

RF Micro Devices Inc., Amended Invalidity Contentions for U.S. Pat. No. 7,910,993, Dec. 10, 2013 (Civil Case #: 3:12-cv-00911-H-JLB), 110 pages, Doc 8007.

RF Micro Devices Inc., Amended Exhibit listing prior art identified in connection with Invalidity Contentions for U.S. Pat. No. 7,910,993 and U.S. Pat. No. 8,405,147, Dec. 10, 2013, (Civil Case #: 3:12-cv-00911-H-JLB), 33 pages, Doc 8005.

RF Micro Devices Inc., Invalidity Contentions for U.S. Pat. No. 7,860,499, Dec. 10, 2013 (Civil Case #: 3:12-cv-00911-H-JLB), 403 pages, Doc 8002.

RF Micro Devices Inc., Invalidity Contentions for U.S. Pat. No. 7,123,898, Dec. 10, 2013 (Civil Case #: 3:12-cv-00911-H-JLB), 383 pages, Doc 8003.

RF Micro Devices Inc., Amended Invalidity Contentions for U.S. Pat. No. 7,860,499, Dec. 10, 2013 (Civil Case #: 3:12-cv-00911-H-JLB), 445 pages, Doc 8008.

RF Micro Devices Inc., Amended Invalidity Contentions for U.S. Pat. No. 7,123,898, Dec. 10, 2013 (Civil Case #: 3:12-cv-00911-H-JLB), 430 pages, Doc 8009.

(56) References Cited

OTHER PUBLICATIONS

RF Micro Devices Inc., Invalidity Contentions for U.S. Pat. No. 7,860,499, Dec. 10, 2013 (Civil Case #: 3:12-cv-00911-H-JLB), 403 pages, Doc 8010.
RF Micro Devices Inc., Invalidity Contentions for U.S. Pat. No. 7,123,898, Dec. 10, 2013 (Civil Case #: 3:12-cv-00911-H-JLB), 383 pages, Doc 8011.
RF Micro Devices Inc., Amended Invalidity Contentions for U.S. Pat. No. 7,860,499, Dec. 10, 2013 (Civil Case #: 3:12-cv-00911-H-JLB), 445 pages, Doc 8012.
RF Micro Devices Inc., Amended Invalidity Contentions for U.S. Pat. No. 7,123,898, Dec. 10, 2013 (Civil Case #: 3:12-cv-00911-H-JLB), 504 pages, Doc 8013.
Docket for Case No. CACD-8-12-cv-00248 filed Feb. 14, 2012 in the United States District Court, Central District of California, Southern Division, 4 pages, Doc 8022.
Docket for Case 377-TA-848 filed Feb. 14, 2012 in the International Trade Commission, 14 pages, Doc 8023.
Docket for Case No. CASD-3-12-cv-00911 filed Feb. 13, 2012 in the United States District Court, Central District of California, Southern Division, 42 pages, Doc 8024.
Docket for Case No. CASD-3-12-cv-01160 filed May 11, 2012 in the United States District Court, Central District of California, Southern Division, 10 pages, Doc 8025.
Docket for Case No. CASD-3-13-cv-00725 filed Mar. 26, 2013 in the United States District Court, Central District of California, Southern Division, 4 pages, Doc 8026.
Docket for Case No. NCMD-1-12-cv-00377 filed Apr. 16, 2012 in the United States District Court, North Carolina Middle District, 5 pages, Doc 8027.
Peregrine's Verified Complaint filed with ITC Feb. 14, 2012 in 337-TA-848, 39 pages, Doc 8067.
Peregrine's Letter to Supplement Feb. 14, 2012 Complaint filed Feb. 16, 2012 in 337-TA-848, 1 page, Doc 8080.
Peregrine's Letter to Clarify and Supplement Feb. 14, 2012 Complaint filed Feb. 28, 2012 in 337-TA-848, 1 page, Doc 8081.
Peregrine's First Amended Complaint filed May 11, 2012 in 337-TA-848, 38 pages, Doc 8068.
Peregrine's Errata to Correct Typographical Error in Peregrine's First Amended Complaint filed May 15, 2012 in 337-TA-848, 2 pages, Doc 8071.
HTC's Response to First Amended Complaint filed Jul. 2, 2012 in 337-TA-848, 22 pages, Doc 8070.
Motorola's Exhibit A to the Response to Amended Complaint filed Jul. 2, 2012 in 337-TA-848, 3 pages, Doc 8073.
Motorola's Response to Amended Complaint filed Jul. 2, 2012 in 337-TA-848, 24 pages, Doc 8074.
RFMD's Response to First Amended Complaint filed Jul. 2, 2012 in 337-TA-848, 26 pages, Doc 8078.
HTC's Response to Amended Complaint filed Jul. 3, 2012 in 337-TA-848, 3 pages, Doc 8069.
Peregrine's Appendices A and I to Accompany First Amended Complaint filed Jul. 3, 2012 in 337-TA-848, 2 pages, Doc 8076.
Peregrine's Motion for Leave to Amend Complaint filed Jul. 20, 2012 in 337-TA-848, 87 pages, Doc 8077.
Peregrine's Letter to Supplement First Amended Complaint filed Jul. 25, 2012 in 337-TA-848, 3 pages, Doc 8072.
Peregrine's Notice of Patent Priority Dates filed Aug. 22, 2012 in 337-TA-848, 4 pages, Doc 8075.
Commission Investigative Staff's Notice of Prior Art filed Aug. 31, 2012 in 337-TA-848, 3 pages, Doc 8079.
Peregrine's Complaint for Damages and Injunctive Relief filed Feb. 14, 2012 in CACD-8-12-cv-00248, 101 pages, Doc 8082.
Peregrine's Complaint for Injunctive Relief filed Apr. 13, 2012 in CASD-3-12-cv-00911, 199 pages, Doc 8030.
RFMD and Motorola's Answer to Complaint and RFMD's Counterclaim filed Jun. 8, 2012 in CASD-3-12-cv-00911, 18 pages, Doc 8031.

RFMD's Answer, Defenses and Counterclaims to Plaintiff's Complaint filed May 1, 2013 in CASD-3-12-cv-00911, 11 pages, Doc 8032.
Peregrine's Answer to RFMD's Counterclaims filed May 28, 2013 in CASD-3-12-cv-00911, 10 pages, Doc 8033.
Peregrine's First Amended Complaint filed Nov. 21, 2013 in CASD-3-12-cv-00911, 348 pages, Doc 8035.
Peregrine's Motion for Preliminary Injunction filed Nov. 25, 2013 in CASD-3-12-cv-00911, 327 pages, Doc 8036.
RFMD's Amended Answer, Defenses and Counterclaims to Plaintiff's Complaint (Redacted Public Version) filed Dec. 12, 2013 in CASD-3-12-cv-00911, 65 pages, Doc 8034.
Defendant RFMD's Opposition to Peregrine's Motion for Preliminary Injunction filed Dec. 13, 2013 in CASD-3-12-cv-00911, 504 pages, Docs 8028A-8028D.
Peregrine's Reply in Support of Its Motion for Preliminary Injunction (Public Redacted Version) filed Dec. 20, 2013 in CASD-3-12-cv-00911, 130 pages, Doc 8037.
RFMD's Unopposed Motion for Leave to File Short Surreply in Opposition to Peregrine's Motion for Preliminary Injunction filed Jan. 3, 2014 in CASD-3-12-cv-00911, 60 pages, Doc 8038.
Peregrine's Unopposed Motion for Leave to File Response to RFMD's Surreply filed Jan. 3, 2014 in CASD-3-12-cv-00911, 15 pages, Doc 8039.
Peregrine's Answer and Counterclaims to RFMD's Counterclaims filed Jan. 6, 2014 in CASD-3-12-cv-00911, 23 pages, Doc 8040.
Order Denying Peregrine's Motion for Preliminary Injunction filed Jan. 8, 2014 in CASD-3-12-cv-00911, 7 pages, Doc 8041.
RFMD's Answer to Peregrine's Counterclaims filed Jan. 27, 2014 in CASD-3-12-cv-00911, 5 pages, Doc 8042.
RFMD's Motion to Dismiss Peregrine's 3rd, 4th, 6th, 7th and 8th Counts for Lack of Subject Matter Jurisdiction filed Jan. 30, 2014 in CASD-3-12-cv-00911, 323 pages, Doc 8043.
Defendant Benton's Answer and Defenses to Plaintiff's First Amended Complaint filed Jan. 31, 2014 in CASD-3-12-cv-00911, 36 pages, Doc 8044.
Joint Claim Construction and Prehearing Statement Pursuant to Patent L.R. 4.2 filed Feb. 4, 2014 in CASD-3-12-cv-0091, 176 pages, Doc 8045.
Defendant Benton's Notice of Joinder to RFMD's Motion to Dismiss and Motion and Memorandum in Support of Motion to Dismiss Peregrine's 1st, 2nd, and 3rd Causes of Action for Lack of Subject Matter Jurisdiction filed Feb. 26, 2014 in CASD-3-12-cv-00911, 13 pages, Doc 8046.
Peregrine's Memorandum in Opposition to RFMD's Motion to Dismiss filed Mar. 3, 2014 in CASD-3-12-cv-00911, 184 pages, Doc 8047.
Peregrine's Opening Claim Construction Brief filed Mar. 4, 2014 in CASD-3-12-cv-00911, 377 pages, Doc 8029A and 8029B.
RFMD's Opening Brief on Claim Construction (Public Redacted Version) filed Mar. 4, 2014 in CASD-3-12-cv-00911, 27 pages, Doc 8048.
RFMD's Declaration of Mark Tung in Support of RFMD's Opening Claim Construction Brief filed Mar. 4, 2014 in CASD-3-12-cv-00911, 162 pages, Doc 8049.
RFMD's Reply Memorandum in Support of Its Motion to Dismiss Peregrine's 4th, 6th, 7th and 8th Counts for Lack of Subject Matter Jurisdiction filed Mar. 10, 2014 in CASD-3-12-cv-00911, 37 pages, Doc 8051.
Peregrine's Memorandum in Opposition to Benton's Motion to Dismiss (Public Redacted Version) filed Mar. 14, 2014 in CASD-3-12-cv-00911, 86 pages, Doc 8052.
Order (1) Granting in Part and Denying in Part RFMD's Motion to Dismiss; (2) Granting Benton's Motin to Dismiss; and (3) Denying Peregrine's Motion to Stay filed Mar. 18, 2014 in CASD-3-12-cv-00911, 10 pages, Doc 8053.
Stricken Document: Response to Claim Construction Brief Pursuant to Order 214 filed Mar. 18, 2014 in CASD-3-12-cv-00911, 1 page, Doc 8054.
Declaration of Brian Floyd, Ph.D. filed Mar. 4, 2016 in CASD-3-12-cv-00911, 23 pages, Doc 8050.
Peregrine's Complaint for Damages and Injunctive Relief filed May 11, 2012 in CASD-3-12-cv-01160, 9 pages, Doc 8083.

(56) References Cited

OTHER PUBLICATIONS

RFMD's Complaint for Declaratory Judgment of Patent Non-Infringement and Invalidity filed Apr. 16, 2012 in NCMD-1-12-cv-00377, 246 pages, Doc 8085.
Jager, Ryan C., Office Action received from the USPTO dated Feb. 14, 2019 for U.S. Appl. No. 15/826,453, 33 pgs.
Tran, Pablo N., Notice of Allowance received from the USPTO dated Mar. 5, 2019 for U.S. Appl. No. 15/917,218, 13 pgs.
Schindler—"DC-40 GHz and 20-40GHz MMIC SPDT Switches", IEEE Transactions of Electron Devices, vol. ED-34, No. 12, Dec. 1987, pp. 2595-2602, 8 pages, Doc 0167.
Schindler—"DC-20 GHz N X M Passive Switches", IEEE Transactions on Microwave Theory and Techniques, vol. 36, No. 12, Dec. 1988, pp. 1604-1613, 10 pages, Doc 0172.
Assaderaghi—"A Dynamic Threshold Voltage MOSFET (DTMOS) for Ultra-low Voltage Operation", 1994, IEEE pp. 33.1.1 - 33.1.4, 4 pages, Doc 0203.
Pelella—"Analysis and Control of Hysteresis in PD/SOI CMOS", University of Florida, Gainesville, FL, 1999, IEEE, pp. 34.5.1-34.5.4, 4 pages, Doc 0404.
Brinkman—Respondents' Notice of Prior Art, Investigation No. 337-TA-848, dated Aug. 31, 2012, 59 pages, Doc 0825.
Kelly—U.S. Appl. No. 11/347,014, filed Feb. 3, 2006, 80 pages, Doc 4367.
USPTO—Notice of File Missing Parts dated Mar. 7, 2006 for U.S. Appl. No. 11/347,014, 2 pages, Doc 4368.
Kelly—Response to Pre-Exam Formalities Notice dated May 10, 2006 for U.S. Appl. No. 11/347,014, 11 pages, Doc 4369.
Tieu—Office Action dated Sep. 16, 2009 for U.S. Appl. No. 11/347,014, 26 pages, Doc 0713.
Kelly—Amendment and Terminal Disclaimers dated Mar. 22, 2010 for U.S. Appl. No. 11/347,014, 10 pages, Doc 4371.
USPTO—Terminal Disclaimer Review Decision dated Apr. 9, 2010 for U.S. Appl. No. 11/347,014, 1 page, Doc 4372.
USPTO—Notice of Allowance dated Apr. 29, 2010 for U.S. Appl. No. 11/347,014, 15 pages, Doc 4373.
USPTO—Supplemental Notice of Allowability dated Jul. 22, 2010 for U.S. Appl. No. 11/347,014, 4 pages, Doc 4374.
Kelly—Issue Fee Payment and Comments on Reasons for Allowance dated Aug. 2, 2010 for U.S. Appl. No. 11/347,014, 3 pages, Doc 4375.
USPTO—Issue Notification dated Aug. 25, 2010 for U.S. Appl. No. 11/347,014, 1 page, Doc 4376.
USPTO—Report on the Filing or Determination of an Action Regarding a Patent 3:12-cv-001160-CAB-BGS dated Jun. 11, 2012 for U.S. Appl. No. 11/347,014, 1 page, Doc 4377.
USPTO—Report on the Filing or Determination of an Action Regarding a Patent 1:12cv377 dated Jul. 11, 2012 for U.S. Appl. No. 11/347,014, 13 pages, Doc 4378.
USPTO—Report on the Filing or Determination of an Action Regarding a Patent 3:12-cv-001160-CAB-BGS dated Apr. 15, 2013 for U.S. Appl. No. 11/347,014, 1 page, Doc 4379.
Kelly—Change of Address and Notice of Loss of Small Entity Status dated Mar. 5, 2014 for U.S. Appl. No. 11/347,014, 5 pages, Doc 4380.
USPTO—Report on the Filing or Determination of an Action Regarding a Patent 3:12-cv-00911-AJB-WMC dated Oct. 15, 2014 for U.S. Appl. No. 11/347,014, 1 page, Doc 4381.
Kelly—Request for Certificate of Correction dated Mar. 7, 2016 for U.S. Appl. No. 11/347,014, 5 pages, Doc 4382.
USPTO—Certificate of Correction dated May 10, 2016 for U.S. Appl. No. 11/347,014, 1 page, Doc 4383.
Kelly—Notification of Loss of Small Entity Status dated Jun. 5, 2017 for U.S. Appl. No. 11/347,014, 1 page, Doc 4384.
Burgener—U.S. Appl. No. 10/922,135, filed Aug. 18, 2004, 63 pages, Doc 4350.
USPTO—Office Action dated Jun. 3, 2005 for U.S. Appl. No. 10/922,135, 11 pages, Doc 4351.
Burgener—Amendment dated Dec. 7, 2005 for U.S. Appl. No. 10/922,135, 10 pages, Doc 4352.
USPTO—Final Office Action dated Jan. 17, 2006 for U.S. Appl. No. 10/922,135, 9 pages, Doc 4353.
Burgener—Amendment dated May 19, 2006 for U.S. Appl. No. 10/922,135, 6 pages, Doc 4354.
USPTO—Notice of Allowance dated Jun. 2, 2006 for U.S. Appl. No. 10/922,135, 11 pages, Doc 4355.
Burgener—Issue Fee Payment dated Sep. 8, 2006 for U.S. Appl. No. 10/922,135, 1 page, Doc 4356.
Burgener—Amendment after final dated Apr. 25, 2009 for U.S. Appl. No. 10/922,135, 7 pages, Doc 4357.
Burgener—Request for Certificate of Correction dated Jul. 1, 2008 for U.S. Appl. No. 10/922,135, 3 pages, Doc 4358.
USPTO—Certificate of Correction dated Aug. 12, 2008 for U.S. Appl. No. 10/922,135, 1 page, Doc 4359.
USPTO—Report on the Determination of an Action Regarding a Patent or Trademark 3:12-cv-1160-CAB-BGS dated Jun. 11, 2012 for U.S. Appl. No. 10/922,135, 1 page, Doc 4360.
USPTO—Report on the Determination of an Action Regarding a Patent or Trademark 1:12CV377 dated Jul. 11, 2012 for U.S. Appl. No. 10/922,135, 13 pages, Doc 4361.
USPTO—Report on the Determination of an Action Regarding a Patent or Trademark 3:12-CV-1160-CAB-BGS) dated Apr. 15, 2013 for U.S. Appl. No. 10/922,135, 1 page, Doc 4363.
USPTO—Report on the Determination of an Action Regarding a Patent or Trademark SACV12-248 JST(RNBx) dated Dec. 21, 2013 for U.S. Appl. No. 10/922,135, 1 page, Doc 4362.
Burgener—Change of Address and Notification of Loss of Small Entity Status dated Mar. 5, 2014 for U.S. Appl. No. 10/922,135, 5 pages, Doc 4364.
USPTO—Report on the Determination of an Action Regarding a Patent or Trademark 3:12-CV-0911-AJB-WMC) dated Oct. 14, 2014 for U.S. Appl. No. 10/922,135, 1 page, Doc 4365.
Burgener—Notification of Loss of Small Entity Status dated Jun. 5, 2017 for U.S. Appl. No. 10/922,135, 1 page, Doc 4366.
Tieu—Notice of Allowance dated Jul. 15, 2008 for U.S. Appl. No. 11/582,206, 12 pages, Doc 0668.
Shingleton—Office Action dated Apr. 10, 2015 for U.S. Appl. No. 14/257,808, 8 pages, Doc 0958.
Burgener—U.S. Appl. No. 11/582,206, filed Oct. 16, 2006, 65 pages, Doc 4385.
USPTO—Filing Receipt dated Nov. 3, 2006 for U.S. Appl. No. 11/582,206, 3 pages, Doc 4386.
USPTO—Notice of Publication dated May 31, 2007 for U.S. Appl. No. 11/582,206, 1 page, Doc 4387.
USPTO—Office Action dated Nov. 15, 2007 for U.S. Appl. No. 11/582,206, 12 pages, Doc 4388.
Burgener—Amendment and Terminal Disclaimers dated May 19, 2008 for U.S. Appl. No. 11/582,206, 15 pages, Doc 4389.
USPTO—Notice of Allowance dated Jul. 15, 2008 for U.S. Appl. No. 11/582,206, 12 pages, Doc 4390.
Burgener—Issue Fee Payment dated Oct. 20, 2008 for U.S. Appl. No. 11/582,206, 2 pages, Doc 4391.
USPTO—Supplemental Non-Final Rejection dated Oct. 30, 2008 for U.S. Appl. No. 11/582,206, 4 pages, Doc 4392.
USPTO—Issue Notification dated Nov. 12, 2008 for U.S. Appl. No. 11/582,206, 1 page, Doc 4393.
USPTO—Report on the Filing or Determination of an Action Regarding a Patent 3:12-cv-001160-CAB-BGS dated Jun. 11, 2012 for U.S. Appl. No. 11/582,206, 1 page, Doc 4394.
USPTO—Report on the Filing or Determination of an Action Regarding a Patent 1:12cv377 dated Jul. 11, 2012 for U.S. Appl. No. 11/347,014, 13 pages, Doc 4395.
USPTO—Report on the Filing or Determination of an Action Regarding a Patent 8:12-cv-00248-JST-RNB dated Feb. 21, 2013 for U.S. Appl. No. 11/582,206, 1 page, Doc 4396.
USPTO—Report on the Filing or Determination of an Action Regarding a Patent 8:12-cv-1160-CAB-BGS dated Apr. 15, 2013 for U.S. Appl. No. 11/582,206, 1 page, Doc 4397.
USPTO—Report on the Filing or Determination of an Action Regarding a Patent 8:12-cv-00911-AJB-WMC dated Oct. 14, 2014 for U.S. Appl. No. 11/582,206, 1 page, Doc 4398.
Burgener—Notification of Loss of Small Entity Status dated Sep. 9, 2015 for U.S. Appl. No. 11/582,206, 1 page, Doc 4399.

(56) References Cited

OTHER PUBLICATIONS

Burgener—U.S. Appl. No. 12/315,395, filed Dec. 1, 2008, 65 pages, Doc 4400.
USPTO—Notice of Publication dated May 7, 2009 for U.S. Appl. No. 12/315,395, 1 page, Doc 4402.
USPTO—Notice of Allowance dated Aug. 11, 2010 for U.S. Appl. No. 12/315,395, 33 pages, Doc 4403.
USPTO—Supplemental Notice of Allowability dated Oct. 29, 2010 for U.S. Appl. No. 12/315,395, 10 pages, Doc 4404.
Burgener—Issue Fee Payment dated Nov. 16, 2010 for U.S. Appl. No. 12/315,395, 1 page, Doc 4405.
USPTO—Issue Notification dated Dec. 8, 2010 for U.S. Appl. No. 12/315,395, 1 page, Doc 4406.
USPTO—Report on the Filing or Determination of an Action Regarding a Patent 3:12-cv-001160-CAB-BGS dated Jun. 11, 2012 for U.S. Appl. No. 1 page, Docc 4407.
USPTO—Report on the Filing or Determination of an Action Regarding a Patent 1:12cv377 dated Jul. 11, 2012 for U.S. Appl. No. 12/315,395, 13 pages, Doc 4408.
USPTO—Report on the Filing or Determination of an Action Regarding a Patent 8:12-cv-1160-CAB-BGS dated Apr. 15, 2013 for U.S. Appl. No. 12/315,395, 1 page, Doc 4409.
Burgener—Change of Address and Notification of Loss of Small Entity Status dated Mar. 7, 2014 for U.S. Appl. No. 12/315,595, 5 pages, Doc 4410.
USPTO—Report on the Filing or Determination of an Action Regarding a Patent dated Oct. 14, 2014 for U.S. Appl. No. 12/315,395, 1 page, Doc 4411.
Burgener—Request for Certificate of Correction dated Mar. 7, 2016 for U.S. Appl. No. 12/315,395, 5 pages, Doc 4412.
USPTO—Certificate of Correction dated May 10, 2016 for U.S. Appl. No. 12/315,395, 1 page, Doc 4413.
Burgener—Notification of Loss of Small Entity Status dated Jun. 5, 2017 for U.S. Appl. No. 12/315,395, 1 page, Doc 4414.
USPTO—Filing Receipt dated Jan. 27, 2019 for U.S. Appl. No. 12/315,395, 3 pages, Doc 4401.
Burgener—U.S. Appl. No. 12/9810,161, filed Dec. 28, 2010, 68 pages, Doc 4415.
USPTO—Filing Receipt dated Jan. 13, 2011 for U.S. Appl. No. 12/980,161, 4 pages, Doc 4416.
USPTO—Notice of Publication dated Apr. 21, 2011 for U.S. Appl. No. 12/980,161, 1 page, Doc 4417.
Burgener—Preliminary Amendment dated Apr. 27, 2012 for U.S. Appl. No. 12/980,161, 28 pages, Doc 4418.
USPTO—Notice of Non-Compliant Amendment dated May 1, 2012 for U.S. Appl. No. 12/980,161, 2 pages, Doc 4419.
Burgener—Response to Notice of Non-Compliant Amendment—Preliminary Amendment dated May 17, 2012 for U.S. Appl. No. 12/980/161, 6 pages, Doc 4420.
USPTO—Office Action dated Feb. 19, 2013 for U.S. Appl. No. 12/980,161, 106 pages, Doc 4421.
Burgener—Amendment and Terminal Disclaimers dated Aug. 19, 2013 for U.S. Appl. No. 12/980,161, 32 pages, Doc 4422.
USPTO—Terminal Disclaimer Decision dated Aug. 21, 2013 for U.S. Appl. No. 12/980,161, 1 page, Doc 4423.
USPTO—Notice of Allowance dated Sep. 30, 2013 for U.S. Appl. No. 12/980,161, 186 pages, Doc 4424.
Burgener—Issue Fee Payment dated Oct. 8, 2013 for U.S. Appl. No. 12/980,161, 6 pages, Doc 4425.
USPTO—Issue Notification dated Oct. 23, 2013 for U.S. Appl. No. 12/980,161, 1 page, Doc 4426.
Burgener—Change of Address dated Nov. 8, 2013 for U.S. Appl. No. 12/980,161, 4 pages, Doc 4427.
Burgener—Request for Certificate of Correction dated Aug. 29, 2014 for U.S. Appl. No. 12/980,161, 7 pages, Doc 4428.
USPTO—Certificate of Correction dated Oct. 21, 2014 for U.S. Appl. No. 12/980,161, 1 page, Doc 4429.
Burgener—Notice of Loss of Small Entity Status dated Aug. 18, 2016 for U.S. Appl. No. 12/980,161, 1 page, Doc 4430.
Burgener—U.S. Appl. No. 14/062,791, filed Oct. 24, 2013, 66 pages, Doc 4431.
USPTO—Filing Receipt and Notice to File Missing Parts dated Nov. 12, 2013 for U.S. Appl. No. 14/062,791, 6 pages, Doc 4432.
Burgener—Response to Pre-Exam Formalities Notice dated Jan. 13, 2014 for U.S. Appl. No. 14/062,791, 15 pages, Doc 4470.
USPTO—Updated Filing Receipt and Acceptance of Power of Attorney dated Mar. 20, 2014 for U.S. Appl. No. 14/062,791, 5 pages, Doc 4471.
USPTO—Office Action dated Jun. 24, 2014 for U.S. Appl. No. 14/062,791, 10 pages, Doc 4472.
USPTO—Notice of Publication dated Jun. 30, 2014 for U.S. Appl. No. 14/062,791, 1 page, Doc 4473.
Burgener—Amendment and Terminal Disclaimer filed Nov. 24, 2014 for U.S. Appl. No. 11/062,791, 18 pages, Doc 4474.
USPTO—Terminal Disclaimer Decision dated Dec. 9, 2014 for U.S. Appl. No. 14/062,791, 1 page, Doc 4475.
USPTO—Notice of Allowance dated Jan. 23, 2015 for U.S. Appl. No. 14/062,791, 15 pages, Doc 4476.
USPTO—Notice of Allowance dated May 14, 2015 for U.S. Appl. No. 14/062,791, 11 pages, Doc 4477.
Burgener—Request for Continued Examination filed Aug. 14, 2015 in U.S. Appl. No. 14/062,791, 3 pages, Doc 4478.
USPTO—Notice of Allowance dated Sep. 4, 2015 for U.S. Appl. No. 14/062,791, 17 pages, Doc 4479.
Burgener—Issue Fee Payment dated Oct. 7, 2015 for U.S. Appl. No. 14/062,791, 5 pages, Doc 4480.
USPTO—Notice of Allowance dated Oct. 16, 2015 for Application No. 14/062,791, 8 pages, Doc 4481.
USPTO—Issue Notification dated Dec. 9, 2015 for U.S. Appl. No. 14/062,791, 1 page, Doc 4482.
Burgener—Application dated Oct. 14, 2015, U.S. Appl. No. 14/883,499, 66 pages, Doc 6025.
USPTO—Filing Receipt dated Nov. 2, 2015, U.S. Appl. No. 14/883,499, 4 pages, Doc 6026.
USPTO—Notice of Missing Parts dated Nov. 2, 2015, U.S. Appl. No. 14/883,499, 2 pages, Doc 6027.
Bergener—Response to Missing Parts dated Jan. 4, 2016, U.S. Appl. No. 14/883,499, 15 pages, Doc 6028.
USPTO—Updated Filing Receipt dated Mar. 32, 2016, U.S. Appl. No. 14/883,499, 6 pages, Doc 6029.
USPTO—Notice of Publication dated Jun. 30, 2016, U.S. Appl. No. 14/883,499, 1 page, Doc 6030.
USPTO—Office Action dated Oct. 4, 2016, U.S. Appl. No. 14/883,499, 26 pages, Doc 6031.
Burgener—Response to Office Action dated Feb. 3, 2017, U.S. Appl. No. 14/883,499, Doc 6032.
USPTO—Final Office Action dated May 18, 2017, U.S. Appl. No. 14/883,499, 24 pages, Doc 6033.
Burgener—Response to Final Office Action & Terminal Disclaimers dated May 26, 2017, U.S. Appl. 14/883,499, 19 pages, Doc 6034.
USPTO—Terminal Disclaimer Decision dated May 30, 2017, U.S. Appl. No. 14/883,499, 1 page, Doc 6035.
USPTO—Notice of Allowance dated Jun. 8, 2017, U.S. Appl. No. 14/883,499, 21 pages, Doc 6036.
Burgener—Issue Fee Payment dated Jul. 10, 2017, U.S. Appl. No. 14/883,499, 8 page, Doc 6037.
Burgener—RCE dated Jul. 13, 2017, U.S. Appl. No. 14/883,499, 3 pages, Doc 6038.
Burgener—Petition to Withdraw from Issuance dated Jul. 13, 2017, U.S. Appl. No. 14/883,499, 2 pages, Doc 6039.
USPTO—Decision on Petition to Withdraw from Issuance dated Jul. 13, 2017, U.S. Appl. No. 14/883,499 1 pages, Doc 6040.
Burgener—Petition to Accept Delayed Priority Claim dated Jul. 17, 2017, U.S. Appl. No. 14/883,499, 13 pages, Doc 6041.
USPTO—Notice of Allowance dated Aug. 3, 2017, U.S. Appl. No. 14/883,499, 42 pages, Doc 6042.
USPTO—Corrected Filing Receipt dated Aug. 17, 2017, U.S. Appl. No. 14/883,499, 4 pages, Doc 6043.
USPTO—Decision on Petition to Accept Delayed Priority Claim dated Aug. 21, 2017, U.S. Appl. No. 14/883,499, 9 pages, Doc 6044.
Burgener—Issue Fee Payment dated Aug. 22, 2017, U.S. Appl. No. 14/883,499, 7 pages, Doc 6045.

(56) References Cited

OTHER PUBLICATIONS

USPTO—Acceptance of Publication Request dated Aug. 23, 2017, U.S. Appl. No. 14/883,499, 1 page, Doc 6046.
USPTO—Supplemental Notice of Allowability dated Aug. 30, 2017, U.S. Appl. No. 14/883,499, 6 pages, Doc 6047.
USPTO—Issue Notification dated Sep. 13, 2017, U.S. Appl. No. 14/883,499, 1 page, Doc 6048.
Burgener—U.S. Appl. No. 15/656,953, filed Jul. 21, 2017, 71 pages, Doc 6005.
USPTO—Filing Receipt dated Aug. 4, 2017, U.S. Appl. No. 15/656,953, 4 pages, Doc 6006.
USPTO—Missing Parts dated Aug. 4, 2017, U.S. Appl. No. 15/656,953, 2 pages, Doc 6007.
Burgener—Response to Notice to File Missing Parts for U.S. Appl. No. 15/656,953, dated Oct. 4, 2017, 13 pages, Doc 6008.
Burgener—Preliminary Amendment dated Nov. 17, 2017, U.S. Appl. No. 15/656,953, 11 pages, Doc 6009.
USPTO—Updated Filing Receipt dated Nov. 22, 2017, U.S. Appl. No. 15/656,953, 4 pages, Doc 6010.
USPTO—Notice of Publication dated Mar. 1, 2018, U.S. Appl. No. 15/656,953, 1 page, Doc 6011.
USPTO—Office Action dated Mar. 7, 2018, U.S. Appl. No. 15/656,953, 21 pages, Doc 6012.
Burgener—Request to Update Applicant Name dated Apr. 8, 2018, U.S. Appl. No. 15/656,953 8 pages, Doc 6013.
USPTO—Corrected Filing Receipt dated Apr. 10, 2018 for U.S. Appl. No. 15/656,953, 4 page, Doc 6014.
Burgener—Response to Office Action dated Apr. 19, 2018, U.S. Appl. No. 15/656,953, 4 pages, Doc 6015.
USPTO—Terminal Disclaimer dated Apr. 19, 2018 for U.S. Appl. No. 15/656,953, 3 pages, Doc 6016.
USPTO—Final Office Action dated May 16, 2018, U.S. Appl. No. 15/656,953, 17 pages, Doc 6017.
Burgener—Response to Final Office Action dated Jul. 12, 2018, U.S. Appl. No. 15/656,953, 3 pages, Doc 6018.
USPTO—Notice of Allowance dated Aug. 1, 2018, U.S. Appl. No. 15/656,953, 20 pages, Doc 6019.
Burgener—Rule 312 Amendment dated Sep. 19, 2018, U.S. Appl. No. 15/656,953, Doc 6020.
USPTO—Response to Rule 312 Amendment dated Sep. 27, 2019, U.S. Appl. No. 15/656,953, 3 pages, Doc 6021.
USPTO—Supplemental Notice of Allowability dated Oct. 12, 2018, U.S. Appl. No. 15/656,953, 14 pages, Doc 6022.
Burgener—Issue Fee Payment dated Oct. 19, 2018, U.S. Appl. No. 15/656,953, 5 pages, Doc 6023.
USPTO—Issue Notification dated Nov. 20, 2018, U.S. Appl. No. 15/656,953, 1 page, Doc 6024.
Burgener—U.S. Appl. No. 16/167,389, filed Oct. 22, 2018, 76 pages, Doc 6000.
USPTO—Filing Receipt dated Nov. 16, 2018, U.S. Appl. No. 16/167,389, 4 pages, Doc 6001.
USPTO—Notice of Publication dated Feb. 21, 2019 for U.S. Appl. No. 16/167,389, 1 page, Doc 6002.
USPTO—Office Action dated Mar. 22, 2019 for U.S. Appl. No. 16/167,389, 20 pages, Doc 6003.
USPTO—Terminal Disclaimer dated Mar. 28, 2019 for U.S. Appl. No. 16/167,389, 7 pages, Doc 6004.
Burgener—Patent Application 10/267,531, filed Oct. 8, 2002, 72 pages, Doc 4339.
USPTO—Notice to File Corrected Application Papers dated Nov. 12, 2002 for U.S. Appl. No. 10/267,531, 1 page, Doc 4340.
Burgener—Response to Notice to File Corrected Application Papers and Replacement Figures dated Jan. 13, 2003 For U.S. Appl. No. 10/267,531, 16 pages, Doc 4341.
Burgener—Power of Attorney for Peregrine Semiconductor dated Feb. 4, 2003 for U.S. Appl. No. 10/267,531, 3 pages, Doc 4342.
USPTO—Acceptance of Power of Attorney dated Jan. 2, 2004 for U.S. Appl. No. 10/267,531, 1 page, Doc 4343.
USPTO—Notice of Allowance dated May 12, 2004 for U.S. Appl. No. 10/267,531, 32 pages, Doc 4344.
Burgener—Issue Fee Payment and Comments on Reasons for Allowance dated Aug. 12, 2004 for U.S. Appl. No. 10/267,531, 3 pages, Doc 4345.
Burgener—Request for Certificate of Correction dated Feb. 10, 2005 for U.S. Appl. No. 10/267,531, 2 pages, Doc 4346.
USPTO—Certificate of Correction dated Apr. 26, 2005 for U.S. Appl. No. 10/267,531, 1 page, Doc 4347.
Burgener—Request for Certificate of Correction dated Dec. 13, 2006 for U.S. Appl. No. 10/267,531, 1 page, Doc 4348.
USPTO—Certificate of Correction dated May 1, 2007 for U.S. Appl. No. 10/267,531, pages, Doc 4349.
Wells—Office Action dated Feb. 22, 2018 for U.S. Appl. No. 14/883,525, 19 pages, Doc 1044.
Wells—Final Office Action dated Jul. 5, 2018 for U.S. Appl. No. 14/883,525, 22 pages, Doc 1058.
Wells—Notice of Allowance dated Aug. 30, 2018 for U.S. Appl. No. 14/883,525, 13 pages, Doc 1061.
Le—Notice of Allowance dated Sep. 26, 2005 for U.S. Appl. No. 11/158,597, 14 pages, Doc 0631.
Le—Notice of Allowance dated Feb. 27, 2006 for U.S. Appl. No. 11/158,597, 11 pages, Doc 0640.
Tran—Office Action dated Mar. 19, 2009 for U.S. Appl. No. 11/501,125, 19 pages, Doc 0688.
Burgener—Amendment dated Jun. 19, 2009 for U.S. Appl. No. 11/501,125, 7 pages, 0696.
Tran—Office Action dated Oct. 29, 2009 for U.S. Appl. No. 11/501,125, 21 pages, 0716.
Burgener—Amendment filed May 5, 2010 for U.S. Appl. No. 11/501,125, 16 pages, Doc 0734.
Tran—Notice of Allowance dated Jun. 10, 2010 for U.S. Appl. No. 11/501,125, 13 pages, Doc 0740.
Tran—Notice of Allowance dated May 19, 2011 for U.S. Appl. No. 11/501,125, 16 pages, Doc 0780.
Tran—Notice of Allowance dated Oct. 6, 2011 for U.S. Appl. No. 11/501,125, 32 pages, Doc 0788.
Tran—Office Action dated Dec. 18, 2012 for U.S. Appl. No. 13/412,463, 8 pages, Doc 0830.
Burgener—Amendment dated May 20, 2013 for U.S. Appl. No. 13/412,463, 15 pages, Doc 0851.
Tran—Notice of Allowance dated Jun. 6, 2013 for U.S. Appl. No. 13/412,463, 18 pages, Doc 0854.
Tran—Office Action dated May 8, 2014 for U.S. Appl. No. 14/052,680, 14 pages, Doc 0907.
Burgener—Amendment dated Nov. 10, 2014 for U.S. Appl. No. 14/052,680, 17 pages, Doc 0937.
Tran—Notice of Allowance dated Feb. 3, 2017 for U.S. Appl. No. 14/052,680, 13 pages, Doc 1016.
Tran—Office Action dated Aug. 18, 2017 for U.S. Appl. No. 15/586,007, 14 pages, Doc 1034.
Burgener—Response dated Sep. 5, 2017 for U.S. Appl. No. 15/586,007, 13 pages, Doc 1035.
Tran—Office Action dated Sep. 27, 2017 for U.S. Appl. No. 15/586,007, 15 pages, Doc 1036.
Burgener—Response dated Oct. 11, 2017 for U.S. Appl. No. 15/586,007, 3 pages, Doc 1037.
Tran—Notice of Allowance dated Mar. 5, 2019 for U.S. Appl. No. 15/917,218, 18 pages, Doc 1071.
Trans—Office Action dated Feb. 3, 2012 for U.S. Appl. No. 12/903,848, 11 pages, Doc 0799.
Tran—Notice of Allowance dated Oct. 26, 2012 for U.S. Appl. No. 12/903,848, 27 pages, Doc 0828.
Tran—Notice of Allowance dated Feb. 15, 2013 for U.S. Appl. No. 12/903,848, 30 pages, Doc 0844.
Tran—Notice of Allowance dated May 16, 2013 for U.S. Appl. No. 12/903,848, 12 pages, Doc 0850.
Tran—Office Action dated Aug. 7, 2014 for U.S. Appl. No. 14/177,062, 9 pages, Doc 0919.
Burgener—Response dated Nov. 6, 2014 for U.S. Appl. No. 14/177,062, 22 pages, Doc 0936.
Tran—Office Action dated Feb. 24, 2015 for U.S. Appl. No. 14/177,062, 7 pages, Doc 0950.
Burgener—Response dated Dec. 3, 2015 for U.S. Appl. No. 14/177,062, 13 pages, Doc 0977.

(56) References Cited

OTHER PUBLICATIONS

Tran—Notice of Allowance dated Mar. 25, 2016 for U.S. Appl. No. 14/177,062, 159 pages, Doc 0989.
Nguyen—Office Action dated Oct. 25, 2005 for U.S. Appl. No. 10/875,405, 9 pages, Doc 0632.
Burgener—Amendment dated Jan. 25, 2006 for U.S. Appl. No. 10/875,405, 13 pages, Doc 0637.
Nguyen—Office Action dated Apr. 20, 2006 for U.S. Appl. No. 10/875,405, 12 pages, Doc 0641.
Burgener—Amendment dated Aug. 21, 2006 for U.S. Appl. No. 10/875,405, 13 pages, Doc 0648.
Nguyen—Notice of Allowance dated Sep. 27, 2006 for U.S. Appl. No. 10/875,405, 10 pages, Doc 0649.
Burgener—Comments on Reasons for Allowance dated Dec. 26, 2006 for U.S. Appl. No. 10/875,405, 3 pages, Doc 0653.
Tieu—Notice of Allowance dated Dec. 19, 2008 for U.S. Appl. No. 11/127,520, 11 pages, Doc 0677.
Luu—Office Action dated Oct. 30, 2008 for U.S. Appl. No. 11/351,342, 15 pages, Doc 0676.
Kelly—Response to Office Action dated Jan. 30, 2009 for U.S. Appl. No. 11/351,342, 15 pages, Doc 0683.
Luu—Final Office Action dated Apr. 8, 2009 for U.S. Appl. No. 11/351,342, 15 pages, Doc 0689.
Kelly—Proposed Amendment After Final dated Jun. 8, 2009 for U.S. Appl. No. 11/351,342, 14 pages, Doc 0694.
Luu—Notice of Allowance dated Jul. 2, 2009 for U.S. Appl. No. 11/351,342, 10 pages, Doc 0697.
Chow—Office Action dated Aug. 19, 2008 for U.S. Appl. No. 11/347,671, 18 pages, Doc 0669.
Kelly—Amendment dated Dec. 19, 2008 for U.S. Appl. No. 11/348,671, 16 pages, Doc 0678.
Chow—Office Action dated Apr. 16, 2009 for U.S. Appl. No. 11/347,671, 18 pages, Doc 0690.
Kelly—Response dated Jun. 16, 2009 for U.S. Appl. No. 11/347,671, 14 pages, Doc 0695.
Chow—Office Action dated Jul. 20, 2009 for U.S. Appl. No. 11/347,671, 19 pages, Doc 0700.
Chow—Office Action dated Apr. 28, 2010 for U.S. Appl. No. 11/347,671, 22 pages, Doc 0737.
Kelly—Amendment dated Jul. 28, 2010 for U.S. Appl. No. 11/347,671, 9 pages, Doc 0748.
Chow—Office Action dated Aug. 20, 2010 for U.S. Appl. No. 11/347,671, 20 pages, Doc 0750.
Kelly—Amendment dated Dec. 20, 2010 for U.S. Appl. No. 11/347,671, 13 pages, Doc 0728.
Kelly—Amendment dated Dec. 20, 2010 for U.S. Appl. No. 11/347,671, 15 pages, Doc 0766.
Chow—Office Action dated Mar. 2, 2011 for U.S. Appl. No. 11/347,671, 17 pages, Doc 0768.
Kelly—Amendment dated May 2, 2011 for U.S. Appl. No. 11/347,671, 10 pages, Doc 0773.
Chow—Advisory Action dated May 2, 2011 for U.S. Appl. No. 11/347,671, 3 pages, Doc 0774.
Kelly—Notice of Appeal dated Jun. 2, 2011 for U.S. Appl. No. 11/347,671, 6 pages, Doc 0781.
Chow—Notice of Panel Decision from Pre-Appeal Brief Review dated Jul. 11, 2011 for U.S. Appl. No. 11/347,671, 2 pages, Doc 0783.
Kelly—Supplemental Amendment dated Aug. 9, 2011 for U.S. Appl. No. 11/347,671, 5 pages, Doc 0785.
Chow—Notice of Allowance dated Aug. 16, 2011 for U.S. Appl. No. 11/347,671, 17 pages, Doc 0786.
Kelly—Comments on Examiner's Statement of Reasons for Allowance dated Nov. 16, 2011 for U.S. Appl. No. 11/347,671, 10 pages, Doc 0794.
Stuber—U.S. Appl. No. 11/520,912, filed Sep. 14, 2006, 128 pages, Doc 4217.
USPTO—Notice to File Missing Parts dated Oct. 5, 2006 for U.S. Appl. No. 11/520,912, 2 pages, Doc 4218.
Stuber—Response to Pre-Exam Formalities Notice dated Dec. 8, 2006 for U.S. Appl. No. 11/520,912, 20 pages, Doc 4219.
USPTO—Updated Filing Receipt dated Dec. 15, 2019 for U.S. Appl. No. 11/520,912, 3 pages, Doc 4220.
USPTO—Notice of Publication dated Mar. 29, 2007 for U.S. Appl. No. 11/520,912, 1 page, Doc 4221.
USPTO—Office Action dated Sep. 15, 2008 for U.S. Appl. No. 11/520,912, 25 pages, Doc 4222.
Stuber—Amendment dated Mar. 16, 2009 for U.S. Appl. No. 11/520,912, 26 pages, Doc 4223.
USPTO—Restriction Requirement dated Jul. 8, 2009 for U.S. Appl. No. 11/520,912, 9 pages, Doc 4224.
Stuber—Response to Restriction Requirement and Amendment dated Sep. 8, 2009 for U.S. Appl. No. 11/520,912, 8 pages, Doc 4225.
USPTO—Final Office Action dated Dec. 10, 2009 for U.S. Appl. No. 11/520,912, 26 pages, Doc 4226.
Stuber—Response to Final Office Action and Amendment dated Jun. 14, 2010 for U.S. Appl. No. 11/520,912, 29 pages, Doc 4227.
USPTO—Notice of Allowance dated Sep. 16, 2010 for U.S. Appl. No. 11/520,912, 23 pages, Doc 4228.
Stuber—Issue Fee Payment and Comments dated Dec. 20, 2010 for U.S. Appl. No. 11/520,912, 7 pages, Doc 4229.
USPTO—Issue Notification and Miscellaneous Letter to Applicant dated Jan. 16, 2011 for U.S. Appl. No. 11/520,912, 3 pages, Doc 4230.
Peregrine—Notice of Loss of Small Entity Status dated Jun. 26, 2017 for U.S. Appl. No. 11/520,912, 1 page, Doc 4231.
PSemi—3.73 Statement dated Aug. 31, 2018 for U.S. Appl. No. 11/520,912, 5 pages, Doc 4232.
Stuber—U.S. Appl. No. 13/028,144, filed Feb. 15, 2011, 121 pages, Doc 4233.
USPTO—Filing Receipt and Notice to File Missing Parts dated Mar. 1, 2011 for U.S. Appl. No. 13/028,144, 5 pages, Doc 4234.
Stuber—Response to Pre-Exam Formalities Notice dated Jun. 1, 2011 for U.S. Appl. No. 13/028,144, 17 pages, Doc 4235.
USPTO—Updated Filing Receipt dated Jun. 10, 2011 for U.S. Appl. No. 13/028,144, 4 pages, Doc 4236.
USPTO—Restriction Requirement dated Jan. 18, 2012 for U.S. Appl. No. 13/028,144, 35 pages, Doc 4237.
Stuber—Response to Restriction Requirement dated Feb. 1, 2012 for U.S. Appl. No. 13/028,144, 6 pages, Doc 4238.
USPTO—Office Action dated Apr. 12, 2012 for U.S. Appl. No. 13/028,144, 25 pages, Doc 4239.
Stuber—Amendment and Terminal Disclaimer dated Aug. 13, 2012 for U.S. Appl. No. 3/028,144, 14 pages, Doc 4240.
USPTO—Terminal Disclaimer Decision dated Aug. 20, 2012 for U.S. Appl. No. 13/028,144, 1 page, Doc 4241.
Stuber—Supplemental Amendment dated Nov. 8, 2012 for U.S. Appl. No. 13/028,144, 24 pages, Doc 4242.
USPTO—Restriction Requirement dated Jan. 14, 2013 for U.S. Appl. No. 13/028,144, 22 pages, Doc 4243.
Stuber—Amendment dated Jul. 15, 2013 for U.S. Appl. No. 13/028,144, 30 pages, Doc 4244.
USPTO—Notice of Allowance dated Sep. 26, 2013 for U.S. Appl. No. 13/028,144, 42 pages, Doc 4245.
Stuber—Issue Fee Payment and Comments dated Sep. 27, 2013 for U.S. Appl. No. 13/028,144, 10 pages, Doc 4246.
USPTO—Issue Notification dated Dec. 11, 2013 for U.S. Appl. No. 13/028,144, 1 page, Doc 4247.
Stuber—Request for Continued Examination and Petition to Withdraw Application from Issue dated Dec. 16, 2013 for U.S. Appl. No. 13/028,144, 11 pages, Doc 4248.
USPTO—Notice of Withdraw from Issue dated Dec. 17, 2013 for U.S. Appl. No. 13/028,144, 1 page, Doc 4249.
Stuber—Amendment dated Dec. 20, 2013 for U.S. Appl. No. 13/028,144, 32 pages, Doc 4250.
USPTO—Notice of Allowance dated Jan. 23, 2014 for U.S. Appl. No. 13/028,144, 25 pages, Doc 4251.
Stuber—Petition for and Auto-Grant for Removal from Issue dated Mar. 7, 2014 for U.S. Appl. No. 13/028,144, 9 pages, Doc 4253.
Stuber—Request for Continued Examination dated Mar. 7, 2014 for U.S. Appl. No. 13/028,144, 3 pages, Doc 4254.

(56) References Cited

OTHER PUBLICATIONS

USPTO—Notice of Allowance dated Apr. 25, 2014 for U.S. Appl. No. 13/028,144, 43 pages, Doc 4255.
Stuber—Request for Continued Examination dated May 27, 2014 for U.S. Appl. No. 13/028,144, 3 pages, Doc 4256.
USPTO—Notice of Allowance dated Jul. 18, 2014 for U.S. Appl. No. 13/028,144, 53 pages, Doc 4257.
USPTO—Supplemental Notice of Allowability dated Aug. 27, 2014 for U.S. Appl. No. 13/028,144, 29 pages, Doc 4258.
Stuber—Request for Continued Examination dated Aug. 28, 2014 for U.S. Appl. No. 13/028,144, 3 pages, Doc 4259.
Stuber—Issue Fee Payment and Comments on Reasons for Allowance dated Oct. 1, 2014 for U.S. Appl. No. 13/028,144, 8 pages, Doc 4260.
USPTO—Notice of Allowance dated Oct. 1, 2014 for U.S. Appl. No. 13/028,144, 35 pages, Doc 4261.
USPTO—Issue Notification dated Oct. 23, 2014 for U.S. Appl. No. 13/028,144, 1 page, Doc 4262.
Stuber—Petition for and Auto-Grant of Removal from Issue dated Oct. 30, 2014 for U.S. Appl. No. 13/028,144, 7 pages, Doc 4263.
Stuber—Request for Continued Examination dated Oct. 30, 2014 for U.S. Appl. No. 13/028,144, 3 pages, Doc 4264.
USPTO—Notice of Allowance dated Dec. 5, 2014 for U.S. Appl. No. 13/028,144, 32 pages, Doc 4265.
Stuber—Issue Fee Payment and Comments on Reasons for Allowance dated Dec. 8, 2014 for U.S. Appl. No. 13/028,144, 8 pages, Doc 4266.
Stuber—Terminal Disclaimers dated Dec. 12, 2014 for U.S. Appl. No. 13/028,144, 10 pages, Doc 4252.
USPTO—Issue Notification dated Jan. 21, 2015 for U.S. Appl. No. 13/028,144, 1 page, Doc 4267.
Peregrine—Notice of Loss of Small Entity Status dated Jun. 26, 2017 for U.S. Appl. No. 13/028,144, 1 page, Doc 4268.
PSemi—3.73 Statement dated Aug. 31, 2018 for U.S. Appl. No. 13/028,144, 5 pages, Doc 4269.
Stuber—U.S. Appl. No. 13/948,094, filed Jul. 22, 2013, 144 pages, Doc 4270.
USPTO—Filing Receipt and Notice to Respond to Missing Parts dated Aug. 13, 2013 for U.S. Appl. No. 13/948,094, 10 pages, Doc 4271.
Stuber—Response to Pre-Exam Formalities Notice, Power of Attorney and 3.73 statement dated Nov. 13, 2013 for U.S. Appl. No. 13/948,094, 21 pages, Doc 4272.
USPTO—Updated Filing Receipt and Acceptance of Power of Attorney dated Mar. 11, 2014 for U.S. Appl. No. 13/948,094, 7 pages, Doc 4273.
USPTO—Restriction Requirement dated May 23, 2014 for U.S. Appl. No. 13/948,094, 13 pages, Doc 4274.
USPTO—Notice of Publication dated Jun. 19, 2014 for U.S. Appl. No. 13/948,094, 1 page, Doc 4275.
Stuber—Amendment dated Oct. 23, 2014 for U.S. Appl. No. 13/948,094, 35 pages, Doc 4276.
USPTO—Restriction Requirement dated Jan. 2, 2015 for U.S. Appl. No. 13/948,094, 18 pages, Doc 4277.
Stuber—Substitute Statement on Lieu of Oath or Declaration dated Feb. 26, 2015 for U.S. Appl. No. 13/948,094, 6 pages, Doc 4278.
Stuber—Response to Restriction Requirement and Amendment dated Mar. 2, 2015 for U.S. Appl. No. 13/948,094, 15 pages, Doc 4279.
USPTO—Office Action dated Mar. 27, 2015 for U.S. Appl. No. 13/948,094, 39 pages, Doc 4280.
Stuber—Amendment and Terminal Disclaimers dated Jul. 27, 2015 for U.S. Appl. No. 13/948,094, 35 pages, Doc 4281.
USPTO—Office Action dated Nov. 19, 2015 for U.S. Appl. No. 13/948,094, 45 pages, Doc 4282.
USPTO—Terminal Disclaimer Decisions dated Dec. 21, 2015 for U.S. Appl. No. 13/948,094, 1 page, Doc 4283.
Stuber—Notice of Appeal dated May 18, 2016 for U.S. Appl. No. 13/948,094, 7 pages, Doc 4284.
Stuber—Request for Continued Examination and Amendment dated Jul. 18, 2016 for U.S. Appl. No. 13/948,094, 22 pages, Doc 4285.
USPTO—Notice of Allowance dated Oct. 17, 2016 for U.S. Appl. No. 13/948,094, 45 pages, Doc 4286.
Stuber—Issue Fee Payment dated Jan. 17, 2017 for U.S. Appl. No. 13/948,094, 5 pages Doc 4287.
USPTO—Issue Notification dated Mar. 8, 2017 for U.S. Appl. No. 13/948,094, 1 page, Doc 4288.
PSemi—3.73 Statement dated Aug. 31, 2018 for U.S. Appl. No. 13/948,094, 5 pages, Doc 4289.
Stuber—U.S. Appl. No. 15/419,898, filed Jan. 30, 2017, 136 pages, Doc 4290.
USPTO—Filing Receipt and Notice to File Missing Parts dated Feb. 8, 2017 for U.S. Appl. No. 15/419,898, 8 pages, Doc 4291.
Stuber—Response to Notice to File Missing Parts dated Apr. 10, 2017 for U.S. Appl. No. 15/419,898, 13 pages, Doc 4292.
USPTO—Updated Filing Receipt, Informational Notice and Acceptance of Power of Attorney dated May 11, 2017 for U.S. Appl. No. 15/419,898, 8 pages, Doc 4293.
Stuber—Preliminary Amendment dated Jul. 21, 2017 for U.S. Appl. No. 15/419,898, 16 pages, Doc 4294.
USPTO—Notice of Publication dated Aug. 17, 2017 for U.S. Appl. No. 15/419,898, 1 page, Doc 4295.
Stuber—Request to Change Applicant Name dated Mar. 4, 2018 for U.S. Appl. No. 15/419/898, 6 pages, Doc 4296.
USPTO—Updated Filing Receipt dated Mar. 6, 2018 for U.S. Appl. No. 15/549,898, 10 pages, Doc 4297.
USPTO—Office Action dated Jun. 4, 2018 for U.S. Appl. No. 15/419,898, 47 pages, Doc 4298.
Stuber—Amendment, Terminal Disclaimers and Change of Applicant dated Aug. 31, 2018 for U.S. Appl. No. 15/419,898, 55 pages, Doc 4299.
USPTO—Terminal Disclaimer Decision dated Sep. 3, 2018 for U.S. Appl. No. 15/419,898, 1 page, Doc 4300.
USPTO—Final Office Action dated Dec. 3, 2018 for U.S. Appl. No. 15/419,898, 30 pages, Doc 4301.
Stuber—Authorization to Act on Representative Capacity dated Feb. 11, 2019 for U.S. Appl. No. 15/419,898, 4 pages, Doc 4302.
USPTO—Applicant-Initialed Interview Summary dated Apr. 18, 2019 for U.S. Appl. No. 15/419,898, 1 page, Doc 4303.
Stuber—Request for Continued Examination and Amendment dated May 2, 2019 for U.S. Appl. No. 15/419,898, 75 pages, Doc 4304.
USPTO—Acceptance of Power of Attorney dated May 20, 2019 for U.S. Appl. No. 15/419,898, 7 pages, Doc 4305.
USPTO—Notice of Allowance and Examiner-Initialed Interview Summary dated May 20, 2019 for U.S. Appl. No. 15/419,898, 35 pages, Doc 4326.
Brindle—U.S. Appl. No. 13/277,108, filed Oct. 19, 2011, 119 pages, Doc 4110.
USPTO—Filing Receipt and Notice to File Missing Parts dated Nov. 2, 2011 for U.S. Appl. No. 13/277,108, 6 pages, Doc 4111.
Brindle—Applicant Response to Pre-Exam Formalities Notice dated Feb. 1, 2012 for U.S. Appl. No. 13/277,108, 22 pages, Doc 4112.
USPTO—Updated Filing Receipt and Acceptance of Power of Attorney dated Jul. 16, 2012 for U.S. Appl. No. 13/277,108, 5 pages, Doc 4113.
USPTO—Office Action dated Sep. 26, 2012 for U.S. Appl. No. 13/277,108, 59 pages, Doc 4114.
USPTO—Notice of Publication dated Oct. 25, 2012 for U.S. Appl. No. 13/277,108, 1 page, Doc 4115.
Brindle—Amendment and Terminal Disclaimer dated Dec. 26, 2012 for U.S. Appl. No. 13/277,108, 23 pages, Doc 4117.
USPTO—Terminal Disclaimer Decision dated Jan. 4, 2013 for U.S. Appl. No. 13/277,108, 1 page, Doc 4118.
USPTO—Office Action dated Apr. 10, 2013 for U.S. Appl. No. 13/277,108, 246 pages, Doc 4119.
Brindle—Amendment dated Jul. 18, 2013 for U.S. Appl. No. 13/277,108, 41 pages, Doc 4120.
USPTO—Final Office Action dated Sep. 27, 2013 for U.S. Appl. No. 13/277,108, 32 pages, Doc 4121.
Brindle—Response to Final Office Action dated Dec. 27, 2013 for U.S. Appl. No. 13/277,108, 15 pages, Doc 4122.

(56) References Cited

OTHER PUBLICATIONS

USPTO—Notice of Allowance dated Jan. 10, 2014 for U.S. Appl. No. 13/277,108, 47 pages, Doc 4123.
Brindle—Issue Fee Payment dated Apr. 10, 2014 for U.S. Appl. No. 13/277,108, 5 pages, Doc 4124.
USPTO—Issue Notification dated May 14, 2014 for U.S. Appl. No. 13/277,108, 1 page, Doc 4125.
Peregrine—Notice of Loss of Small Entity Status dated Jun. 5, 2017 for U.S. Appl. No. 13/277,108, 1 page, Doc 4126.
Brindle—U.S. Appl. No. 14/198,315, filed Mar. 5, 2014, 124 pages, Doc 4127.
USPTO—Filing Receipt and Notice to File Missing Parts dated Mar. 24, 2014 for U.S. Appl. No. 14/198,135, 7 pages, Doc 4128.
Brindle—Response to Pre-Exam Formalities Notice dated May 27, 2014 for U.S. Appl. No. 14/198,315, 16 pages, Doc 4129.
USPTO—Updated Filing Receipt, Informational Notice and Acceptance of Power of Attorney dated Jul. 15, 2014 for U.S. Appl. No. 14/198,315, 7 pages, Doc 4130.
USPTO—Notice of Allowance dated Aug. 20, 2014 for U.S. Appl. No. 14/198,315, 54 pages, Doc 4131.
USPTO—Notice of Publication dated Oct. 23, 2014 for U.S. Appl. No. 14/198,315, 1 page, Doc 4132.
Brindle—Request for Continued Examination and Notification of Loss of Small Entity Status dated Nov. 20, 2014 for U.S. Appl. No. 14/198,315, 7 pages, Doc 4133.
USPTO—Notice of Allowance dated Feb. 3, 2015 for U.S. Appl. No. 14/198,315, 238 pages, Doc 4134.
Brindle—Substitute Statement in Lieu of Oath or Declaration dated Feb. 26, 2015 for U.S. Appl. No. 14/198,315, 6 pages, Doc 4135.
Brindle—Issue Fee Payment and Letter Regarding Substitute Statement dated May 4, 2015 for U.S. Appl. No. 14/198,315, 3 pages, Doc 4136.
USPTO—Corrected Filing Receipt dated Jun. 9, 2015 for U.S. Appl. No. 14/198,315, 4 pages, Doc 4137.
USPTO—Issue Notification dated Jun. 30, 2015 for U.S. Appl. No. 14/198,315, 1 page, Doc 4138.
Peregrine—Notification of Loss of Small Entity Status dated Jul. 31, 2017 for U.S. Appl. No. 14/198,315, 1 page, Doc 4139.
Brindle—U.S. Appl. No. 14/804,198, filed Jul. 20, 2015, 116 pages, Doc 4140.
USPTO—Filing Receipt and Notice to File Missing Parts dated Aug. 5, 2015 for U.S. Appl. No. 14/804,198, 6 pages, Doc 4141.
Brindle—Response to Pre-Exam Formalities Notice and Power of Attorney dated Oct. 5, 2015 for U.S. Appl. No. 14/804,198, 15 pages, Doc 4142.
Brindle—Preliminary Amendment dated Nov. 20, 2015 for U.S. Appl. No. 14/804,198, 15 pages, Doc 4143.
USPTO—Updated Filing Receipt, Acceptance of Power of Attorney and Informational Notice date Nov. 27, 2015 for U.S. Appl. No. 14/804,198, 7 pages, Doc 4144.
USPTO—Office Action dated Mar. 2, 2016 for U.S. Appl. No. 14/804,198, 9 pages, Doc 4145.
USPTO—Notice of Publication dated Mar. 3, 2016 for U.S. Appl. No. 14/804,198, 1 page, Doc 4146.
Brindle—Amendment dated Jun. 2, 2016 for U.S. Appl. No. 14/804,198, 17 pages, Doc 4147.
USPTO—Notice of Allowance dated Sep. 23, 2016 for U.S. Appl. No. 14/804,198, 33 pages, Doc 4148.
USPTO—Corrected Filing Receipt dated Oct. 11, 2016 for U.S. Appl. No. 14/804,198, 1 page, Doc 4149.
Brindle—Substitute Statement in Lieu of Oath or Declaration dated Oct. 28, 2016 for U.S. Appl. No. 14/804,198, 6 pages, Doc 4150.
Brindle—Request for Continued Examination dated Nov. 10, 2016 for U.S. Appl. No. 14/804,198, 3 pages, Doc 4151.
USPTO—Notice of Allowance dated Dec. 7, 2016 for U.S. Appl. No. 14/804,198, 34 pages, Doc 4152.
Brindle—Issue Fee Payment and 312 Amendment dated Mar. 7, 2017 for U.S. Appl. No. 14/804,198, 13 pages, Doc 4153.
USPTO—Notice of Allowance dated Mar. 27, 2017 for U.S. Appl. No. 14/804,198, 10 pages, doc 4154.
USPTO—312 Amendment Initialed by Examiner dated Apr. 14, 2017 for U.S. Appl. No. 14/804,198, 1 page, Doc 4155.
USPTO—Issue Notification dated Apr. 26, 2017 for U.S. Appl. No. 14/804,198, 1 page, Doc 4156.
Brindle—U.S. Appl. No. 15/354,723, filed Nov. 17, 2016, 123 pages, Doc 4157.
USPTO—Filing Receipt and Notice to File Missing Parts dated Nov. 30, 2016 for U.S. Appl. No. 15/354,723, 7 pages, Doc 4158.
Brindle—Response to Pre-Exam Formalities Notice dated Jan. 30, 2017 for U.S. Appl. No. 15/354,723, 13 pages, Doc 4159.
Brindle—Preliminary Amendment dated Feb. 23, 2017 for U.S. Appl. No. 15/354,723, 13 pages, Doc 4160.
USPTO—Updated Filing Receipt, Informational Notice and Acceptance of Power of Attorney dated Feb. 28, 2017 for U.S. Appl. No. 15/354,723, 7 pages, Doc 4161.
USPTO—Office Action dated Mar. 24, 2017 for U.S. Appl. No. 15/534,723, 22 pages, Doc 4162.
Brindle—Amendment and Terminal Disclaimer dated Apr. 17, 2017 for U.S. Appl. No. 15/354,723, 13 pages, Doc 4163.
USPTO—Terminal Disclaimer Decision dated May 4, 2017 for U.S. Appl. No. 15/354,723, 1 page, Doc 4164.
USPTO—Notice of Publication dated Jun. 8, 2017 for U.S. Appl. No. 15/354,723, 1 page, Doc 4165.
USPTO—Notice of Allowance dated Jun. 21, 2017 for U.S. Appl. No. 15/354,723, 36 pages, Doc 4166.
Brindle—Request for Continued Examination dated Jul. 18, 2017 for U.S. Appl. No. 15/354,723, 3 pages, Doc 4167.
Brindle—Substitute Statement in Lieu of Oath or Declaration dated Aug. 9, 2017 for U.S. Appl. No. 15/354,723, 6 pages, Doc 4168.
USPTO—Notice of Allowance dated Aug. 11, 2017 for U.S. Appl. No. 15/354,723, 31 pages, Doc 4169.
USPTO—Issue Fee Payment dated Aug. 25, 2017 for AU.S. Appl. No. 15/354,723, 1 page, Doc 4170.
USPTO—Corrected Notice of Allowability dated Sep. 11, 2017 for U.S. Appl. No. 15/354,723, 2 pages, Doc 4171.
USPTO—Issue Notification dated Sep. 20, 2017 for U.S. Appl. No. 15/354,723, 1 page, Doc 4172.
Brindle—U.S. Appl. No. 15/693,182, filed Aug. 31, 2017, 123 pages, Doc 4173.
USPTO—Filing Receipt and Notice to File Missing Parts dated Sep. 13, 2017 for U.S. Appl. No. 15/693,182, 7 pages, Doc 4174.
Brindle—Preliminary Amendment and Response to Pre-Exam Formalities Notice dated Nov. 13, 2017 for U.S. Appl. No. 15/693,182, 21 pages, Doc 4175.
USPTO—Updated Filing Receipt, Informational Notice and Acceptance of Power of Attorney dated Nov. 20, 2017 for U.S. Appl. No. 15/693,182, 7 pages, Doc 4176.
USPTO—Notice of Publication dated Mar. 1, 2018 for U.S. Appl. No. 15/693,182, 1 page, Doc 4177.
USPTO—Office Action dated Mar. 9, 2018 for U.S. Appl. No. 15/693,182, 15 pages, Doc 4178.
PSemi—Request to Correct Applicant Name dated Apr. 8, 2018 for U.S. Appl. No. 15/693,182, 8 pages, Doc 4179.
USPTO—Corrected Filing Receipt dated Apr. 10, 2018 for U.S. Appl. No. 15/693,182, 4 pages, Doc 4180.
PSemi—Amendment and Terminal Disclaimer dated Apr. 27, 2018 for U.S. Appl. No. 15/693,182, 19 pages, Doc 4181.
PSemi—Terminal Disclaimer filed Jun. 6, 2018 for U.S. Appl. No. 15/693,182, 4 pages, Doc 4182.
USPTO—Terminal Disclaimer decision dated Jun. 8, 2018 for U.S. Appl. No. 15/693,182, 1 page, Doc 4183.
USPTO—Notice of Allowance dated Jun. 21, 2018 for U.S. Appl. No. 15/693,182, 37 pages, Doc 4184.
PSemi—Substitute Statement in Lieu of Oath or Declaration dated Jul. 20, 2019 for U.S. Appl. No. 15/693,182, 6 pages, Doc 4185.
PSemi—Issue Fee Payment dated Jul. 23, 2018 for U.S. Appl. No. 15/693,182, 4 pages, Doc 4186.
USPTO—Notice of Allowance dated Aug. 6, 2018 for U.S. Appl. No. 15/693,182, 6 pages, Doc 4187.
USPTO—Issue Notification dated Aug. 23, 2018 for U.S. Appl. No. 15/693,182, 1 page, Doc 4188.
Brindle—U.S. Appl. No. 16/046,974, filed Jun. 26, 2018, 125 pages, Doc 4189.

(56) References Cited

OTHER PUBLICATIONS

USPTO—Filing Receipt and Notice to File Missing Parts dated Aug. 14, 2018 for U.S. Appl. No. 16/046,974, 7 pages, Doc 4190.
Brindle—Response to Pre-Exam Formalities Notice dated Oct. 9, 2018 for U.S. Appl. No. 16/046,974, 13 pages, Doc 4191.
Brindle—Preliminary Amendment dated Dec. 5, 2018 for U.S. Appl. No. 16/046,974, 14 pages, Doc 4192.
USPTO—Updated Filing Receipt and Acceptance of Power of Attorney dated Dec. 10, 2018 for U.S. Appl. No. 16/046,974, 7 pages, Doc 4193.
USPTO—Notice of Allowance dated May 8, 2019 for U.S. Appl. No. 16/046,974, 46 pages, Doc 4194.
PSemi—Power of Attorney dated May 16, 2019 for U.S. Appl. No. 16/046,974, 4 pages Doc 4195.
USPTO—Acceptance of Power of Attorney dated May 20, 2019 for U.S. Appl. No. 16/046,974, 2 pages, Doc 4196.
Brindle—U.S. Appl. No. 16/377,026, filed Apr. 5, 2019, 135 pages, Doc 4206.
Brindle—U.S. Appl. No. 16/377,114, filed Apr. 5, 2019, 161 pages, Doc 4211.
Brindle—Authorization to Act in Representative Capacity dated Apr. 16, 2019 for U.S. Appl. No. 16/377,026, 4 pages, Doc 4207.
Brindle—Authorization to Act in Representative Capacity dated Apr. 16, 2019 for U.S. Appl. No. 16/377,144, 4 pages, Doc 4212.
USPTO—Filing Receipt and Decision Granting Request for Track One dated Apr. 23, 2019 for U.S. Appl. No. 16/377,114, 8 pages, Doc 4213.
USPTO—Filing Receipt and Decision Granting Request for Track 1 dated Apr. 24, 2019 for U.S. Appl. No. 16/377,026, 8 pages, Doc 4208.
USPTO—Office Action dated May 24, 2019 for U.S. Appl. No. 16/377,114, 13 pages, Doc 4214.
USPTO—Notice of Allowance dated May 29, 2019 for U.S. Appl. No. 16/377,026, 24 pages, Doc 4209.
PSemi—Power of Attorney dated May 29, 2019 for U.S. Appl. No. 16/377,114, 4 pages, Doc 4215.
USPTO—Acceptance of Power of Attorney dated May 30, 2019 for U.S. Appl. No. 16/377,026, 1 page, Doc 4210.
USPTO—Acceptance of Power of Attorney dated May 30, 2019 for U.S. Appl. No. 16/377,114, 1 page, Doc 4216.
Brindle—U.S. Appl. No. 13/053,211, filed Mar. 22, 2011, 135 pages, Doc 4018.
USPTO—Filing Receipt for U.S. Appl. No. 13/053,211, 4 pages, Doc 4019.
USPTO—Notice of Publication for U.S. Appl. No. 13/053,211, 1 page, Doc 4020.
USPTO—Corrected Filing Receipt dated Nov. 14, 2011 for U.S. Appl. No. 13/053,211, 3 pages, Doc 4021.
USPTO—Notice of Allowance dated Nov. 17, 2011 for U.S. Appl. No. 13/053,211, 54 pages, Doc 4022.
USPTO—Issue Notification dated Feb. 15, 2012 for U.S. Appl. No. 13/053,211, 5 pages, Doc 4023.
Brindle—U.S. Appl. No. 13/412,529, filed Mar. 5, 2012, 123 pages, Doc 4024.
USPTO—Filing Receipt for U.S. Appl. No. 13/412,529 dated Mar. 23, 2012, 4 pages, Doc 4025.
USPTO—Office Action dated Apr. 11, 2012 for U.S. Appl. No. 13/412,529, 15 pages, Doc 4026.
USPTO—Notice of Publication dated Jul. 5, 2012 for U.S. Appl. No. 13/412,529, 1 page, Doc 4027.
Brindle—Response to Office Action dated Oct. 11, 2012 for U.S. Appl. No. 13/412,529, 22 pages, Doc 4028.
Brindle—Response to Office Action and Terminal Disclaimers dated Dec. 19, 2012 for U.S. Appl. No. 13/412,529, 25 pages, Doc 4029.
USPTO—Terminal Disclaimer Review Decision dated Dec. 27, 2012 for U.S. Appl. No. 13/412,529, 1 pages, Doc 4030.
USPTO—Notice of Allowance dated Jan. 17, 2013 for U.S. Appl. No. 13/412,529, 243 pages, Doc 4031.
Brindle—Issue Fee Payment dated Feb. 8, 2013 for U.S. Appl. No. 13/412,529, 9 pages, Doc 4032.
USPT—Notice of Allowance dated Feb. 8, 2013 for U.S. Appl. No. 13/412,529, 21 pages, Doc 4033.
USPTO—Issue Notification for U.S. Appl. No. 13/412,529, 1 page, Doc 4034.
U.S. District Court—Report on the Filing of an Action Regarding U.S. Pat. No. 8,405,147 dated Mar. 26, 2013 for U.S. Appl. No. 13/412,529, 1 page, Doc 4035.
U.S. District Court—Order Termination of Proceeding dated Jul. 29, 2014 for U.S. Appl. No. 13/412,529, 3 pages, Doc 4036.
U.S. District Court—Report on Determination of an Action dated Sep. 5, 2014 for U.S. Appl. No. 13/412,529, 1 page, Doc 4037.
Brindle—U.S. Appl. No. 13/850,251, filed Mar. 25, 2013, 124 pages, Doc 4038.
USPTO—Filing Receipt, Fee Sheet and Notice of Missing Parts dated May 15, 2013 for U.S. Appl. No. 13/850,251, 6 pages, Doc 4039.
Brindle—Response to Pre-Exam Formalities Notice dated Jul. 11, 2013 for U.S. Appl. No. 13/850,251, 18 pages, Doc 4040.
Brindle—Preliminary Amendment dated Jul. 19, 2013 for U.S. Appl. No. 13/850,251, 28 pages, Doc 4041.
USPTO—Updated Filing Receipt dated Aug. 1, 2013 for U.S. Appl. No. 13/850,251, 6 pages, Doc 4042.
USPTO—Office Action dated Oct. 2, 2013 for U.S. Appl. No. 13/850,251, 38 pages, Doc 4043.
USPTO—Notice of Publication for U.S. Appl. No. 13/850,251 dated Nov. 7, 2013, 1 page, Doc 4044.
Brindle—Amendment and Terminal Disclaimers for U.S. Appl. No. 13/850,251 dated Dec. 26, 2013, 32 pages, Doc 4045.
USPTO—Terminal Disclaimer Decisions dated Jan. 24, 2014 for U.S. Appl. No. 13/850,251, 1 page, Doc 4046.
Brindle—Notification of Loss of Small Entity Status dated Mar. 11, 2014 for U.S. Appl. No. 13/850,251, 1 page, Doc 4047.
USPTO—Office Action dated Apr. 2, 2014 for U.S. Appl. No. 13/850,251, 24 pages, Doc 4048.
Brindle—Amendment dated Oct. 2, 2014 for U.S. Appl. No. 13/850,251, 20 pages, Doc 4049.
Brindle—Amendment dated Oct. 2, 2014 for U.S. Appl. No. 13/850,251, 19 pages—2nd filed Oct. 2, 2014, Doc 4050.
USPTO—Final Office Action dated Jan. 22, 2015 for U.S. Appl. No. 13/850,251, 305 pages, Doc 4051.
Brindle—Response to Final Office Action and Terminal Disclaimers dated Mar. 23, 2015 for U.S. Appl. No. 13/850,251, 24 pages, Doc 4052.
USPTO—Terminal Disclaimer Decision dated Mar. 30, 2015 for U.S. Appl. No. 13/850,251, 1 page, Doc 4053.
USPTO—Notice of Allowance dated Apr. 22, 2015 for U.S. Appl. No. 13/850,251, 37 pages, Doc 4054.
USPTO—Corrected Notice of Allowability dated Jun. 18, 2015 for U.S. Appl. No. 13/850,251, 9 pages, Doc 4055.
USPTO—Office Communication dated Jul. 9, 2015 for U.S. Appl. No. 13/850,251, 32 pages, Doc 4056.
USPTO—Office Communication dated Jul. 16, 2015 for U.S. Appl. No. 13/850,251, 6 pages, Doc 4057.
Brindle—Issue Fee Payment dated Jul. 22, 2015 for U.S. Appl. No. 13/850,251, 8 pages, Doc 4058.
USPTO—Issue Notification dated Aug. 19, 2015 for U.S. Appl. No. 13/850,251, 10 pages, Doc 4059.
Peregrine—Notice of Loss of Small Entity Status dated Jul. 31, 2017 for U.S. Appl. No. 13/850,251, 1 page, Doc 4060.
Brindle—Patent application for U.S. Appl. No. 14/845,154 dated Sep. 3, 2015, 124 pages, Doc 4061.
USPTO—Filing Receipt and Notice to File Missing Parts dated Sep. 22, 2015 for U.S. Appl. No. 14/845,154, 6 pages, Doc 4062.
Brindle—Response to Pre-Exam Formalities Notice dated Nov. 23, 2015 for U.S. Appl. No. 14/845,154, 17 pages, Doc 4063.
USPTO—Updated Filing Receipt, Informational Notice, and Acceptance of Power of Attorney dated Mar. 23, 2016 for U.S. Appl. No. 14/845,154, 7 pages, Doc 4064.
USPTO—Office Action dated Jun. 1, 2016 for U.S. Appl. No. 14/845,154, 13 pages, Doc 4065.

(56) References Cited

OTHER PUBLICATIONS

USPTO—Notice of Publication dated Jun. 30, 2016 for U.S. Appl. No. 14/845,154, 1 page, Doc 4066.
Brindle—Amendment dated Oct. 28, 2016 for U.S. Appl. No. 14/845,154, 20 pages, Doc 4067.
USPTO—Final Office Action dated Mar. 8, 2017 for U.S. Appl. No. 14/845,154, 33 pages, Doc 4068.
Brindle—Amendment and Terminal Disclaimer dated Mar. 24, 2017 for U.S. Appl. No. 14/845,154, 11 pages, Doc 4069.
USPTO—Terminal Disclaimer Decision dated Mar. 30, 2017 for U.S. Appl. No. 14/845,154, 1 page, Doc 4070.
USPTO—Notice of Allowance dated Apr. 10, 2017 for U.S. Appl. No. 14/845,154, 21 pages, Doc 4071.
Brindle—Correction of Inventorship and Oath/Declarations filed Jun. 15, 2017 for U.S. Appl. No. 14/845,154, 21 pages, Doc 4072.
USPTO—Notice of Acceptance of Inventorship Correction and Updated Filing Receipt dated Jun. 22, 2017 for U.S. Appl. No. 14/845,154, 5 pages, Doc 4073.
USPTO—Notice of Allowance dated Jun. 28, 2017 for U.S. Appl. No. 14/845,154, 10 pages, Doc 4074.
Brindle—Request for Continued Examination dated Jul. 7, 2017 for U.S. Appl. No. 14/845,154, 3 pages, Doc 4075.
USPTO—Notice of Allowance dated Aug. 9, 2017 for U.S. Appl. No. 14/845,154, 20 pages, Doc 4076.
Brindle—Issue Fee Payment dated Aug. 24, 2017 for U.S. Appl. No. 14/845,154, 1 pages, Doc 4077.
USPTO—Corrected Notice of Allowability dated Sep. 6, 2017 for U.S. Appl. No. 14/845,154, 10 pages, Doc 4078.
USPTO—Issue Notification dated Sep. 13, 2017 for U.S. Appl. No. 14/845,154, 1 page, Doc 4079.
Brindle—U.S. Appl. No. 15/707,970, filed Sep. 18, 2017, 149 pages, Doc 4080.
USPTO—Filing Receipt and Notice to File Missing Parts dated Oct. 16, 2017 for U.S. Appl. No. 15/707,970, 7 pages, Doc 4081.
Brindle—Response to Request to File Missing Parts dated Dec. 4, 2017 for U.S. Appl. No. 15/707,970, 13 pages, Doc 4082.
Brindle—Preliminary Amendment dated Dec. 7, 2017 for U.S. Appl. No. 15/707,970, 14 pages, Doc 4083.
USPTO—Updated Filing Receipt and Informational Notice dated Dec. 17, 2017 for U.S. Appl. No. 15/707,970, 7 pages, Doc 4084.
USPTO—Office Action dated Jan. 12, 2018 for U.S. Appl. No. 15/707,970, 29 pages, Doc 4085.
Peregrine—Request to Change Applicant and Power of Attorney dated Jan. 26, 2018 for U.S. Appl. No. 15/707,970, 19 pages, Doc 4086.
Peregrine—Amendment dated Feb. 1, 2018 for U.S. Appl. No. 15/707,970, 15 pages, Doc 4087.
Peregrine—Terminal Disclaimer dated Feb. 1, 2018 for U.S. Appl. No. 15/707,970, 2 pages, Doc 4088.
USPTO—Corrected Filing Receipt and Acceptance of Power Attorney dated Feb. 1, 2018 for U.S. Appl. No. 15/707,970, 5 pages, Doc 4089.
PSemi—Request for Change of Applicant dated Feb. 26, 2018 for U.S. Appl. No. 15/707,970, 8 pages, Doc 4090.
USPTO—Corrected Filing Receipt dated Feb. 28, 2018 for U.S. Appl. No. 15/707,970, 4 pages, Doc 4091.
PSemi—Request for Correction of Name of Applicant dated Mar. 1, 2018 for U.S. Appl. No. 15/707,970, 8 pages, Doc 4092.
PSemi—Terminal Disclaimer filed Mar. 6, 2018 for U.S. Appl. No. 15/707,970, 4 pages, Doc 4093.
USPTO—Corrected Filing Receipt dated Mar. 7, 2018 for U.S. Appl. No. 15/707,970, 4 pages, Doc 4094.
USPTO—Terminal Disclaimer Decision filed Mar. 8, 2018 for U.S. Appl. No. 15/707,970, 1 page, Doc 4095.
USPTO—Notice of Publication dated Mar. 22, 2018 for U.S. Appl. No. 15/707,970, 1 page, Doc 4096.
USPTO—Notice of Allowance dated Apr. 2, 2018 for U.S. Appl. No. 15/707,970, 48 pages, Doc 4097.
PSemi—Request for Continued Examination dated May 5, 2018 for U.S. Appl. No. 15/707,970, 3 pages, Doc 4098.
USPTO—Notice of Allowance dated Jul. 2, 2018 for U.S. Appl. No. 15/707,970, 34 pages, Doc 4099.
PSemi—Request to Correct Inventorship dated Jul. 25, 2018 for U.S. Appl. No. 15/707,970, 19 pages, Doc 4100.
PSemi—Issue Fee Payment dated Aug. 1, 2018 for U.S. Appl. No. 15/707,970, 6 pages, Doc 4101.
USPTO—Notice of Improper Submission of Request Under 37 CFR 1.48(a) dated Aug. 2, 2018 for U.S. Appl. No. 15/707,970, 11 pages, Doc 4102.
USPTO—Corrected Notice of Allowability dated Aug. 16, 2018 for U.S. Appl. No. 15/707,970, 3 pages, Doc 4103.
PSemi—Petition (and Automatic Grant) for Withdraw from Issue After Payment of Issue Fee dated Aug. 22, 2018 for U.S. Appl. No. 15/707,970, 12 pages, Doc 4104.
PSemi—Request for Continued Examination dated Aug. 22, 2018 for U.S. Appl. No. 15/707,970, 3 pages, Doc 4105.
USPTO—Acceptance of Request to Correct Inventorship and Updated Filing Receipt dated Aug. 24, 2018 for U.S. Appl. No. 15/707,090, 22 pages, Doc 4106.
USPTO—Notice of Allowance dated Sep. 28, 2018 for U.S. Appl. No. 15/707,970, 44 pages, Doc 4107.
PSemi—Issue Fee Payment dated Oct. 17, 2018 for U.S. Appl. No. 15/707,970, 4 pages, Doc 4108.
USPTO—Issue Notification dated Nov. 20, 2018 for U.S. Appl. No. 15/707,970, 1 page, Doc 4109.
Brindle—U.S. Appl. No. 16/054,959, filed Aug. 3, 2018, 151 pages, Doc 4197.
USPTO—Filing Receipt and Notice to File Missing Parts dated Aug. 23, 2018 for U.S. Appl. No. 16/054,959, 8 pages, Doc 4198.
Brindle—Response to Pre-Exam Formalities Notice dated Oct. 23, 2018 for U.S. Appl. No. 16/054,959, 13 pages, Doc 4199.
Brindle—Amendment dated Dec. 11, 2018 for U.S. Appl. No. 16/054,959, 13 pages, Doc 4200.
USPTO—Updated Filing Receipt and Acceptance of Power of Attorney dated Dec. 14, 2018 for U.S. Appl. No. 16/054,959, 7 pages, Doc 4201.
USPTO—Notice of Publication dated Mar. 21, 2019 for U.S. Appl. No. 16/054,959, 1 page, Doc 4205.
PSemi—Power of Attorney dated May 16, 2019 for U.S. Appl. No. 16/054,959, 4 pages, Doc 4202.
USPTO—Acceptance of Power of Attorney dated May 20, 2019 for U.S. Appl. No. 16/054,959, 2 pages, Doc 4203.
USPTO—Notice of Allowance dated Jun. 7, 2019 for U.S. Appl. No. 16/054,959, 31 pages, Doc 4204.
Brindle—Application 11/484,370 as filed Jul. 10, 2006, 140 pages, Doc 4000.
USPTO—Notice to File Missing Parts for U.S. Appl. No. 11/484,370 dated Aug. 2, 2006, 2 pages, Doc 4001.
USPTO—Filing Receipt for U.S. Appl. No. 11/484,370, 3 pages, Doc 4002.
Brindle—Response to Notice to File Missing Parts for U.S. Appl. No. 11/484,370 dated Oct. 6, 2006, Doc 4003.
USPTO—Notice of Publication for U.S. Appl. No. 11/484,370 dated Jan. 25, 2007, 1 page, Doc 4004.
USPTO—Restriction Requirement dated Sep. 19, 2008 for U.S. Appl. No. 11/484,370, 11 pages, Doc 4005.
Brindle—Response to Restriction Requirement dated Jan. 26, 2009 for U.S. Appl. No. 11/484,370, 7 pages, Doc 4006.
USPTO—Restriction Requirement dated Apr. 23, 2009 for U.S. Appl. No. 11/484,370, 15 pages, Doc 4007.
Brindle—Response to Restriction Requirement dated Aug. 28, 2009 for U.S. Appl. No. 11/484,370, 7 pages, Doc 4008.
USPTO—Office Action dated Jan. 6, 2010 for U.S. Appl. No. 11/484,370, 56 pages, Doc 4009.
Brindle—Amendment filed Jul. 12, 2010 for U.S. Appl. No. 11/484,370, 24 pages, Doc 4010.
USPTO—Notice of Allowance dated Nov. 12, 2010 for U.S. Appl. No. 11/484,370, 32 pages, Doc 4011.
USPTO—Issue Notification dated Mar. 2, 2011 for U.S. Appl. No. 11/484,370, 1 page, Doc 4012.
USPTO—Report on the Filing or Determination of an Action Regarding a Patent or Trademark dated Jun. 11, 2012 for U.S. Appl. No. 11/484,370, 1 page, Doc 4013.

(56) References Cited

OTHER PUBLICATIONS

USPTO—Report on the Filing or Determination of an Action Regarding a Patent or Trademark dated Jul. 11, 2012 for U.S. Appl. No. 11/484,370, 13 pages, Doc 4014.
USPTO—Report on the Filing or Determination of an Action Regarding a Patent or Trademark dated Feb. 21, 2013 for U.S. Appl. No. 11/484,370, 1 page, Doc 4015.
USPTO—Report on the Filing or Determination of an Action Regarding a Patent or Trademark dated Apr. 15, 2013 for U.S. Appl. No. 11/484,370, 1 page, Doc 4016.
USPTO—Report on the Filing or Determination of an Action Regarding a Patent or Trademark advising of Dismissal dated Oct. 14, 2014 for U.S. Appl. No. 11/484,370, 1 page, Doc 4017.
Brindle—U.S. Appl. No. 11/881,816, filed Jul. 26, 2007, 45 pages, Doc 4433.
USPTO—Filing Receipt and Pre-Exam Formalities Notice dated Aug. 13, 2007 for U.S. Appl. No. 11/881,816, 5 pages, Doc 4434.
Brindle—Response to Pre-Exam Formalities Notice and Request for Corrected Filing Receipt dated Oct. 18, 2007 for U.S. Appl. No. 11/881,816, 16 pages, Doc 4435.
USPTO—Updated Filing Receipt dated Nov. 5, 2007 for U.S. Appl. No. 11/881,816, 3 pages, Doc 4436.
Brindle—Request for Corrected Filing Receipt dated Nov. 23, 2007 for U.S. Appl. No. 11/881,816, 4 pages, Doc 4437.
USPTO—Corrected Filing Receipt dated Dec. 19, 2007 for U.S. Appl. No. 11/881,816, 3 pages, Doc 4438.
USPTO—Notice of Publication dated Mar. 27, 2008 for U.S. Appl. No. 11/881,816, 1 page, Doc 4439.
USPTO—Restriction Requirement dated Oct. 7, 2008 for U.S. Appl. No. 11/881,816, 5 pages, Doc 4440.
Brindle—Amendment filed Jan. 12, 2009 for U.S. Appl. No. 11/881,816, 7 pages, Doc 4441.
USPTO—Notice of Non-Responsive Amendment dated Apr. 28, 2009 for U.S. Appl. No. 11/881,816, 3 pages, Doc 4442.
Brindle—Amendment filed Aug. 31, 2009 for U.S. Appl. No. 11/881,816, 7 pages, Doc 4443.
USPTO—Office Action dated Jan. 19, 2010 for U.S. Appl. No. 11/881,816, 8 pages, Doc 4444.
Brindle—Amendment filed Jul. 21, 2010 for U.S. Appl. No. 11/881,816, 23 pages, Doc 4445.
USPTO—Final Office Action dated Oct. 14, 2010 for U.S. Appl. No. 11/881,816, 17 pages, Doc 4446.
Brindle—Amendment dated Jan. 14, 2011 for U.S. Appl. No. 11/881,816, 19 pages, Doc 4447.
USPTO—Advisory Action dated Mar. 18, 2011 for U.S. Appl. No. 11/881,816, 3 pages, Doc 4448.
USPTO—Examiner Interview Summary dated Apr. 18, 2011 for U.S. Appl. No. 11/881,816, 3 pages, Doc 4449.
Brindle—Letter Confirming No Formal Response to Examiner Interview Summary Required dated Jun. 29, 2011 for U.S. Appl. No. 11/881,816, 1 page, Doc 4450.
USPTO—Notice of Allowance dated Oct. 12, 2011 for U.S. Appl. No. 11/881,816, 10 pages, Doc 4451.
Brindle—Issue Fee Payment dated Jan. 17, 2012 for U.S. Appl. No. 11/881,816, 1 page, Doc 4452.
USPTO—Issue Notification dated Mar. 7, 2012 for U.S. Appl. No. 11/881,816, 1 page, Doc 4453.
Brindle—Auto-Granted Petition to Remove from Issue dated Mar. 26, 2012 for U.S. Appl. No. 11/881,816, 6 pages, Doc 4454.
Brindle—Request for Continued Examination filed Mar. 26, 2012 for U.S. Appl. No. 11/881,816, 3 pages, Doc 4455.
USPTO—Notice of Withdrawal from Issue dated Apr. 11, 2012 for U.S. Appl. No. 11/881,816, 1 page, Doc 4456.
USPTO—Notice of Allowance dated Jun. 4, 2012 for U.S. Appl. No. 11/881,816, 17 pages, Doc 4457.
Brindle—Issue Fee Payment dated Sep. 4, 2012 for U.S. Appl. No. 11/881,816, 1 page, Doc 4458.
USPTO—Issue Notification dated Oct. 10, 2012 for U.S. Appl. No. 11/881,816, 1 page, Doc 4459.
Brindle—Auto-Granted Petition to Remove from Issue dated Oct. 17, 2012 for U.S. Appl. No. 11/881,816, 7 pages, Doc 4460.
Brindle—Request for Continued Examination filed Oct. 17, 2012 for U.S. Appl. No. 11/881,816, 3 pages, Doc 4461.
USPTO—Office Action dated Mar. 1, 2013 for U.S. Appl. No. 11/881,816, 12 pages, Doc 4462.
Brindle—Amendment filed Jun. 3, 2013 for U.S. Appl. No. 11/881,816, 30 pages, Doc 4463.
USPTO—Final Rejection dated Oct. 23, 2013 for U.S. Appl. No. 11/881,816, 12 pages, Doc 4464.
Brindle—Amendment filed Feb. 4, 2014 in U.S. Appl. No. 11/881,816, 21 pages, Doc 4465.
USPTO—Advisory Action dated Feb. 19, 2014 for U.S. Appl. No. 11/881,816, 3 pages, Doc 4466.
Brindle—Notice of Appeal with Pre-Brief Conference Request filed Feb. 20, 2014 in U.S. Appl. No. 11/881,816, 13 pages, Doc 4467.
USPTO—Pre-Appeal Brief Conference Decision dated Apr. 21, 2014 for U.S. Appl. No. 11/881,816, 2 pages, Doc 4468.
USPTO—Notice of Abandonment dated Dec. 23, 2014 for U.S. Appl. No. 11/881,816, 2 pages, Doc 4469.
Dribinsky—U.S. Appl. No. 14/257,808, filed Apr. 21, 2014, 47 pages, Doc 4327.
USPTO—Filing Receipt and Notice to File Missing Parts dated May 8, 2014 for U.S. Appl. No. 14/257,808, 6 pages, Doc 4306.
Dribinsky—Power of Attorney and Response to Notice to File Missing Parts dated Jul. 7, 2014 for U.S. Appl. No. 14/257,808, 15 pages, Doc 4307.
USPTO—Updated Filing Receipt, Informational Notice, and Acceptance of Power of Attorney dated Oct. 9, 2014 for U.S. Appl. No. 14/257,808, 6 pages, Doc 4308.
USPTO—Notice of Publication dated Jan. 15, 2015 for U.S. Appl. No. 14/257,808, 1 page, Doc 4309.
Dribinsky—Substitute Statement in Lieu of Oath or Declaration dated Mar. 11, 2015 for U.S. Appl. No. 14/257,808, 6 pages, Doc 4310.
USPTO—Office Action dated Apr. 10, 2015 for U.S. Appl. No. 14/257,808, 10 pages, Doc 4311.
Dribinsky—Amendment dated Oct. 13, 2015 for U.S. Appl. No. 14/257,808, 27 pages, Doc 4312.
USPTO—Notice of Allowance dated Dec. 10, 2015 for U.S. Appl. No. 14/257,808, 181 pages, Doc 4313.
Dribinsky—Issue Fee Payment dated Jan. 12, 2016 for U.S. Appl. No. 14/257,808, 1 page, Doc 4314.
USPTO—Issue Notification dated Jun. 26, 2016 for U.S. Appl. No. 14/257,808, 15 pages, Doc 4315.
Dribinsky—U.S. Appl. No. 14/987,360, filed Jan. 4, 2016, 58 pages, Doc 4316.
USPTO—Filing Receipt and Notice to File Missing Parts dated Jan. 20, 2016 for U.S. Appl. No. 14/987,360, 7 pages, Doc 4317.
Dribinsky—Power of Attorney and Response to Notice to File Missing Parts dated Mar. 21, 2016 for U.S. Appl. No. 14/987,360, 16 pages, Doc 4318.
USPTO—Updated Filing Receipt, Information Notice and Acceptance of Power of Attorney dated Apr. 25, 2016 for U.S. Appl. No. 14/987,360, 7 pages, Doc 4319.
USPTO—Notice of Publication dated Aug. 4, 2016 for U.S. Appl. No. 14/987,360, 1 page, Doc 4320.
USPTO—Office Action dated Sep. 14, 2016 for U.S. Appl. No. 14/987,360, 18 pages, Doc 4321.
Dribinsky—Amendment dated Dec. 14, 2016 for U.S. Appl. No. 14/987,695, 35 pages, Doc 4322.
Dribinsky—Terminal Disclaimer dated Dec. 14, 2016 for U.S. Appl. No. 14,987,360, 2 pages, Doc 4323.
USPTO—Terminal Disclaimer Decision dated Jan. 7, 2017 for U.S. Appl. No. 14/987,360, 1 page, Doc 4324.
USPTO—Notice of Allowance dated Aug. 10, 2017 for U.S. Appl. No. 14/987,360, 54 pages, Doc 4325.
Dribinsky—Issue Fee Payment dated Oct. 31, 2017 for U.S. Appl. No. 14/987,360, 4 pages, Doc 4328.
USPTO—Issue Notification dated Jan. 17, 2018 for U.S. Appl. No. 14/987,360, 1 page, Doc 4329.
Dribinsky—U.S. Appl. No. 15/826,453, filed Nov. 29, 2017, 58 pages, Doc 4330.

(56) References Cited

OTHER PUBLICATIONS

USPTO—Filing Receipt and Notice to File Missing Parts dated Dec. 20, 2017 for U.S. Appl. No. 15/826,453, 7 pages, Doc 4331.
Dribinsky—Response to Pre-Exam Formalities Notice, Power of Attorney and 3.73 Statement dated Feb. 20, 2018 for U.S. Appl. No. 15/826,453, 14 pages, Doc 4332.
Dribinsky—Request for Change of Applicant dated Apr. 15, 2018 for U.S. Appl. No. 15/826,453, 8 pages, Doc 4333.
USPTO—Notice of Acceptance of Power of Attorney, Updated Filing Receipt and Informational Notice dated Apr. 17, 2018 for U.S. Appl. No. 15/826,453, 7 pages, Doc 4334.
USPTO—Notice of Publication dated Jul. 26, 2018 for U.S. Appl. No. 15/826,453, 1 page, Doc 4335.
USPTO—Office Action dated Feb. 14, 2019 for U.S. Appl. No. 15/826,453, 36 pages, Doc 4336.
Dribinsky—Response to Office Action dated May 9, 2019 for U.S. Appl. No. 15/826,453, 25 pages, Doc 4337.
USPTO—Final Office Action dated Jun. 6, 2019 for U.S. Appl. No. 15/826,453, 18 pages, Doc 4338.
Patel—Office Action dated Dec. 5, 2011 for U.S. Appl. No. 13/046,560, 18 pages, Doc 0797.
Englekirk—Amendment dated Mar. 5, 2012 for U.S. Appl. No. 13/046,560, 7 pages, Doc 0803.
Patel—Notice of Allowance dated May 24, 2012 for U.S. Appl. No. 13/046,560, 15 pages, Doc 0817.
Patel—Notice of Allowance dated Dec. 3, 2012 for U.S. Appl. No. 13/046,560, 198 pages, Doc 0829.
Patel—Notice of Allowance dated Mar. 15, 2013 for U.S. Appl. No. 13/046,560, 16 pages, Doc 0847.
Englekirk—Fee Transmittal and Comments on Allowance dated Jun. 17, 2013 for U.S. Appl. No. 13/046,560, 4 pages, Doc 0855.
Patel—Office Action dated Aug. 15, 2014 for U.S. Appl. No. 14/028,357, 12 pages, Doc 0923.
Patel—Final Office Action dated Apr. 7, 2015 for U.S. Appl. No. 14/028,3578, 160 pages, Doc 0957.
Englekirk—Response to Final Office Action dated Jun. 8, 2015 for U.S. Appl. No. 14/028,357, 10 pages, Doc 0964.
Patel—Notice of Allowance dated Jun. 25, 2015 for U.S. Appl. No. 14/028,357, 18 pages, Doc 0966.
Patel—Office Action dated Jun. 22, 2016 for U.S. Appl. No. 14/883,122, 12 pages, Doc 0966.
Patel—Notice of Allowance dated Nov. 2, 2016 for U.S. Appl. No. 14/883,122, 21 pages, Doc 1010.
Dang—Notice of Allowance dated Jan. 25, 3013 for U.S. Appl. No. 12/735,954, 57 pages, Doc 0839.
Dang—Office Action dated Feb. 26, 2014 for U.S. Appl. No. 12/735,954, 34 pages, Doc 0892.
EPO—Communications pursuant to Article 94(3) EPC from EPO dated Mar. 22, 2010 for Application No. EP05763216.8, 7 pages, Doc 0733.
EPO—Communication under Rule 71(3) EPC for Application No. EP05763216.8, dated Apr. 25, 2014, 47 pages, Doc 0902.
JPO—Notice of Reasons for Refusal for Application No. 2007-518298, dated Jul. 13, 2010, 9 pages, Doc 0747.
Peregrine—Amendment for Application No. JP2007518298, dated Oct. 15, 2010, 10 pages, Doc 0761.
JPO—Notice of Reasons for Refusal for Application No. JP2010232563, dated Mar. 23, 2011, 7 pages, Doc 0770.
WIPO—Corrected Publication for Application No. PCT/US02/32266 dated Apr. 17, 2003, 66 pages, Doc 2000.
WIPO—Correction of entry in Section I of the PCT Gazette for Application No. PCT/US02/32266 dated Apr. 17, 2003, 2 pages, Doc 2001.
WIPO—International Publication without Search Report for Application No. PCT/US02/32266 dated Apr. 17, 2003, 65 pages, Doc 2003.
WIPO—International Publication for Application No. PCT/US02/32266 dated Apr. 17, 2003, 3 pages, Doc 2002.

PCT—International Preliminary Examination Report for Application No. PCT/US02/032266 dated Sep. 27, 2004, 13 pages, Doc 2004.
PCT—International Search Report for Application No. PCT/US2005/022407, dated Nov. 15, 2005 2 pages, Doc 0633.
Peregrine—Communication Pursuant to Article 94(3) EPC from EPO dated Jun. 19, 2008 for Application No. EP02800982.7, 3 pages, Doc 0664.
Peregrine—EP Response dated Dec. 23, 2008 for Application No. EP02800982.7, 22 pages, Doc 0680.
EPO—Communication pursuant to Rule 94(3) EPC for Application No. EP02800982.7, dated Aug. 6, 2009, 2 pages, Doc 0703.
Peregrine—EP Response filed Oct. 7, 2009 for Application No. EP02800982.7, 23 pages, Doc 0715.
EPO—Communication under Rule 71(3) EPC and Annex Form 2004 for Application No. EP02800982.7, dated Nov. 27, 2009, 68 pages, Doc 0717.
EPO—Communication of a Notice of Opposition for Application No. EP02800982.7, dated Nov. 8, 2011, 33 pages, Doc 0793.
Huber—Response to Notice of Opposition for Application No. EP1451890, dated Apr. 17, 2012, 46 pages, Doc 0809.
Huber—Response for Application No. EP10011669.8, dated May 15, 2012, 19 pages, Doc 0816.
EPO—Summons to Attend Oral Proceedings pursuant to Rule 115(1) EPC, dated Oct. 17, 2013 for Application No. EP02800982.7, 20 pages, Doc 0873.
Huber—Response to Summons to attend Oral Proceedings dated Oct. 17, 2013 for Application No. EP02800982.7, dated Jan. 9, 2014 21 pages, Doc 0882.
Nguyen—Notice of Allowance for Application No. 13/277,108, dated Jan. 10, 2014, 47 pages, Doc 0883.
Epo—Brief Communication regarding Oral Proceedings for Application No. EP02800982.7, dated Jan. 16, 2014, 1 pages, Doc 0884.
Huber—Report on Decision in EPO Opposition Division for Application No. EP02800982.7, dated Feb. 25, 2014, 13 pages, Doc 0891.
EPO—Communication Pursuant to Article 101(1) and 81(2) to (3) EPC for Application No. EP02800982.7, dated Mar. 3, 2014, 7 pages, Doc 0893.
EPO—Provision of a copy of the minutes in accordance with Rule 124(4) EPC for Application No. EP02800982.7, dated Apr. 10, 2014, 11 pages, Doc 0900.
EPO—Brief Communication for Application No. EP02800982.7, dated May 8, 2014, 2 pages, Doc 0905.
Huber—Reply to Official Communication for Application No. EP02800982.7, dated May 8, 2014, 84 pages, Doc 0906.
EPO—Brief Communication dated Aug. 14, 2014 for Application No. EP02800982.7, dated Aug. 14, 2014, 2 pages, Doc 0920.
EPO—Brief Communication from EPO for Application No. EP02800982.7, dated Oct. 24, 2014, 2 pages, Doc 0934.
EPO—Interlocutory Decision in Opposition Proceedings for Application No. EP02800982.7, dated Nov. 14, 2014, 79 pages, Doc 0935.
EPO—Request for Grant of a Divisional Patent, Application No. EP10011669.8, dated Sep. 29, 2010, 73 pages, Doc 2081.
EPO—Noting of Loss of Rights Rule 112(1) EPC for Application No. EP10011669.8, dated Dec. 15, 2010, 4 pages, Doc 2082.
Huber—Response to Noting of Loss of Rights Rule 112(1) EPC for Application No. EP10011669.8, dated Dec. 21, 2010, 5 pages, Doc 2083.
EPO—Communication Under Rule 112(2) EPC for Application No. EP10011669.8, dated Feb. 15, 2011, 1 page, Doc 2084.
EPO—Communication Pursuant to Rule 58 EPC Invitation to Remedy Deficiencies in the Application Documents for Application No. EP10011996.8, dated Mar. 1, 2011, 3 pages, Doc 2085.
Huber—Response to Invitation to Remedy Deficiencies Pursuant to Rule 58 EPC dated Mar. 1, 2011 for Application No. EP10011669.8, dated Mar. 25, 2011, 14 pages, Doc 2086.
Huber—Response to the Communication Pursuant to Rule 19(1)EPC dated Mar. 23, 2011 for Application No. EP10011669.8, dated Apr. 15, 2011 1 page, Doc 2087.
EPO—Extended European Search Report for Application No. EP10011669.8, dated Sep. 30, 2011, 8 pages, Doc 2088.

(56) References Cited

OTHER PUBLICATIONS

EPO—Notification of European Publication Number and Information on the Application of Article 67(3) EPC for Application No. EP10011669.8, dated Oct. 19, 2011, 2 pages, Doc 2089.
EPO—Communication Pursuant to Rule 69 EPC Reminder Concerning Payment of the Designation Fee and the Examination Fee for Application No. EP10011669.8, dated Nov. 21, 2011, 2 pages, Doc 2090.
Huber—Response to Communication dated Nov. 21, 2011 for Application No. EP10011669.8, dated May 15, 2012, 19 pages, Doc 2091.
EPO—Payment of Fees and Costs for Application No. EP10011669.8, dated Oct. 31, 2012, 1 page, Doc 2092.
EPO—Communication Pursuant to Article 94(3) EPC for Application No. EP10011669.8, dated Apr. 9, 2014, 5 pages, Doc 2093.
Huber—Response to Communication Pursuant to Article 94(3) EPC dated Apr. 9, 2014 for Application No. EP10011669.8, dated Aug. 6, 2014, 1 page, Doc 2094.
EPO—Extension of Time Limit Pursuant to Rule 132(2) EPC for Application No. EP10011669.8, dated Aug. 12, 2014, 1 page, Doc 2095.
Huber—Response to Office Action dated Apr. 9, 2014 for Application No. EP10011669.8, dated Oct. 14, 2014, 30 pages, Doc 0971.
Huber—Response to Office Action dated Apr. 9, 2014 for Application No. EP10011669.8, dated Oct. 14, 2014, 30 pages, Doc 2096.
Huber—Acknowledgement of Receipt of Response to Office Action dated Apr. 9, 2014 for Application No. EP10011669.8, dated Oct. 14, 2014, 30 pages, Doc 2097.
EPO—CDS Clean Up—Amended Data Concerning the Representative for the Applicant for Application No. EP10011669.8, dated Dec. 23, 2014, 1 page, Doc 2098.
Huber—Enquiry as to when a Communication from the Examining Division can be Expected for Application No. EP10011669.8, dated Oct. 12, 2015, 1 page, Doc 2099.
EPO—Response to Enquiry for Communication from the Examining Division for Application No. EP10011669.8, dated Oct. 16, 2015, 1 page, Doc 2100.
EPO—Communication Under Rule 71(3) EPC for Application No. EP10011669.8, dated Dec. 1, 2015, 78 pages, Doc 2101.
Huber—Response to Communication Dated Dec. 1, 2015 for Application No. EP10011669.8, dated Mar. 16, 2016, 1 pages, Doc 2102.
EPO—Decision to Grant a European Patent Pursuant to Article 97(1) EPC for Application No. EP10011669.8 dated Apr. 7, 2016, 2 pages, Doc 2103.
EPO—Transmission of the Certificate for a European Patent Pursuant to Rule 74 EPC for Application No. EP10011669.8, dated May 4, 2016, 1 page, Doc 2104.
EPO—Communication Regarding the Expiry of the Time Limit Within Which Notice of Opposition May be Filed for Application No. EP10011669.8, dated Mar. 10, 2017, 1 page, Doc 2105.
EPO—Request for Grant of European Divisional Patent for Application No. EP16020116.6, dated Apr. 6, 2016, 62 pages, Doc 2106.
EPO—Payment of Fees and Costs for Application No. EP16020116.6, dated May 3, 2016, 2 page, Doc 2107.
EPO—Communication Pursuant to Rule 58 EPC Invitation to Remedy Deficiencies in the Application Documents for Application No. EP16020116.6 dated May 19, 2016, 4 pages, Doc 2108.
Huber—Response to Official Communication dated May 19, 2016 for Application No. EP16020116.6, dated May 31, 2016, 14 pages, Doc 2109.
Huber—Response to Invitation to Remedy Deficiencies to (R. 58 EPC) dated May 19, 2014 for Application No. EP16020116.6, dated Jul. 28, 2016, 6 pages, Doc 2110.
EPO—Payment of Fees and Costs for Application No. EP16020116.6, dated Aug. 3, 2016, 2 page, Doc 2111.
EPO—Notice of Debiting of Fees for Application No. EP16020116.6, dated Aug. 17, 2016, 1 page, Doc 2112.
Huber—Addition to Letter dated Jul. 28, 2016 for Application No. EP16020116.6, dated Sep. 6, 2016, 2 pages, Doc 2113.
EPO—Payment of Fees and Costs for Application No. EP16020116.6, dated Oct. 24, 2016, 2 pages, Doc 2114.
EPO—Notice of Debiting of Fees for Application No. EP16020116.6, dated Nov. 4, 2016, 1 page, Doc 2115.
EPO—Extended European Search Report for Application No. EP16020116.6, dated Dec. 6, 2016, 9 pages, Doc 2116.
EPO—Notification of European Publication No. And Information on the Application of Article 67(3) EPC for Application No. EP16020116.6, dated Dec. 7, 2016, 2 pages, Doc 2117.
EPO—Refund of fees for Application No. EP16020116.6, dated Dec. 14, 2016, 1 page, Doc 2118.
EPO—Communication Pursuant to Rule 69 EPC Reminder Concerning Payment of the Designation Fee and the Examination Fee for Application No. EP16020116.6, dated Jan. 10, 20171, 2 pages, Doc 2119.
EPO—Noting of Loss of Rights Pursuant to Rule 112(1) EPC for Application No. EP16020116.5, dated Aug. 11, 2017, 2 pages, Doc 2120.
EPO—Final Instructions (application deemed to be withdrawn/application refused) for Application No. EP16020116.6, dated Nov. 21, 2017, 1 page, Doc 2121.
Huber—Additions to Response dated Jul. 28, 2016 for Application No. EP16020116.6, dated Sep. 6, 2016, 2 pages, Doc 1001.
EPO—Extended Search Report for Application No. EP16020116.6, dated Dec. 6, 2016, 9 pages, Doc 1012.
TMI Associates—Letter Regarding Office Action Response for Application No. JP2003-535287, dated Nov. 30, 2005, 1 page, Doc 2342.
JPO—Notice of Reasons for Refusal for Application No. JP2003535287, dated Feb. 9, 2006, 5 pages, Doc 0638.
TMI Associates—Letter Regarding Office Action for Application No. JP2003-535287, dated Mar. 1, 2006, 5 pages, Doc 2343.
Kuhn—Expert Testimony of Kuhn for Application No. JP2003-535287, dated Aug. 3, 2006, 12 pages, Doc 2337.
Kuhn—Response to JP Final Rejection for Application No. JP2003-535287, dated Aug. 3, 2006, 32 pages, Doc 2339.
J&A—Letter Regarding Replying to Final Rejection issued by JP Examiner dated Feb. 13, 2006 for Application No. JP2003-535287, dated Aug. 7, 2006, 4 pages, Doc 2338.
Peregrine—JP Response to Notice of Refusal for Application No. JP2003535287, dated Aug. 14, 2006, 10 pages, Doc 0647.
JPO—Notice of Reasons for Refusal for Application No. JP2003535287, dated Oct. 5, 2006, 7 pages, Doc 0650.
TMI Associates—Confirmation of Letter Regarding Response to Office Action for Application No. JP2003-535287, dated Oct. 5, 2006, 3 pages, Doc 2341.
J&A—Letter Regarding Invoice for Application No. JP2003-535287, dated Jan. 25, 2006, 2 pages, Doc 2334.
Burgener—Email Regarding No Longer Pursuing Application for Application No. JP2003-535287, dated Jan. 5, 2007, 1 page, Doc 2335.
TMI Associates—Letter Regarding Extension of Time for Response to Office Action for Application No. JP2003-535287, dated Feb. 23, 2007, 1 page, Doc 2344.
Burgener—Email Regarding Abandoning Application for Application No. JP2003-535287, dated Jan. 5, 2007, 1 page, Doc 2336.
TMI Associates—Letter Regarding Closing Matter for Application No. JP2003-535287, dated Apr. 4, 2007, 2 pages, Doc 2340.
J&A—Letter Responding to Office Action with Replacement Claims for Application JP2003-535287, dated Nov. 10, 2015, 16 pages, Doc 2332.
PCT—International Search Report from USRO dated Mar. 28, 2003 for Application No. PCT/US02/32266, 2 pages, Doc 0586.
Peregrine—Communication and supplementary European Search Report dated Nov. 27, 2009 for Application No. EP05763216.8, 7 pages, Doc 0718.
L&P—Response to Communication Pursuant to Article 94(3) dated Jan. 21, 2013 for Application No. EP05763216.8, 17 pages, Doc 0863.
EPO—Decision to Grant EP Patent pursuant to Article 97(1) EPC for Application No. EP05763216.8, dated Sep. 4, 2014, 2 pages, Doc 0927.

(56) References Cited

OTHER PUBLICATIONS

L&P—Response to Invitation Pursuant to Rule 58 EPC dated Oct. 9, 2014 for Application No. EP14182150.4, dated Dec. 4, 2014, 6 pages, Doc 0939.
EPO—Invitation Pursuant to Rule 63(1) EPC for Application No. EP14182150.4, dated Mar. 3, 2015, 3 pages, Doc 0953.
L&P—Response to Invitation Pursuant to Rule 63(1) for Application No. EP14182150.4, dated Apr. 29, 2015, 12 pages, Doc 0962.
EPO—Extended Search Report for Application No. EP14182150.4, dated Jun. 11, 2015, 9 pages, Doc 0965.
EPO—Communication pursuant to Article 94(3) EPC for Application No. EP14182150.4, dated Jul. 2, 2018, 4 pages, Doc 1056.
EPO—Communication under Rule 71(3) EPC for Application No. EP14182150.4, dated Nov. 2, 2018, 82 pages, Doc 1068.
PCT—Chapter II Demand filed Aug. 17, 2012 for Application No. PCT/US2011/056942, 41 pages, Doc 0824.
EPO—Information on Entry into European Phase for Application No. EP06814836.0, dated Feb. 1, 2008, 3 pages, Doc 2138.
EPO—Request for Entry into the European Phase for Application for EP06814836.0, dated Mar. 13, 2008, 5 pages, Doc 2139.
EPO—Amendments Received Before Examination for Application No. EP06814836.0, dated Mar. 31, 2008, 15 pages, Doc 2140.
EPO—Communication Pursuant to Rules 161 and 162 EPC for Application No. EP06814836.0, dated Apr. 22, 2008, 2 pages, Doc 2141.
EPO—Communication of European Publication Number And Information on Application of Article 67(3) EPC for Application No. EP06814836.0, dated May 2, 2008, 1 page, Doc 2142.
PCT—Notification of Transmittal of the International Search Report and the Written Opinion of the International Searching Authority, or the Declaration for Application No. PCT/US06/036240, dated Jul. 3, 2008, 10 pages, Doc 2145.
EPO—Enquiry with the International Bureau for Application No. EP06814836.0, dated Aug. 18, 2008, 1 page, Doc 2143.
EPO—Reply by International Bureau for Application No. EP06814836.0, dated Sep. 3, 2008, 1 page, Doc 2144.
EPO—Letter Accompanying Subsequently Filed Items for Application No. EP06814836.0, dated Sep. 4, 2008, 1 page, Doc 2146.
PCT—International Preliminary Report on Patentabliity for Application No. PCT/US06/036240, filed Sep. 15, 2006, 6 pages, Doc 2147.
WIPO—Partial Publication with International Search Report for Application No. PCT/US06/036240, dated Mar. 29, 2007, 3 pages, Doc 2148.
EPO—Extended European Search Report for Application No. EP06814836.0, dated Feb. 17, 2010, 7 pages, Doc 2149.
EPO—Proceeding Further with European Patent Application Pursuant to Rule 70(2) EPC for Application No. EP06814836.0, dated Mar. 8, 2010, 1 page, Doc 2150.
EPO—Letter Accompanying Subsequently Filed Items for Application No. EP06814836.0, dated Mar. 26, 2010, 3 page, Doc 2151.
EPO—Communication Pursuant to Article 94(3) EPC for Application No. EP06814836.0, dated Apr. 14, 2010, 1 page, Doc 2152.
SIB—Request for Extension of Time Limit Under Rule 132(2) EPC for Application No. EP06814836.0, dated Aug. 4, 2010, 1 page, Doc 2153.
EPO—Extension of Time Under Rule 132(2) EPC for Application No. EP06814836.0, dated Aug. 9, 2010, 1 page, Doc 2154.
Peregrine—EP Response filed for Application No. EP06814836.0 dated Oct. 12, 2010, 25 pages, Doc 0756.
SIB—Response to Communication dated Feb. 17, 2010 for Application No. EP06814836.0, dated Oct. 12, 2010, 25 pages, Doc 2155.
SIB—Enquiry as to When a Communication from the Examining Division Can be Expected for Application No. EP06814836.0, dated Apr. 11, 2013, 1 page, Doc 2156.
EPO—Notice Regarding Examination Started for Application No. EP06814836.0, dated Dec. 12, 2013, 1 page, Doc 2157.
EPO—Communication Pursuant to Article 94(3) EPC for Application No. EP06814836.0, dated Aug. 18, 2013, 5 pages, Doc 2158.
EPO—Noting of Loss of Rights Pursuant to Rule 112(1) EPC for Application No. EP06814836.0, dated May 27, 2014, 1 page, Doc 2159.
EPO—Closure of the Procedure in Respect of Application for Application No. EP06814836.0, dated Aug. 26, 2014, 1 page, Doc 2160.
Peregrine—Request Form for Application No. PCT/US06/036240, dated Sep. 15, 2006, 5 pages, Doc 2133.
WIPO—Initial Publication without International Search Report for Application No. PCT/US06/036240, dated Mar. 29, 2007, 107 pages, Doc 2134.
Tat—International Search Report and Written Opinion from USRO dated Jul. 3, 2008 for Application No. PCT/US06/36240, 10 pages, Doc 0666.
PCT—Written Opinion of the International Searching Authority for Application No. PCT/US06/036240, dated Jul. 3, 2008, 5 pages, Doc 2136.
PCT—International Preliminary Report on Patentability for Application No. PCT/US06/036240, filed Sep. 15, 2006, 6 pages, Doc 2137.
WIPO—Partial Publication with International Search Report for Application No. PCT/US06/036240, dated Mar. 29, 2007, 3 pages, Doc 2135.
GPO—Office Action for Application No. DE112011103554.3, dated May 18, 2017, 15 pages, Doc 2348.
Huber—Response to Office Action for Application No. DE112011103554.3, dated Nov. 28, 2017, 26 pages, Doc 2349.
Huber—Pending Claims for Application No. PCT/US2011/056942, dated Jan. 22, 2013, 10 pages, Doc 2350.
Steinfl & Bruno—Letter Regarding Filing Receipt for Application No. JP2013-535054, dated Aug. 19, 2013, 1 page, Doc 2351.
Steinfl & Bruno—Letter Regarding Examination Requested for Application No. JP2013-535054, dated Oct. 14, 2014, 1 page, Doc 2357.
Translation of JP Office Action for Application No. JP2013-535054, dated Dec. 1, 2015, 3 pages, Doc 2358.
Comment Regarding Response to Office Action for Application No. JP2013-535054, dated Jan. 19, 2016, 3 pages, Doc 2362.
Steinfl & Bruno—Letter Regarding Office Action for Application No. JP2013-535054, dated Jan. 21, 2016, 1 page, Doc 2363.
Peregrine—Request for Extension of Time for Application No. JP2013-535054, dated Feb. 29, 2016, Doc 2335.
Peregrine—Amendment for Application No. JP2013-535054, dated Mar. 31, 2016, 31 pages, Doc 0994.
Peregrine—Amendment for Application No. JP2013-535054, dated Mar. 31, 2016, 13 pages, Doc 2353.
Peregrine—Opinion for Application No. JP2013-535054, dated Mar. 31, 2016, 10 pages, Doc 2354.
Steinfl & Bruno Letter Reporting Response to Office Action for Application No. JP2013-535054, dated Apr. 15, 2016, 1 page, Doc 2364.
Peregrine—Decision to Grant a Patent for Application No. JP2013-535054, dated Aug. 2, 2016, 6 pages, Doc 2359.
Steinfl & Bruno—Letter Reporting Notice of Allowance for Application No. JP2013-535054, dated Aug. 15, 2016, 2 pages, Doc 2360.
Allowed Claims for Application No. JP2013-535054, dated Aug. 15, 2016, 10 pages, Doc 2361.
Peregrine—Letter of Payment of Patent Fee for Application No. JP2013-535054, dated Sep. 9, 2016, 2 pages, Doc 2366.
Steinfl & Bruno—Letter Regarding Issue Fee and Maintenance Fees Paid for Application No. JP2013-535054, dated Sep. 13, 2016, 1 page, Doc 2365.
Steinfl & Bruno—Letter Reporting Letters Patent for Application No. JP2013-535054, dated Oct. 24, 2016, 4 pages, Doc 2367.
JPO—Notice of Reasons for Refusal for Application JP2016-175339, dated Jun. 19, 2017, 7 pages, Doc 1029.
Request for Divisional Application for Application No. JP2016175339, dated Sep. 8, 2016, 163 pages, Doc 2369.
File History for Application No. JP20160175339, dated Sep. 8, 2016, 264 pages, Doc 2376.
Steinfl & Bruno—Letter Reporting Divisional Application as Filed for Application No. JP2016-175339, dated Sep. 13, 2016, 2 pages, Doc 2378.

(56) References Cited

OTHER PUBLICATIONS

Request for Examination for Application No. JP2016175339, dated Oct. 6, 2016, 11 pages, Doc 2370.
Request for Examination for Application No. JP2016175339, dated Oct. 6, 2016, 2 pages, Doc 2391.
Steinfl & Bruno—Letter Reporting Exam Requested for Application No. JP2016-175339, dated Oct. 10, 2016, 1 page, Doc 2379.
Correction of Defective Abstract for Application No. JP2016175339, dated Nov. 28, 2016, 2 pages, Doc 2392.
Notice of Reasons for Rejection for Application No. JP2016175339, dated Jun. 27, 2017, 14 pages, Doc 2377.
Steinfl & Bruno—Debit Report JP Office Action for Application No. JP2016-175339, dated Jul. 26, 2017, 1 page, Doc 2375.
Notice of Reason for Rejection for Application No. JP2016175339, dated Feb. 27, 2018, 8 pages, Doc 2384.
Translation of JP Office Action for Application No. JP2016-175339, dated Feb. 27, 2018, 4 pages, Doc 2385.
Comment Regarding Response to Office Action for Application No. JP2016-175339, dated Mar. 26, 2018, 10 pages, Doc 2386.
Decision to Refuse for Application No. JP2016175339, dated Oct. 30, 2018, 20 pages, Doc 2390.
WIPO—Publication with International Search Report for Application No. PCT/US06/026965, dated Jan. 18, 2017, 112 pages, Doc 2127.
PCT—International Search Report for Application No. PCT/US2011/056942, dated Feb. 27, 2012, 12 pages, Doc 0801.
Brindle—Application as Filed for Application No. PCT/US11/0569942, filed Oct. 19, 2011, 112 pages, Doc 2128.
WIPO—Publication with International Search Report for Application No. PCT/US11/056942, dated Apr. 26, 2012, 116 pages, Doc 2130.
PCT—First Notice Informing the Applicant of the Communication of the International Application for Application No. PCT/US11/056942, dated May 24, 2012, 1 page, Doc 2129.
Huber—Technical Comments to Written Opinion of the IPEA dated Dec. 21, 2012 for Application No. PCT/US2011/056942, dated Jan. 21, 2013, 27 pages, Doc 0833.
PCT—International Preliminary Report on Patentability from EPO dated Feb. 6, 2013 for Application No. PCT/US2011/056942, 27 pages, Doc 0841.
PCT—Written Opinion of the International Searching Authority for Application No. PCT/US11/056942, filed Oct. 19, 2011, 8 pages, Doc 2131.
PCT—International Preliminary Report on Patentability for Application No. PCT/US11/056942, filed Oct. 19, 2011, 27 pages, Doc 2132.
CN Office Action dated Jul. 31, 2009 for Application No. CN200680025128.7, 10 pages.
Translation of CN Response dated Nov. 30, 2009 for Application No. CN200680025128.7, 13 pages, Doc 0722.
Translation of Office Action dated Nov. 2, 2011 for Application No. CN200680025128.7, 16 pages, Doc 0792.
Translation of CN Response dated Mar. 1, 2012 for Application No. CN200680025128.7, 14 page, Doc 0802.
L&P—Letter to Client Regarding Proposed Amendments for Application No. CN200680025128.7, dated Jun. 12, 2012, 2 pages, Doc 2394.
L&P—Proposed Claims for Application No. CN200680025128.7, dated Jun. 12, 2012, 10 pages, Doc 2395.
L&P—Letter Regarding Claim Amendments for Application No. CN200680025128.7, dated Jun. 20, 2012, 12 pages, Doc 2397.
L&P—Letter to Client Regarding Response to Office Action filed for Application No. CN200680025128.7, dated Jun. 29, 2012, 1 page, Doc 2396.
Brindle—Particulars of Letters Patent for Application No. CN200680025128.7 dated Dec. 16, 2013.pages, Doc 2393.
JPO—Notice for Reasons for Refusal for Application No. JP2013-003388, dated Feb. 27, 2014, 9 pages, Doc 0896.
Peregrine—Amendment for Application No. JP2013-003388, dated Jul. 9, 2014, 17 pages, Doc 0912.

EPO—Request for entry into the European Phase and Claims for Application No. EP02800982.7 dated Apr. 28, 2004, 15 pages, Doc 2009.
EPO—Communication to designated inventor for Application No. EP02800982.7 dated May 19, 2004, 2 pages, Doc 2010.
EPO—Communication Pursuant to Rules 109 and 110 EPC for Application No. EP02800982.7 dated May 27, 2004, 2 pages, Doc 2011.
EPO—Communication regarding International Preliminary Examination Report for Application No. EP02800982.7 dated Jul. 15, 2004, 1 page, Doc 2012.
EPO—Reply to Communication regarding International Preliminary Examination Report for Application No. EP02800982.7 dated Jul. 15, 2004, 1 page, Doc 2013.
EPO—Supplementary European Search Report for Application No. EP02800982.7 dated Oct. 1, 2004, 3 pages, Doc 2014.
EPO—Proceeding Further with the European Patent Application Pursuant to Article 96(1) and Rule 51(1) EPC for Application No. EP02800982.7 dated Oct. 5, 2004, 1 page, Doc 2015.
PCT—International Preliminary Search Report and Claims for Application No. PCT/US02/32266 dated Sep. 27, 2004, 16 pages, Doc 2016.
Huber—Amendments received before examination for Application No. EP02800982.7 dated Dec. 6, 2004, 19 pages, Doc 2018.
EPO—Notice Regarding Fees for Application No. EP02800982.7 dated Dec. 9, 2005, 1 page, Doc 2019.
Brindle—Application as Filed for Application No. EP06786943.8, filed Sep. 11, 2006, 107 pages, Doc 2161.
PCT—Notification Relating to Priority Claim for Application No. PCT/US06/026965, dated Oct. 19, 2006, 2 pages, Doc 2162.
PCT—Notification Relating to Priority Claim for Application No. PCT/US06/026965, dated Nov. 1, 2006, 1 pages, Doc 2163.
PCT—International Search Report and Written Opinion from EPO dated Nov. 7, 2006 for Application No. PCT/US2006/026965, 19 pages, Doc 0652.
EPO—Notice Regarding Fees for Application No. EP02800982.7 dated Nov. 27, 2006, 1 page, Doc 2020.
WIPO—Publication with International Search Report for Application No. PCT/US06/026965, dated Jan, 18, 2007, 112 pages, Doc 2164.
PCT—Invitation to Correct Defects in Demand for Application No. PCT/US06/026965, dated Feb. 20, 2007, 11 pages, Doc 2166.
PCT—Notification Concerning Documents Transmitted for Application No. PCT/US06/026965, dated Mar. 8, 2007, 1 page, Doc 2167.
PCT—Invitation to Submit Amendments for Application No. PCT/US06/026965, dated May 25, 2007 1 page, Doc 2168.
EPO—Noting of Loss of Rights (R.69(1) EPC) for Application No. EP02800982.7 dated Jun. 4, 2007, 1 page, Doc 2021.
PCT—International Preliminary Report on Patentability for Application No. PCT/US06/026965, dated Jun. 21, 2007, 24 pages, Doc 2169.
EPO—Communication Pursuant to Rule 69(2) EPC for Application No. EP02800982.7 dated Aug. 9, 2007, 1 page, Doc 2023.
EPO—Refund of fees for Application No. EP02800982.7 dated Aug. 16, 2007, 1 page, Doc 2024.
EPO—Information on Entry into European Phase for Application No. EP06786943.8, dated Nov. 23, 2007, 3 pages, Doc 2170.
EPO—Notice Drawing Attention to Article 86(2) EPC, Art 2 No. 5 of the Rules Relating to Fees—Payment of the Renewal Fee Plus Additional Fee for Application EP02800982.7 dated Dec. 5, 2007, 1 page, Doc 2025.
EPO—Request for Entry into the European Phase for Application for EP06786943.8, dated Jan. 8, 2008, 7 pages, Doc 2171.
EPO—Communication Pursuant to Rule 161 and 162 EPC for Application No. EP06786943.8, dated Feb. 21, 2008, 2 pages, Doc 2172.
EPO—Notice Concerning Payment of Fees for Application No. EP06786943.8, dated Mar. 31, 2008, 1 page, Doc 2173.
L&P—Reply to Communication Pursuant to Rules 161 and 162 EPC dated Feb. 21, 2008 for Application No. EP06786943.8, dated Apr. 1, 2008, 32 pages, Doc 2174.

(56) References Cited

OTHER PUBLICATIONS

EPO—Confirmation of Receipt of Reply to Communication Pursuant to Rules 161 and 162 EPC dated Feb. 21, 2008 for Application No. EP06786943.8, dated Apr. 7, 2008, 32 pages, Doc 2175.
EPO—Communication Pursuant to Article 94(3) EPC for Application No. EP02800982.7 dated Jun. 19, 2008, 3 pages, Doc 2026.
Huber—Response to Communication Pursuant to Article 94(3) EPC for Application No. EP02800982.7 dated Oct. 16, 2008, 1 page, Doc 2027.
EPO—Extension of Time Limit Pursuant to Rule 132(2) EPC for Application No. EP02800982.7 dated Oct. 27, 2008, 1 page, Doc 2028.
Huber—Reply to communication from the Examining Division for Application No. EP02800982.7 dated Dec. 23, 2008, 22 pages, Doc 2029.
EPO—Communication Pursuant to Article 94(3) EPC for Application No. EP06786943.8, dated Feb. 4, 2009, 7 pages, Doc 2176.
L&P—Request for Extension of Time Limit to Respond to Office Action for Application No. EP06786943.8, dated Jun. 2, 2009, 1 page, Doc 2177.
EPO—Extension of Time Under Rule 132(2) EPC for Application No. EP06786943.8, dated Jun. 16, 2009, 1 page, Doc 2178.
Huber—Enquiry as to when a communication from the Examining Division can be expected for Application No. EP02800982.7 dated Jul. 7, 2009, 1 page, Doc 2030.
EPO—Response to enquiry for communication from the Examining Division for Application No. EP02800982.7 dated Jul. 14, 2009, 1 page, Doc 2031.
EPO—Communication Pursuant to Article 94(3) EPC for Application No. EP02800982.7, dated Aug. 6, 2009, 2 pages, Doc 2032.
L&P—Reply to Communication Pursuant to Article 94(3) EPC for Application No. EP06786943.8, dated Feb. 4, 2009, dated Aug. 13, 2009, 31 pages, Doc 2179.
EPO—Confirmation of Receipt for Reply to Communication Pursuant to Rule 94(3) EPC for Application No. EP06786943.8, dated Aug. 18, 2009, 31 pages, Doc 2180.
Huber—Reply to Communication Pursuant to Article 94(3) EPC for Application EP02800982.7 dated Oct. 7, 2009 23 pages, Doc 2033.
Huber—Confirmation of Reply to Communication Pursuant to Article 94(3) EPC for Application No. EP02800982.7 dated Oct. 9, 2009 23 pages, Doc 2034.
EPO—Communication Pursuant to Rule 71(3)EPC for Application No. EP02800982.7 dated Nov. 27, 2009, 67 pages, Doc 2035.
Huber—Response to Communication Pursuant to Article 71(3) EPC for Application No. EP02800982.7 dated Mar. 31, 2010, 29 pages, Doc 2036.
EPO—After Communication Under Rule 71(3) EPC but Before Decision to Grant for Application No. EP02800982.7 dated Apr. 20, 2010, 3 pages, Doc 2037.
L&P—Enquiry as to When a Communication from the Examining Division can be Expected for Application No. EP06786943.8, dated Nov. 2, 2010, 1 page, Doc 2181.
EPO—Response to Enquiry for Communication from the Examining Division for Application No. EP06786943.8, dated Nov. 17, 2010, 1 page, Doc 2182.
EPO—Documents for grant of a patent for Application No. EP02800982.7 dated Nov. 29, 2010, 3 pages, Doc 2038.
EPO—Amendment or Correction to Text Intended for Grant for Application No. EP02800982.7 dated Dec. 3, 2010, 1 page, Doc 2039.
EPO—Decision to Grant a European Patent Pursuant to Article 97(1) EPC for Application No. EP02800982.7 dated Jan. 7, 2011, 2 pages, Doc 2040.
L&P—Letter Concerning Fees and Payments for Application No. EP06786943.8, dated Jun. 27, 2011, 9 pages, Doc 2183.
L&P—Enquiry as to When a Communication from the Examining Division can be Expected for Application No. EP06786943.8, dated Jul. 11, 2011, 2 pages, Doc 2184.
Peregrine—Summons to Attend Oral Proceedings Pursuant to Rule 115(1) from EPO dated Jul. 22, 2011 for Application No. EP06786943.8, 9 pages, Doc 0784.
EPO—Summons to Attend Oral Proceedings Pursuant to Rule 115(1) EPC for Application No. EP06786943.8, dated Jul. 22, 2011, 9 pages, Doc 2185.
Deutsche Post—Advice of delivery for Application No. EP06786943.8, dated Jul. 27, 2011, 2 pages, Doc 2186.
Peregrine—EP Response filed Oct. 24, 2011 for Application No. EP06786943.8, 1 page, Doc 0791.
L&P—Reply to Summons to Attend Oral Proceedings dated Jul. 22, 2011 for Application No. EP06786943.8, dated Oct. 24, 2011, 1 page, Doc 2187.
EPO—Notice Regarding Maintenance/Change/Cancelation of Oral Proceedings for Application No. EP06786943.8, dated Oct. 25, 2011, 2 pages, Doc 2188.
Shweiger—Notice of Opposition for Patent No. EP1451890, dated Oct. 31, 2011, 164 pages, Doc 2041.
EPO—Notice Regarding Oral Proceedings for Application No. EP06786943.8, dated Nov. 4, 2011, 1 page, Doc 2189.
EPO—Communication of a Notice of Opposition for Application No. EP02800982.7 dated Nov. 8, 2011, 1 page, Doc 2042.
EPO—Brief Communication for Application No. EP02800982.7 dated Nov. 10, 2011, 1 page, Doc 2043.
EPO—Decision to Refuse European Patent Application (Art. 97(2) EPC) dated Nov. 18, 2011 for Application No. EP06786943.8, dated Nov. 18, 2011, 5 pages, Doc 2190.
Deutsche Post—Advice of delivery for Application No. EP06786943.8, dated Nov. 18, 2011, 2 pages, Doc 2191.
EPO—Communication of Opposition (R.79(1) EPC) for Application EP02800982.7, dated Dec. 7, 2011, 2 pages, Doc 2044.
L&P—Notice of Appeal for Application No. EP06786943.8, dated Jan. 17, 2012, 2 pages, Doc 1086.
L&P—Notice of Appeal for Application No. EP06786943.8, dated Jan. 17, 2012, 2 pages, Doc 2192.
L&P—Appeal to the Decision of Refusal dated Nov. 18, 2011 for Application No. EP06786943.8, dated Mar. 20, 2012, 27 pages, Doc 2193.
Huber—Substantive Response to Opposition for Application EP02800982.7, dated Apr. 17, 2012, 46 pages, Doc 2045.
EPO—Communication Regarding Opposition Proceedings for Application No. EP02800982.7, dated Apr. 23, 2012, 1 page, Doc 2046.
EPO—Communication of Amended Entries Concerning the Representative (R. 143(1)(h) EPC) for Application No. EP06786943.8, dated May 10, 2012, 1 page, Doc 2194.
EPO—Notice Drawing Attention to Rule 51(2) EPC, Article 2 No. 5 of the Rules Relating to Fees-Payment of Renewal Fee Plus Additional Fee for Application No. EP06786943.8, dated Sep. 4, 2012, 2 pages, Doc 2195.
EPO—Communication Indicating Deficiencies in the Notice of Opposition Which May be Remedied for Application No. EP02800982.7, dated Apr. 10, 2013, 3 pages, Doc 2047.
Schweiger—Reply to the Communication Indicating Deficiencies in the Notice of Opposition Which May be Remedied for Application No. EP02800982.7, dated Jun. 11, 2013, 1 page, Doc 2049.
EPO—Brief Communication for Application No. EP02800982.7, dated Jun. 17, 2013, 1 page, Doc 2050.
EPO—Summons to Attend Oral Proceedings Pursuant to Rule 115(1) EPC for Application No. EP02800982.7, dated Oct. 17, 2013, 20 pages, Doc 2051.
EPO—Form 2310 Requesting Acknowledgement of Receipt from Moore for Application No. EP02800982.7, dated Oct. 17, 2013, 3 pages, Doc 2052.
EPO—Form 2310 Requesting Acknowledgement of Receipt from Schussler for Application No. EP02800982.7, dated Oct. 17, 2013, 1 pages, Doc 2053.
Schweiger—Request for Interpreters During Oral Proceedings for Application No. EP02800982.7, dated Dec. 10, 2013, 1 page, Doc 2055.
EPO—Brief Communication, Summons to Attend Oral Proceedings for Application No. EP02800982.7, dated Dec. 16, 2013, 1 page, Doc 2056.

(56) References Cited

OTHER PUBLICATIONS

Schweiger—Response to Summons to Attend Oral Proceedings for Application No. EP02800982.7, dated Jan. 10, 2014, 35 pages, Doc 2057.
EPO—Brief Communication Regarding Language for Oral Proceedings for Application No. EP02800982.7, dated Jan. 15, 2014, 1 page, Doc 2058.
EPO—Brief Communication for Application No. EP02800982.7, dated Jan. 16, 2014, 1 page, Doc 2059.
EPO—Brief Communication Regarding Summons to Attend Oral Proceedings for Application No. EP02800982.7, dated Jan. 17, 2014, 2 pages, Doc 2060.
EPO—Brief Communication Regarding Summons to Attend Oral Proceedings for Application No. EP02800982.7, dated Jan. 28, 2014, 1 pages, Doc 2061.
EPO—Information Regarding the Oral Proceedings for Application No. EP02800982.7, dated Feb. 12, 2014, 1 page, Doc 2062.
EPO—Communication Pursuant to Article 101(1) and Rule 81(2) to (3) EPC for Application No. EP02800982.7, dated Mar. 3, 2014, 4 pages, Doc 2063.
L&P—Letter Relating to Appeal Procedure for Application No. EP06786943.8, dated Mar. 25, 2014, 12 pages, Doc 2196.
EPO—Provision of a Copy the Minutes in Accordance with Rule 124(4) EPC for Application No. EP02800982.7, dated Apr. 10, 2014, 11 pages, Doc 2064.
Schweiger—Response to Communication Pursuant to Article 101(1) and Rule 81(2) to (3) EPC for Application No. EP02800982.7, dated May 2, 2014, 1 page, Doc 2065.
Schweiger—Response to Communication Pursuant to Article 101(1) and Rule 81(2) to (3) EPC for Application No. EP02800982.7, dated May 2, 2014, 1 page, Doc 2066.
Huber—Response to Official Communication of Mar. 3, 2014 for Application EP02800982.7, dated May 8, 2014, 83 pages, Doc 2067.
EPO—Brief Communication Regarding Letter from Proprietor for Application No. EP02800982.7, dated May 14, 2014, 1 page, Doc 2068.
EPO—Brief Communication Regarding Copies of Letter from Proprietor for Application No. EP02800982.7, dated Aug. 14, 2017, 2 page, Doc 2069.
L&P—Document Concerning Representation for Application No. EP06786943.8, dated Oct. 8, 2014, 2 pages, Doc 2197.
L&P—Confirmation of Document Concerning Representation for Application No. EP06786943.8, dated Oct. 14, 2014, 2 pages, Doc 2198.
Schweiger—Response to Brief Communication dated Aug. 14, 2014 for Application No. EP02800982.7, dated Oct. 20, 2014, 1 page, Doc 2070.
EPO—Interlocutory Decision in Opposition Proceedings for Application No. EP02800982.7, dated Nov. 14, 2014, 79 pages, Doc 2071.
EPO—Acknowledgement from Schwieger for Application No. EP02800982.7, dated Nov. 14, 2014, 3 page, Doc 2072.
EPO—Acknowledgement from Schussler for Application No. EP02800982.7, dated Nov. 14, 2014, 1 page, Doc 2073.
EPO—Maintenance of the Patent with the Documents Specified in the Final Decision for Application No. EP02800982.7, dated Apr. 23, 2015, 1 page, Doc 2074.
EPO—Communication Pursuant to Rule 82(2) EPC for Application No. EP02800982.7, dated May 7, 2015, 7 pages, Doc 2075.
L&P—Enquiry as to When a Communication Regarding the Appeal Proceedings can be Expected for Application No. EP06786943.8, dated Jun. 3, 2015, 1 pages, Doc 2199.
Huber—Response to Official Communication Pursuant to Rule 82(2) of May 7, 2015 for Application No. EP02800982.7, dated Aug. 7, 2015, 22 pages, Doc 2076.
Huber—Confirmation of Response to Official Communication Pursuant to Rule 82(2) of May 7, 2015 for Application No. EP02800982.7, dated Aug. 8, 2015, 21 pages, Doc 2077.
EPO—Termination of the Opposition Proceedings with Maintenance of Patent for Application No. EP02800982.7, dated Aug. 21, 2015, 1 page, Doc 2078.
EPO—Decision to Maintain European Patent in Amended Form (Art. 101(3)(a) EPC ) for Application No. EP02800982.7, dated Aug. 27, 2015, 2 pages, Doc 2079.
EPO—Board of Appeals; Oral Proceedings to be Held for Application No. EP06786943.8, dated Nov. 13, 2015, 1 page, Doc 2200.
EPO—Change of Composition of the Board for Application No. EP06786943.8, dated Apr. 1, 2016, 1 page, Doc 2202.
EPO—Change of Composition of the Board for Application No. EP06786943.8, dated Apr. 6, 2016, 1 page, Doc 2203.
L&P—Reply to Summons to Attend Oral Proceedings dated Nov. 18, 2015 for Application No. EP06786943.8, dated Apr. 15, 2016, 26 pages, Doc 2204.
EPO—Confirmation of Reply to Summons to Attend Oral Proceedings dated Nov. 18, 2015 for Application No. EP06786943.8, dated Apr. 18, 2016, 26 pages, Doc 2205.
EPO—The Minutes of the Oral Proceedings for Application No. EP06786943.8, dated Oct. 10, 2016, 35 pages, Doc 1004.
EPO—The Minutes of the Oral Proceedings for Application No. EP06786943.8, dated Oct. 10, 2016, 35 pages, Doc 2206.
EPO—Decision of the Board of Appeal for Application No. EP06786943.8, dated Nov. 3, 2016, 32 pages, Doc 2207.
Deutsche Post—Advice of delivery for Application No. EP06786943.8, dated Nov. 3, 2016, 3 pages, Doc 2208.
EPO—Grant of a Patent with the Documents Specified in the Final Decision of the Board of Appeal for Application No. EP06786943.8, dated Nov. 22, 2016, 2 pages, Doc 2209.
EPO—Communication Under Rule 71(3) EPC for Application No. EP06786943.8, dated Dec. 1, 2016, 99 pages, Doc 2210.
L&P—Filing of the Translations of the Claims for Application No. EP06786943.8, dated Mar. 1, 2017, 10 pages, Doc 2211.
EPO—Confirmation of the Filing of the Translations of the Claims for Application No. EP06786943.8, dated Mar. 3, 2017, 10 pages, Doc 2212.
EPO—Decision to Grant a European Patent Pursuant to Article 97(1) EPC for Application No. EP06786943.8, dated Mar. 16, 2017, 2 pages, Doc 2213.
EPO—Transmission of the Certificate for a European Patent Pursuant to Rule 74 EPC for Application No. EP06786943.8, dated Apr. 12, 2017, 1 page, Doc 2214.
EPO—Communication Regarding the Expiry of Opposition Period for Application No. EP06786943.8, dated Feb. 16, 2018, 1 page, Doc 2215.
EPO—Acknowledgement Receipt for Board of Appeals for Application No. EP06786943.8, dated Nov. 18, 2018, 1 page, Doc 2201.
PCT—Chapter II Demand for Application No. PCT/US06/026965, dated Feb. 12, 2007, 11 pages, Doc 2165.
L&P—Response to Communication Pursuant to Article 94(3) dated Dec. 3, 2015 for Application No. EP11153241.2, dated Mar. 30, 2016, 15 pages, Doc 0991.
EPO—Request for Grant of a European Patent for Application No. EP11153227.1, dated Feb. 3, 2011, 125 pages, Doc 2216.
EPO—Designation as Inventor—Communication Under Rule 19(3) EPC for Application No. EP11153227.1, dated Apr. 26, 2011, 2 pages, Doc 2217.
Peregrine—EP Response dated May 16, 2011 for Application No. EP11153227.1, 5 pages, Doc 0775.
Peregrine—EP Response dated May 16, 2011 for Application No. 11153247.9, 6 pages, Doc 0777.
L&P—Reply to Communication Pursuant to Rule 58 EPC dated Mar. 17, 2011 for Application No. EP11153227.1, dated May 16, 2011, Doc 2218.
EPO—Communication Pursuant to Rule 19(1) EPC for Application No. EP11153227.1, dated May 23, 2011, 2 pages, Doc 2219.
EPO—Notification of European Publication Number and Information on the Application of Article 67(3) for Application No. EP11153227.1, dated Jun. 29, 2011, 10 pages, Doc 2220.
EPO—Reply to Communication Pursuant to Rule 19(1) EPC for Application No. EP11153227.1, dated Jul. 5, 2011, 2 pages, Doc 2221.

(56) References Cited

OTHER PUBLICATIONS

EPO—Extended European Search Report for Application No. EP11153227.1, dated May 4, 2012, 4 pages, Doc 2222.
L&P—Reply to Communication Pursuant to Rules 69 and 70a(1) EPC dated Jun. 4, 2012 and the European Search Opinion dated May 4, 2012 for Application No. EP11153227.1, dated Nov. 27, 2012, 10 pages, Doc 2224.
L&P—Letter regarding References Cited in US Prosecution for Application No. EP11153227.1, dated Jun. 18, 2013, 129 pages, Doc 2225.
L&P—Document Concerning Representation for Application No. EP11153227.1, dated Oct. 8, 2014, 2 pages, Doc 2227.
EPO—Confirmation of Document Concerning Representation for Application No. EP11153227.1, dated Oct. 14, 2014, 2 pages, Doc 2228.
L&P—Enquiry as to when a Communication from the Examining Division can be Expected for Application No. EP11153227.1, dated Jun. 1, 2015, 1 page, Doc 2229.
EPO—Response to Enquiry for Communication from the Examining Division for Application No. EP11153227.1, dated Jun. 9, 2015, 1 page, Doc 2230.
EPO—Notice Regarding Substantive Examination Started for Application No. EP11153227.1, dated Nov. 27, 2015, 1 page, Doc 2231.
EPO—Communication Pursuant to Article 94(3) EPC for Application No. EP11153227.1, dated Dec. 3, 2015, 4 pages, Doc 2232.
L&P—Reply to Communication Pursuant to Article 94(3) EPC for Application No. EP11153227.1 dated Dec. 3, 2015, dated Mar. 30, 2016, 13 pages, Doc 2233.
EPO—Confirmation of Reply to Communication Pursuant to Article 94(3) EPC for Application No. EP11153227.1, dated Apr. 5, 2016, 13 pages, Doc 2234.
EPO—Communication pursuant to Article 94(3) for Application No. EP11153227.1, dated Oct. 17, 2018, 4 pages, Doc 1065.
EPO—Communication Pursuant to Article 94(3) EPC for Application No. EP11153227.1, dated Oct. 17, 2018, 4 pages, Doc 2235.
L&P—Reply to Communication Pursuant to Article 94(3) EPC for Application No. EP11153227.1 dated Oct. 17, 2018 Feb. 11, 2019, 36 pages, Doc 2236.
EPO—Confirmation of Reply to Communication Pursuant to Article 94(3) EPC for Application No. EP11153227.1, dated Feb. 13, 2019, 36 pages, Doc 2237.
EPO—Communication Pursuant to Rule 69 EPC—Reminder Concerning Payment of the Designation Fee (Art. 79(2) EPC) and of the examination fee (Art. 94(1) EPC)—and invitation pursuant to Rule 70a(1) EPC for Application No. EP11153227.1, dated Jun. 4, 2012, 2 pages, Doc 2223.
EPO—Request for Grant of a European Patent for Application No. EP11153241.2, dated Feb. 3, 2011, 125 pages, Doc 2238.
EPO—Designation as Inventor—Communication Under Rule 19(3) EPC for Application No. EP11153241.2, dated Apr. 26, 2011, 2 pages, Doc 2239.
L&P—Reply to Communication Pursuant to Rule 58 EPC dated Mar. 17, 2011 for Application No. EP11153241.2, dated May 16, 2011, 5 pages, Doc 2240.
EPO—Communication Pursuant to Rule 19(1) EPC for Application No. EP11153241.2, dated May 23, 2011, 2 pages, Doc 2241.
EPO—Notification of European Publication Number and Information on the Application of Article 67(3) for Application No. EP11153241.2, dated Jun. 29, 2011, 10 pages, Doc 2242.
L&P—Response to Communications Pursuant to Rule 19(1) EPC dated May 20, 2011 and May 23, 2011 for Application No. EP11153241.2, dated Jul. 5, 2011, 4 pages, Doc 2243.
EPO—Extended Search Report for Application No. EP11153241.2, dated May 7, 2012, 4 pages, Doc 2244.
EPO—Communication Pursuant to Rule 69 EPC—Reminder Concerning Payment of the Designation Fee (Art. 79(2) EPC) and of the examination fee (Art. 94(1) EPC)—and invitation pursuant to Rule 70a(1) EPC for Application No. EP11153241.2, dated Jun. 12, 2013, 2 pages, Doc 2245.

EPO—Notice Drawing Attention to Rule 51(2) EPC, Article 2 No. 5 of the Rules Relating to Fees-Payment of Renewal Fee Plus Additional Fee for Application No. EP11153241.2, dated Sep. 4, 2012, 2 pages, Doc 2246.
L&P—Response to Communication Pursuant to Rule 69 and 70a(1) EPC dated Jun. 12, 2012 for Application No. EP11153241.2, dated Dec. 5, 2012, 30 pages, Doc 2247.
L&P—Letter regarding References Cited in US Prosecution for Application No. EP11153241.2, dated Jun. 18, 2013, 129 pages, Doc 2248.
L&P—Document Concerning Representation for Application No. EP1153241.2, dated Oct. 8, 2014, 2 pages, Doc 2252.
EPO—Confirmation of Document Concerning Representation for Application No. EP1153241.2, dated Oct. 14, 2014, 2 pages, Doc 2253.
L&P—Enquiry as to when a Communication from the Examining Division can be Expected for Application No. EP11153241.2, dated Jun. 1, 2015, 1 page, Doc 2254.
EPO—Communication in Response to Enquiry Received on Jun. 6, 2015 for Application No. EP 11153241.2, dated Jun. 9, 2015, 1 page, Doc 2255.
EPO—Communication Pursuant to Article 94(3) for Application No. EP11153247.9, dated Dec. 3, 2015, 4 pages, Doc 0980.
EPO—Communication Pursuant to Article 94(3) EPC for Application No. EP11153241.2, dated Dec. 3, 2015, 5 pages, Doc 2256.
L&P—Reply to Communication Pursuant to Article 94(3) EPC for Application No. EP11153241.2, dated Dec. 3, 2015, dated Mar. 30, 2016, 15 pages, Doc 2257.
EPO—Confirmation of Reply to Communication Pursuant to Article 94(3) dated Dec. 3, 2015 for Application No. EP11153241.2, dated Apr. 5, 2016, 15 pages, Doc 2258.
EPO—Notice Drawing Attention to Rule 51(2) EPC, Article 2 No. 5 of the Rules Relating to Fees—Payment Fee Plus Additional Fee for Application No. EP11153241.2, dated Sep. 4, 2017, 2 pages, Doc 2259.
EPO—Noting of Loss of Rights Pursuant to Rule 112(1) EPC for Application No. EP11153241.2, dated Feb. 28, 2018, 1 page, Doc 2260.
EPO—Closure of the Procedure in Respect of Application for Application No. EP11153241.2, dated May 30, 2018, 2 pages, Doc 2261.
EPO—Communication pursuant to Article 94(3) for Application No. EP11153247.9, dated Oct. 17, 2018, 4 pages, Doc 1066.
EPO—Request for Grant of European Patent for Application No. EP 11153247.9, dated Feb. 3, 2011, 125 pages, Doc 2262.
EPO—Designation as Inventor—Communication Under Rule 19(3) EPC for Application No. EP11153247.9, dated Apr. 26, 2011, 2 pages, Doc 2263.
L&P—Reply to Communication Pursuant to Rule 58 EPC dated Mar. 17, 2011 for Application No. EP11153247.9, dated May 16, 2011, 6 pages, Doc 2264.
EPO—Communication Pursuant to Rule 19(1) EPC for Application No. EP11153247.9, dated May 23, 2011, 2 pages, Doc 2265.
EPO—Notification of European Publication Number and Information on the Application of Article 67(3) EPC for Application No. EP11153247.9, dated Jun. 29, 2011, 10 pages, Doc 2266.
L&P—Reply to Communication Pursuant to Rule 19(1) EPC dated May 20 & 23, 2011 for Application No. EP11153247.9, dated Jul. 5, 2011, 2 pages, Doc 2267.
EPO—Extended European Search Report for Application No. EP11153247.9, dated May 7, 2012, 4 pages, Doc 2268.
EPO—Communication Pursuant to Rule 69 EPC—Reminder Concerning Payment of the Designation Fee (Art. 79(2) EPC) and the Examination Fee (Art. 79(2) EPC)—and Invitation Pursuant to Rule 70a(1) EPC for Application No. EP 11153247.9, dated Jun. 12, 2012, 2 pages, Doc 2269.
EPO—Notice Drawing Attention to Rule 51(2) EPC, Article 2 No. 5 of the Rules Relating to the Fees—Payment of the Renewal Fee and Additional Fee for Application No. EP11153247.9, dated Sep. 4, 2012, 2 pages, Doc 2270.

(56) References Cited

OTHER PUBLICATIONS

L&P—Reply to Communication Pursuant to Rule 69 and 71a(1) EPC dated Jun. 12, 2012 and the European Search Opinion dated May 7, 2012 for Application No. EP11153247.9, dated Dec. 5, 2012, 24 pages, Doc 2271.
L&P—Letter Regarding References Cited in US Prosecution for Application No. EP11153247.9, dated Jun. 18, 2013, 129 pages, Doc 2272.
L&P—Letter Regarding References Cited in JP Prosecution for Application No. EP11153247.9, dated Mar. 25, 2014, 12 pages, Doc 2273.
L&P—Document Concerning Representation for Application No. EP11153247.9, dated Oct. 8, 2014, 2 pages, Doc 2274.
EPO—Confirmation of Document Concerning Representation for Application No. EP11153247.9, dated Oct. 14, 2014, 2 pages, Doc 2275.
L&P—Enquiry as to When a Communication from the Examining Division can be Expected for Application No. EP11153247.9, dated Jun. 1, 2015, 1 page, Doc 2276.
EPO—Response to Enquiry for Communication from the Examining Division for Application No. EP11153247.9, dated Jun. 9, 2015, 1 page, Doc 2277.
EPO—Substantive Examination Started for Application No. EP11153247.9, dated Nov. 30, 2015, 3 pages, Doc 2278.
EPO—Communication Pursuant to Article 94(3) for Application No. EP11153241.2, dated Dec. 3, 2015, 5 pages, Doc 0979.
EPO—Communication Pursuant to Article 94(3) EPC for Application No. EP11153247.9, dated Dec. 3, 2015, 4 pages, Doc 2279.
L&P—Reply to Communication Pursuant to 94(3) EPC dated Dec. 2, 2015 for Application No. EP11153247.9, dated Mar. 30, 2016, Doc 2280.
EPO—Confirmation of Reply to Communication Pursuant to 94(3) EPC dated Dec. 2, 2015 for Application No. EP11153247.9, dated Apr. 5, 2016, 13 pages, Doc 2281.
EPO—Communication Pursuant to Article 94(3) EPC for Application No. EP11153247.9, dated Oct. 17, 2018, 4 pages, Doc 2282.
L&P—Reply to Communication Pursuant to Article 94(3) EPC for Application No. EP11153247.9 dated Oct. 17, 2018, dated Feb. 11, 2019, 39 pages, Doc 2283.
EPO—Confirmation of Reply to Communication Pursuant to Article 94(3) EPC dated Oct. 17, 2018 for Application No. EP11153247.9, dated Feb. 13, 2019, 39 pages, Doc 2284.
EPO—Request for Grant of a European Patent for Application No. EP11153281.8, dated Feb. 4, 2011, 125 pages, Doc 2285.
EPO—Designation as Inventor—Communication Under Rule 19(3) EPC for Application No. EP11153281.8, dated Apr. 26, 2011, 2 pages, Doc 2286.
L&P—Reply to Communication Pursuant to Rule 58 EPC dated Mar. 17, 2011 for Application No. EP11153281.8, dated May 16, 2011, 7 pages, Doc 2287.
EPO—Confirmation of Reply to Communication Pursuant to Rule 58 EPC dated Mar. 17, 2011 for Application No. EP11153281.8, dated May 18, 2011, 7 pages, Doc 2288.
EPO—Communication Pursuant to Rule 19(1) EPC for Application No. EP11153281.8, dated May 20, 2011, 2 pages, Doc 2289.
EPO—Notification of European Publication Number and Information on the Application of Article 67(3) EPC for Application No. EP11153281.8, dated Jun. 29, 2011, 11 pages, Doc 2290.
L&P—Response to Communication Pursuant to Rule 91(1) EPC dated May 20, 2011 and May 23, 2011 for Application No. EP11153281.8, dated Jul. 5, 2011, 2 pages, Doc 2291.
EPO—Extended European Search Report for Application No. EP11153281.8, dated May 8, 2012, 4 pages, Doc 2292.
EPO—Communication Pursuant to Rule 69 EPC—Reminder Concerning Payment of Designation Fee (Art. 79(2) EPC) and of the Examination Fee (Art. 94(1) EPC)—and Invitation Pursuant to Rule 70a(1) EPC for Application No. EP11153281.8, dated Jun. 12, 2012, 2 pages, Doc 2293.
EPO—Notice Drawing Attention to Rule 51(2) EPC, Article 2 No. 5 of the Rules Relating to Fees, Payment of the Renewal Fee Plus Additional Fee for Application No. EP11153281.8, dated Sep. 4, 2012, 2 pages, Doc 2294.
L&P—Response to Communication Pursuant to Rule 69 EPC and 70a(1) dated Jun. 12, 2012 for Application No. EP11153281.8, dated Dec. 5, 2012, 30 pages, Doc 2295.
L&P—Listing of References Cited During Prosecution of Corresponding US Application for Application No. EP11153281.8, dated Jun. 18, 2012, 129 pages, Doc 2296.
L&P—Listing of References Cited During Prosecution of Corresponding JP Application for Application No. EP11153281.8, dated Mar. 25, 2014, 12 pages, Doc 2297.
L&P—Document Concerning Representation for Application No. EP11153281.8, dated Oct. 8, 2014, 2 pages, Doc 2298.
EPO—Confirmation of Document Concerning Representation for Application No. EP11153281.8, dated Oct. 14, 2014, 2 pages, Doc 2299.
L&P—Enquiry as to When a Communication from the Examining Division can be Expected for Application No. EP11153281.8, dated Jun. 1, 2015, 1 page, Doc 2300.
EPO—Response to Enquiry for Communication from the Examining Division for Application No. EP11153281.8, dated Jun. 9, 2015, 1 page, Doc 2301.
EPO—Substantive Examination Started for Application No. EP11153281.8, dated Nov. 30, 2015, 1 page, Doc 2302.
EPO—Communication Pursuant to Article 94(3) EPC for Application No. EP11153281.8, dated Dec. 4, 2015, 5 pages, Doc 2303.
L&P—Reply to Communication Pursuant to Article 94(3) EPC dated Dec. 4, 2015, for Application No. EP11153281.8, dated Mar. 30, 2016, 13 pages, Doc 2304.
EPO—Confirmation of Reply to Communication Pursuant to Article 94(3) EPC dated Dec. 4, 2015 for Application No. EP11153281.8, dated Apr. 5, 2016, 18 pages, Doc 2305.
EPO—Communication Pursuant to Article 94(3) EPC for Application No. EP11153281.8, dated Oct. 16, 2018, 9 pages, Doc 2306.
EPO Request for Grant of a European Patent for Application No. EP11153313.9, dated Feb. 4, 2011, 125 pages, Doc 2307.
EPO—Designation as Inventor—Communication Under Rule 19(3) EPC for Application No. EP11153313.9, dated Apr. 26, 2011, 2 pages, Doc 2308.
L&P—Reply to Communication Pursuant to Rule 58 EPC dated Mar. 17, 2011 for Application No. EP11153313.9, dated May 16, 2011, 8 pages, Doc 2309.
EPO—Communication Pursuant to Rule 19(1) EPC for Application No. EP11153313.9, dated May 20, 2011, 3 pages, Doc 2310.
EPO—Notification of European Publication Number and Information on the Application of Article 67(3) for Application No. EP11153313.9, dated Jun. 29, 2011, 10 pages, Doc 2311.
L&P—Response to Communication Pursuant to Rule 19(1) EPC dated May 20, 2011 and May 23, 2011 for Application No. EP11153313.9, dated Jul. 5, 2011, 4 pages, Doc 2312.
EPO—Extended European Search Report for Application No. EP11153313.9, dated May 8, 2012, 4 pages, Doc 2313.
EPO—Communication Pursuant to Rule 69 EPC—Reminder Concerning Payment of the Designation Fee (Art. 79(2) EPC) and of the Examination Fee (Art. 94(1) EPC)—and Invitation Pursuant to Rule 70a(1) EPC for Application No. EP11153313.9, dated Jun. 12, 2012, 2 pages, Doc 2314.
L&P—Response to Communication Pursuant to Rule 69 EPC and 70a(1) dated Jun. 12, 2012 and the European Search Report dated May 8, 2012 for Application No. EP11153313.9, dated Dec. 5, 2012, 30 pages, Doc 2315.
L&P—List of References Cited in Corresponding US Application for Application No. EP11153313.9, dated Jun. 18, 2013, 129 pages, Doc 2316.
L&P—List of References Cited in Corresponding JP Application for Application No. EP11153313.9, dated Mar. 25, 2014, 12 pages, Doc 2317.
L&P—Document Concerning Representation for Application No. EP11153313.9, dated Oct. 8, 2014, 2 pages, Doc 2318.

(56) References Cited

OTHER PUBLICATIONS

EPO—Confirmation of Document Concerning Representation for Application No. EP11153313.9, dated Oct. 14, 2014, 2 pages, Doc 2319.
L&P—Enquiry as to when a Communication from the Examining Division can be Expected for Application No. EP11153313.9, dated Nov. 18, 2015, 1 page, Doc 2320.
EPO—Confirmation of Enquiry as to when a Communication from the Examining Division can be Expected for Application No. EP11153313.9, dated Nov. 21, 2015, 1 page, Doc 2321.
EPO—Communication in Response to Enquiry dated Nov. 18, 2015 for Application No. EP11153313.9, dated Nov. 24, 2015, 1 page, Doc 2322.
EPO—Substantive Examination Started for Application No. EP11153313.9, dated May 9, 2016, 1 page, Doc 2323.
EPO—Communication Pursuant to Article 94(3) EPC for Application No. EP11153313.9, dated May 13, 2016, 4 pages, Doc 2324.
EPO—Noting Loss of Rights Pursuant to Rule 112(1) EPC for Application No. EP11153313.9, dated Oct. 21, 2016, 1 page, Doc 2325.
EPO—Closure of the Procedure in Respect of Application EP11153313.9, dated Jan. 20, 2017, 1 page, Doc 2326.
JPO—Notice of Reasons for Refusal for Application No. JP2008-521544, dated Jul. 10, 2012, 4 pages, Doc 0820.
Notification of Reason for Refusal for Application No. JP2008-521544, dated Jul. 17, 2012, 4 pages, Doc 2401.
Amended Claims for Application No. JP2008-521544, dated Jan. 8, 2013, 8 pages, Doc 2403.
L&P—Particulars of Letters Patent for Patent No. JP5215850, dated Apr. 11, 2013, 5 pages, Doc 2402.
L&P—Letter Regarding Filing Divisional Application for Application No. JP2013-003388, dated Jul. 3, 2014, 14 pages, Doc 2406.
Jaquez Land Richman—Letter Regarding Notice of Allowance for Application No. JP2013-003388, dated Dec. 18, 2014, 1 page, Doc 2407.
JPO—Grant of Patent for Application No. JP2013-003388, dated Jan. 9, 2015, 5 pages, Doc 2408.
Jaquez Land Richman—Letter Regarding Patent Grant for Application No. JP2013-003388, dated Apr. 9, 2015, 1 page, Doc 2409.
PCT—International Search Report for PCT/US2006/026965, dated Nov. 7, 2006, 19 pages, Doc 0651.
PCT—Notification Concerning Submission or Transmittal of Priority Document for Application No. PCT/US06/026965, dated Sep. 26, 2006, 131 page, Doc 2122.
WIPO—Publication with International Search Report for Application No. PCT/US06/026965, dated Jan. 18, 2007, 112 pages, Doc 2124.
Peregrine—Request Form for Application No. PCT/US06/026965, dated Mar. 14, 2007, 1 page, Doc 2123.
Geier—International Preliminary Report on Patentability from EPO dated Jun. 21, 2007 for Application No. PCT/US2006/026965, 12 pages, Doc 0658.
PCT—Written Opinion of the International Searching Authority for Application No. PCT/US06/026965, filed Jul. 11, 2006, 11 pages, Doc 2125.
PCT—International Preliminary Report on Patentability for Application No. PCT/US06/026965, filed Jul. 11, 2006, 12 pages, Doc 2126.
L&P—Response to Communication Pursuant to Rule 69 EPC dated Jul. 20, 2015 for Application No. EP14182150.4, dated Jan. 14, 2016, 24 pages, Doc 0987.
EPO—Noting Loss of Rights Pursuant to Rule 112(1) EPC for Application No. EP07794407.2, dated May 8, 2014, 1 page, Doc 0904.
Societa—Response for Application No. EP07794407.2, dated Jul. 11, 2014, 32 pages, Doc 0915.
Peregrine—Response to communication dated Nov. 16, 2012 for Application No. EP09174085.2, dated May 23, 2013, 18 pages, Doc 0852.
JPO—Decision to Grant a Patent for Application No. JP2013-006353, dated Jul. 1, 2014, 6 pages, Doc 0914.
JPO—Notice of Reasons for Refusal for Application No. JP2010506156, dated Apr. 9, 2012, 4 pages, Doc 0808.
JPO—Notice of Reasons for Refusal for Application No. JP2013-006353, dated Oct. 21, 2013, 10 pages, Doc 0876.
Peregrine—Amendment for Application No. JP2013-006353, dated Apr. 28, 2014, 18 pages, Doc 0961.
EPO—Extended Search Report for Application No. EP12194187.6, dated Feb. 7, 2013, 11 pages, Doc 0840.
EPO—Extended Search Report for Application No. EP14165804.7, dated May 27, 2014, 8 pages, Doc 0909.
EPO—Communication Pursuant to Article 94(3) for Application No. 11153227.1, dated Jul. 4, 2019, 7 pages, Doc 2412.
Hieda—Floating-Body Effect Free Concave SOI-MOSFETs (COSMOS), ULSI Research Center, Toshiba Corporation, IEEE 1991, pp. 26.2.1-26.2.4, 4 pages, Doc 0187.
Katzin—"High Speed 100+ W RF Switched Using GaAs MMICs", IEEE Transactions on Microwave Theory and Techniques, 1992, pp. 1989-1996, 8 pages, Doc 0194.
Armijos—"High Speed DMOS FET Analog Switches and Switch Arrays", Temic Semiconductors 1994, pp. 1-10, 10 pages, Doc 0202.
Li—"Suppression of Geometric Component of Charge Pumping Current SOI/MOSFETs", Proc. Int. Symp. VLSI Technology, Systems & Applications (IEEE 1995), pp. 144-148, 5 pages, Doc 8016.
Kohama—"High Power DPDT Antenna Switch MMIC for Digital Cellular Services", IEEE Journal of Solid-State Circuits, 1996, pp. 1406-1411, 6 pages, Doc 0244.
Tenbroek—"Electrical Measure of Silicon Film and Oxide Thickness in Partially Depleted SOI Technologies", Solid-State Electronics, vol. 39, No. 7, pp. 1011-1014, 1996, 4 pages, Doc 8019.
Johnson—"Silicon-On-Sapphire Technology for Microwave Circuit Applications", Dissertation UCSD 1997, pp. 1-184, 214 pages, Doc 0288.
Maeda—"A Highly Reliable .35um Field Body-Tied SOI Gate Array for Substrate-Bias-Effect Free Operation", 1997 Symposium on VLSI Technology Digest of Technical Papers, 2 pages, Doc 8020.
Koh—"1Giga Bit SOI DRAM with Fully Bulk Compatible Process and Body-Contacted SOI MOSFET Structure", IEEE 1997, pages, Doc 8021.
Huang—"Device Physics, Performance Simulations and Measured Results of SOI MOS and DTMOS Transistors and Integrated Circuits", Beijing Microelectronicsn Technology Institute, 1998 IEEE, pp. 712-715, 4 pages, Doc 0333.
Chung—"A New SOI MOSFET Structure with Junction Type Body Contact", International Electron Device Meeting (IEDM) Technical Digest, 1999, pp. 59-62, 4 pages, Doc 0379.
Devlin—"The Design of Integrated Switches and Phase Shifters", 1999, 15 pages, Doc 0381.
Lim—"Partial SOI LDMOSFETs for High-Side Switching", Dept. of Engineering, University of Cambridge, 1999 IEE, pp. 149-152, 4 pages, Doc 0393.
Maeda—"Substrate Bias Effect and Source Drain Breakdown Characteristics in Body Tied Short Channel SOI MOSFETs", IEEE Transactions on Electron Devices, vol. 46, No. 1, Jan. 1999, pp. 151-158, 8 pages, Doc 0397.
Rodgers—"Silicon UTSi CMOS RFIC for CDMA Wireless Communications System", IEEE MTT-S Digest, 1999, pp. 485-488, 4 pages, Doc 0406.
Kanda—"A Si RF Switch MMIC for the Cellular Frequency Band Using SOI-CMOS Technology", The Institute of ELectronics, Information and Communication Engineers, vol. 100, No. 152, Jun. 2000, pp. 79-83, 5 pages, Doc 0443.
Fung—"Controlling Floating-Body Effects for 0.13um and .10um SOI CMOS", IDEM 00-231-234, IEEE 2000, 4 pages, Doc 8017.
Cristoloveanu—"The Four-Gate Transistor", Institute of Microelectronics, Electromagnetism and Photonics, ESSDERC 2001, pp. 323-326, 4 pages, Doc 0478.
Reedy—"Utsi CMOS: A Complete RF SOI Solution", Peregrine Semiconductor 2001, pp. 1-6, 6 pages, Doc 0508.

(56) References Cited

OTHER PUBLICATIONS

Matloubian—"Smart Body Contact for SOI MOSFETs" 1989 IEEE SOS/SOI Technology Conference pp. 128-129, 2 pages, Doc 0425.
Fung—"Frequency Dispersion in Partially Depleted SOI MOSFET Output Resistance, ", Proceedings 1996 IEEE International SOI Conference, Oct. 1996, pp. 146-147, 2 pages, Doc 0268.
Duyet—"Effects of Body Reverse Pulse Bias on Geometric Component of Charge Pumping Current in FD SOI MOSFETs", Proceedings IEEE Intl SOI Conference, Oct. 1998, pp. 79-80, 2 pages, Doc 0364.
Goldman—"0.15um SOI DRAM Technology Incorporating Sub-Volt Dynamic Threshold Devices for Embedded Mixed-Signal & RF Circuits", 2001 IEEE SOI Conference, pp. 97-98, 2 pages, Doc 0531.
Chan—"A Novel SOI CBiCMOS Compatible Device Structure for Analog and Mixed-Mode Circuits", Dept. of EECS, University of California at Berkeley, IEEE Nov. 1995, pp. 40-43, 4 pages, Doc 1078.
Yamamoto—"A Single-Chip GaAs RF Transceiver for 1.9GHz Digital Mobile Communication Systems", IEE 1996, pp. 1964-1973, 10 pages, Doc 0255.
NEC Corporation—"uPG13xG Series L-Band SPDT Switch GaAs MMIC", Document No. P1096EJ1VOANDO (1st Edition), Feb. 1996, 30 pages, Doc 0248.
Koh—"Body-Contacted SOI MOSFET Structure with Fully Bulk CMOS Compatible Layout and Process", IEEE Electron Device Letters, vol. 18, No. 3, Mar. 1997, pp. 102-104, 3 pages, Doc 0305.
Chuang—"SOI for Digital CMOS VLSI Design: Design Considerations and Advances", Proceedings of the IEEE vol. 86, No. 4, Apr. 1998 pp. 689-720, 32 pages.
Yamamoto—"A 2.2-V Operation, 2.4-GHz Single-Chip GaAs MMIC Transceiver for Wireless Application", IEEE Journal of Solid-State Circuits, vol. 34, No. 4, Apr. 1999, pp. 502-512, 11 pages, Doc 0417.
Fung—"Present Status and Future Direction of BSIM SOIL Model for High-Preformance/Low-Power/RF Application", IBM Microelectronics, Semiconductor Research and Development Center, Apr. 2002, 4 pages, Doc 0554.
Patel—"A Novel Body Contact for SIMOX Based SOI MOSFETs", Solid-State Electronics vol. 34, No. 10, pp. 1071-1075, Apr. 22, 1991, 6 pages, Doc 3000.
Chen—"Low Power, Multi-Gigabit DRAM Cell Design Issues Using SOI Technologies", http://bwrc.eecs.berkeley.edu/people/grad_students/chenff/reports, May 1999, 6 pages, Doc 0418.
Adan—"Linearity and Low-Noise Performance of SOI MOSFETs for RF Applications", IEEE Transactions on Electron Devices, May 2002 vol. 49, No. 5, pp. 881-888, 8 pages, Doc 0555.
Shahid—"Issues in SOI CMOS Technology and Design", IEEE 2000 Custom Integrated Circuits Conference, Publication/Presentation dated May 21, 2000, 78 pages, Doc 8014.
Gil—"A High Speed and Low Power SOI Inverter using Active Body-Bias", Proceedings International Symposium on Low Power Electronics and Design, Aug. 1998, pp. 59-63, 5 pages, Doc 0359.
Tseng—"AC Floating-Body Effects and the Resultant Analog Circuit Issues in Submicronn Floating Body and Body-Grounded SOI MOSFETs", IEEE Transactions on Electron Devices, vol. 46, No. 8, Aug. 1999, 8 pages, Doc 0420.
Horiuchi—"A Dynamic-Threshold SOI Device with a J-FET Embedded Source Structure and a Merged Body-Bias-Control Transistor—Part II: Circuit Simulation", IEEE Transactions on Electron Devices, vol. 47, No. 8, Aug. 2000 pp. 1593-1598, 6 pages, Doc 0457.
Yamamoto—"A 2.4GHz Band 1.8V Operation Single Chip SI-CMOS T/R MMIC Front End with a Low Insertion Loss Switch", IEEE Journal of Solid-State Circuits, vol. 36, No. 8, Aug. 2001, pp. 1186-1197, 12 pages, Doc 0527.
Tseng—"AC Floating-Body Effects an Submicron Fully Depleted (FD) SOI nMOSFETs and the Impact on Analog Applications", IEEE Electron Devices, vol. 19, No. 9, Sep. 1998, pp. 351-353, 3 pages, Doc 0362.
Horiuchi—"A Dynamic-Threshold SOI Device with a J-FET Embedded Source Structure and a Merged Body-Bias-Control Transistor—Part I: A J-FET Embedded Source Structure Properties", IEEE Transactions on Electron Devices, vol. 47, No. 8, Aug. 2000 pp. 1587-1592, 6 pages, Doc 0456.
EPO—Communication Pursuant to Article 94(3) for Application No. EP11153281.8 dated Aug. 27, 2019, 4 pages.
EPO—Communication Pursuant to Article 94(3) for Application No. EP11153247.9 dated Aug. 27, 2019, 4 pages.
USPTO—Notice of Allowance and Notice of Allowability for U.S. Appl. No. 16/167,389 dated Oct. 10, 2019, 89 pages.
PSemi—U.S. Appl. No. 16/676,350, filed Nov. 6, 2019, 92 pages.
PSemi—U.S. Appl. No. 16/679,760, filed Nov. 11, 2019, 92 pages.
USPTO—Notice of Allowance and Notice of Allowability for U.S. Appl. No. 15/419,898 dated Sep. 30, 2019, 98 pages.
USPTO—Notice of Allowance and Notice of Allowability for U.S. Appl. No. 16/054,959 dated Sep. 23, 2019, 131 pages.
USPTO—Notice of Allowance and Notice of Allowability for U.S. Appl. No. 16/377,114 dated Oct. 7, 2019, 111 pages.
PSemi—U.S. Appl. No. 16/590,262, filed Oct. 1, 2019, 92 pages.
USPTO—Office Action dated U.S. Appl. No. 16/590,262 dated Nov. 20, 2019, 7 pages.
PSemi—U.S. Appl. No. 16/590,292, filed Oct. 21, 2019, 143 pages.
USPTO—Office Action dated Nov. 20, 2019 for U.S. Appl. No. 16/590,292, 7 pages.
PSemi—U.S. Appl. No. 16/671,967, filed Nov. 1, 2019, 143 pages.
PSemi—U.S. Appl. No. 16/673,411, filed Nov. 4, 2019, 142 pages.
USPTO—Notice of Allowance and Notice of Allowability dated Sep. 19, 2019 for U.S. Appl. No. 16/046,974, 120 pages.
PSemi—Rule 312 Amendment filed Nov. 1, 2019 for U.S. Appl. No. 16/046,974, 19 pages.
USPTO—Notice of Allowance and Notice of Allowability dated Oct. 2, 2019 for U.S. Appl. No. 16/377,026, 122 pages.
PSemi—Request for Continued Examination and Amendment filed Nov. 6, 2019 for U.S. Appl. No. 15/826,453, 28 pages.
USPTO—Filing Receipt dated Oct. 18, 2019 for U.S. Appl. No. 16/590,262, 4 pages.
USPTO—Filing Receipt dated Oct. 22, 2019 for U.S. Appl. No. 16/590,292, 4 pages.
USPTO—Filing Receipt dated Nov. 20, 2019 for U.S. Appl. No. 16/671,967, 4 pages.
USPTO—Filing Receipt and Notice to File Corrected Application Papers dated Nov. 21, 2019 for U.S. Appl. No. 16/673,411, 7 pages.
Imam—"A Simple Method to Determine the Floating-Body Voltage of SOI CMOS Devices", IEEE Electron Device Letters, vol. 21, No. 1, Jan. 2000, pp. 21-23, 3 pages.
Hirota—"0.5V 320MHz 8b Multiplexer/Demultiplier Chips Based on a Gate Array with Regular Structured DRMOS/SOI", IEEE International Solid-State Circuits Conference. Digest of Technical Papers, ISSCC. First Edition 1998 (Cat. No. 98CH36156) pp. 12.2-1-12.2-11, 11 pages.
Voldman—"Dynamic Threshold Body- and Gate-coupled SOI ESD Protection Networks", Proceedings Electrical Overstress/Electrostatic Discharge Symposium (Date of Conference Sep. 23-25, 1997, Santa Clara, CA), Journal of Electrostatics 44 Mar. 20, 1998, pp. 239-255, 17 pages.
Kuge—"SOI-DRAM Circuit Technologies for Low Power High Speed Multigiga Scale Memories", Digest of Technical Papers, Symposium on VLSI Circuits, Jun. 8-10, 1995, Kyoto, Japan. IEEE Journal of Solid-State Circuits, vol. 31, No. 4, Apr. 1996, pp. 586-591, 6 pages.
Allen—"Characterization and Modeling of Silicon-on-Insulator Field Effect Transistors", Department of Electrical Engineering and Computer Science, MIT, May 20, 1999, 80 pages.
Duyet—"Suppression of Geometric Component of Charge Pumping Current in Thin Film Silicon on Insulator Metal-Oxide-Semiconductor-Field-Effect Transistors", Copyright (c) 1998, The Japan Society of Applied Physics, Japanese Journal of Applied Physics, vol. 37, Part 2, No. 7B, pp. L855-L858, Apr. 14, 1998 (Accepted for Publication May 27, 1998) 4 pages.
Scheinberg—"A Computer Simulation Model for Simulating Distortion in FET Resistors", IEEE Transactions on Computer-Aided Design of Integrated Circuits and Systems, vol. 9, Issue 9, Sep. 2000, pp. 981-989, 9 pages.

(56) References Cited

OTHER PUBLICATIONS

Adan—"Off-State Leakage Current Mechanisms in BulkSi and SOI MOSFETs and Their Impact on CMOS ULSIs Standby Current", IEEE Transactions on Electron Devices, vol. 48, No. 9, Sep. 2001, pp. 2050-2057, 8 pages.
Kuge—"SOI-DRAM Circuit Technologies for Low Power High Speed Multigiga Scale Memories", Jun. 8-10, 1995 IEEE Journal of Solid-State Circuits, vol. 31, No. 4, Apr. 1, 1996, pp. 585-591, 6 pages.
Hirota—"0.5V 320MHz 8b Multiplexer/Demultiplier Chips Based on a Gate Array with Regular-Structured DRMOS/SOI", Feb. 5-7, 1998, 1998 IEEE International Solid-State Circuits Conference. Digest of Technical Papers, ISSCC. First Edition, pp. 12.2-1-12.2-11, 11 pages.
Duyet—"Suppression of Geometric Component of Charge Pumping Current in Thin Film Silicon on insulator Metal-Oxide-Semiconductor Field-Effect Transistors", Japanese Journal of Applied Physics, Jul. 15, 1998, vol. 37, pp. L855-L858, 4 pages.
Imam—"A Simple Method to Determine the Floating-Body Voltage of SOI CMOS Devices", IEEE Electron Device Letters, vol. 21, No. 1, Jan. 1, 2000, pp. 21-23, 3 pages.
Scheinberg—"A Computer Simulation Model for Simulating Distortion in FET Resistors", IEEE Transactions on Computer-Aided Design of Integrated Circuits and Systems, vol. 19, No. 9, Sep. 1, 2000, pp. 981-989, 9 pages.
Reedy—"Utsi CMOS: A Complete RF SOI Solution", Peregrine Semiconductor Nov. 1, 2000, pp. 1-6, 6 pages.
Adan—"Off-State Leakage Current Mechanisms in BulkSi and SOI MOSFETs and Their Impact on CMOS ULSIs Standby Current", IEEE Transactions on Electron Devices, vol. 48, No. 9, Sep. 1, 2001, pp. 2050-2057, 8 pages.
Analog Devices—"LC2MOS High Speed, Quad SPST Switch", Rev. B, 8 pages, Apr. 1988.
Analog Devices—"LC2MOS Quad SPST Switch", Rev. B, 6 pages, Jul. 1992.
Wang—"Threshold Voltage Instability at Low Temperatures in Partially Depleted Thin Film SOI MOSFETs", IEEE SOS/SOI Technology Conference, Jun. 1991, pp. 91-92, 2 pages.
Assaderaghi—"Transient Pass-Transistor Leakage Current in SOI MOSFETs", IEEE Electron Device Letters, vol. 18, No. 6, Jun. 1997, pp. 241-243, 3 pages.
Mashiko—"Ultra-Low Power Operation of Partially-Depleted SOI/CMOS Integrated Circuits", IEICE Transactions on Electronic Voltage, No. 11, Nov. 2000, pp. 1697-1704, 8 pages.
Casu—"Synthesis of Low-Leakage PD-SOI Circuits with Body Biasing", Intl Symposium on Low Power Electronics and Design, pp. 287-290, Aug. 6-7, 2001, 4 pages.
Stuber—Reissue U.S. Appl. No. 16/710,998, filed Dec. 11, 2019, 103 pages.
USPTO—Filing Receipt dated Dec. 17, 2019 for U.S. Appl. No. 16/710,998, 4 pages.
USPTO—Notice to File Missing Parts dated Dec. 19, 2019 for U.S. Appl. No. 16/710,998, 2 pages.
USPTO—Filing Receipt dated Nov. 27, 2019 for U.S. Appl. No. 16/679,760, 4 pages.
USPTO—Non-final Office Action dated Dec. 26, 2019 for U.S. Appl. No. 16/679,760, 19 pages.
USPTO—Non-final Office Action dated Dec. 26, 2019 for U.S. Appl. No. 16/676,350, 17 pages.
Burgener—U.S. Appl. No. 16/738,343, filed Jan. 9, 2020, 92 pages.
USPTO—Corrected Notice of Allowability dated Dec. 16, 2019 for U.S. Appl. No. 15/419,898, 4 pages.
Stuber—Issue Fee Payment and 312 Amendment filed Dec. 27, 2019 for U.S. Appl. No. 15/419,898, 14 pages.
Stuber—U.S. Appl. No. 16/739,081, filed Jan. 9, 2020, 142 pages.
USPTO—Filing Receipt dated Nov. 21, 2019 for U.S. Appl. No. 16/673,411, 4 pages.
USPTO—Notice to File Corrected Application Papers dated Nov. 21, 2019 for U.S. Appl. No. 16/673,411, 2 pages.
Brindle—Response to Notice to File Corrected Application Papers dated Nov. 27, 2019 for U.S. Appl. No. 16/673,411, 37 pages.
USPTO—Updated Filing Receipt dated Dec. 30, 2019 for U.S. Appl. No. 16/673,411, 37 pages.
Brindle—U.S. Appl. No. 16/738,787, filed Jan. 9, 2020, 82 pages.
Brindle—312 Amendment filed Oct. 15, 2019 for U.S. Appl. No. 16/054,959, 13 pages.
Brindle—Request to Correct Inventorship filed Dec. 20, 2019 for U.S. Appl. No. 16/054,959, 17 pages.
Brindle—Issue Fee Payment filed Dec. 23, 2019 for U.S. Appl. No. 16/054,959, 3 pages.
USPTO—Acceptance of Inventorship Change dated Dec. 26, 2019 for U.S. Appl. No. 16/054,959, 1 page.
USPTO—Updated Filing Receipt dated Dec. 26, 2019 for U.S. Appl. No. 16/054,959, 4 page.
USPTO—Corrected Notice of Allowability dated Dec. 30, 2019 for U.S. Appl. No. 16/054,959, 1 page.
Brindle—Request to Correct Inventorship filed Dec. 20, 2019 for U.S. Appl. No. 16/377,114, 17 pages.
USPTO—Corrected Notice of Allowability dated Dec. 31, 2019 for U.S. Appl. No. 16/377,114, 4 pages.
USPTO—Acceptance of Correction of Inventorship dated Dec. 27, 2019 for U.S. Appl. No. 16/377,114, 1 page.
Brindle—Issue Fee Payment and 312 Amendment filed Jan. 6, 2020 for U.S. Appl. No. 16/377,114, 14 pages.
USPTO—Updated Filing Receipt dated Dec. 27, 2019 for U.S. Appl. No. 16/377,114, 4 pages.
USPTO—Office Action dated Dec. 31, 2019 for U.S. Appl. No. 16/671,967, 7 pages.
Brindle—312 Amendment filed Nov. 1, 2019 for U.S. Appl. No. 16/046,974, 19 pages.
USPTO—Corrected Notice of Allowability dated Dec. 18, 2019 for U.S. Appl. No. 16/377,026, 4 pages.
Brindle—Issue Fee Payment and 312 Amendment filed Jan. 2, 2019 for U.S. Appl. No. 16/377,026, 4 pages.
Brindle—U.S. Appl. No. 16/739,093, filed Jan. 9, 2020, 132 pages.
L&P—Reply to Communication Pursuant to Article 94(3) filed Dec. 20, 2019 for Application No. EP11153227.1, 11 pages.
USPTO—Corrected Notice of Allowability dated Jan. 21, 2010 for U.S. Appl. No. 15/419,898, 9 pages.
USPTO—Filing Receipt dated Jan. 21, 2020 for U.S. Appl. No. 16/738,787, 4 pages.
USPTO—Corrected Notice of Allowability dated Dec. 30, 2019 for U.S. Appl. No. 16/054,959, 4 page.
USPTO—Corrected Notice of Allowability dated Jan. 24, 2020 for U.S. Appl. No. 16/054,959, 11 pages.
USPTO—Corrected Notice of Allowability dated Jan. 24, 2020 for U.S. Appl. No. 16/377,114, 16 pages.
USPTO—Notice of Allowance dated Jan. 13, 2020 for U.S. Appl. No. 15/826,453, 5 pages.
USPTO—Response to Notice to File Missing Parts filed Jan. 7, 2020 for U.S. Appl. No. 16/710,998, 6 pages.
USPTO—Updated Filing Receipt dated Jan. 14, 2020 for U.S. Appl. No. 16/710,998, 4 pages.
USPTO—Notice of Missing Parts dated Jan. 31, 2020 for U.S. Appl. No. 16/739,093, 2 pages.
USPTO—Filing Receipt dated Jan. 31, 2020 for U.S. Appl. No. 16/739,093, 4 pages.
USPTO—Filing Receipt dated Jan. 31, 2020 for U.S. Appl. No. 16/679,760, 4 pages.
USPTO—Filing Receipt dated Feb. 4, 2020 for U.S. Appl. No. 16/679,760, 2 pages.
USPTO—Filing Receipt dated Jan. 31, 2020 for U.S. Appl. No. 16/739,081, 4 pages.
USPTO—Notice of Missing Parts dated Jan. 31, 2020 for U.S. Appl. No. 16/739,081, 2 pages.
USPTO—Notice of Publication dated Jan. 30, 2020 for U.S. Appl. No. 16/590,262, 1 page.
Office Communication dated Feb. 4, 2020 For U.S. Appl. No. 16/054,959, 4 pages.
USPTO—Office Action dated Jan. 30, 2020 for U.S. Appl. No. 16/673,411, 8 pages.

(56) References Cited

OTHER PUBLICATIONS

USPTO—Corrected Notice of Allowability dated Feb. 14, 2020 for U.S. Appl. No. 16/377,026, 17 pages.
USPTO—Issue Notification dated Feb. 12, 2020 for U.S. Appl. No. 16/054,959, 1 page.
USPTO—Issue Notification dated Feb. 19, 2020 for U.S. Appl. No. 16/377,114, 1 page.
Brindle—Issue Fee Payment filed Dec. 19, 2019 for U.S. Appl. No. 16/046,974, 3 pages.
USPTO—Corrected Notice of Allowability dated Dec. 23, 2019 for U.S. Appl. No. 16/046,974, 4 pages.
USPTO—Corrected Notice of Allowability dated Jan. 24, 2020 for U.S. Appl. No. 16/046,974, 11 pages.
USPTO—Non-final Office Action dated Feb. 25, 2020 for U.S. Appl. No. 16/738,343, 24 pages.
USPTO—Notice of Publication dated Feb. 27, 2020 for U.S. Appl. No. 16/671,967, 1 page.

\* cited by examiner

SWITCH CIRCUIT AND METHOD OF SWITCHING RADIO FREQUENCY SIGNALS

CROSS-REFERENCE TO RELATED APPLICATIONS—CLAIMS OF PRIORITY

This is a continuation of application Ser. No. 15/656,953, filed Jul. 21, 2017, which is a continuation of commonly owned application Ser. No. 14/883,499, filed Oct. 14, 2015, which issued on Oct. 3, 2017 as U.S. Pat. No. 9,780,778, which is a continuation of application Ser. No. 14/062,791, filed Oct. 24, 2013, which issued Dec. 29, 2015 as U.S. Pat. No. 9,225,378, which is a continuation of application Ser. No. 12/980,161, filed Dec. 28, 2010, which issued Nov. 12, 2013 as U.S. Pat. No. 8,583,111, which is a continuation of application Ser. No. 12/315,395, filed Dec. 1, 2008, which issued Dec. 28, 2010 as U.S. Pat. No. 7,860,499, which is a continuation of application Ser. No. 11/582,206, filed Oct. 16, 2006, now U.S. Pat. No. 7,460,852 issued Dec. 2, 2008, which is a continuation of application Ser. No. 10/922,135, filed Aug. 18, 2004, now U.S. Pat. No. 7,123,898 issued Oct. 17, 2006, which is a continuation of application Ser. No. 10/267,531, filed Oct. 8, 2002, now U.S. Pat. No. 6,804,502 issued Oct. 12, 2004, which claims the benefit under 35 USC 119(e) of U.S. Provisional Application No. 60/328,353, filed Oct. 10, 2001, and each of these applications and issued patents are hereby incorporated by reference herein in their entirety.

BACKGROUND

1. Field

The present disclosure relates to switches, and particularly to a switch circuit and method of switching radio frequency (RF) signals within an integrated circuit. In one embodiment, the switch circuit comprises CMOS devices implemented on a silicon-on-insulator (SOI) substrate, for use in RF applications such as wireless communications, satellites, and cable television.

2. Description of Related Art

As is well known, radio frequency (RF) switches are important building blocks in many wireless communication systems. RF switches are found in many different communications devices such as cellular telephones, wireless pagers, wireless infrastructure equipment, satellite communications equipment, and cable television equipment. As is well known, the performance of RF switches is controlled by three primary operating performance parameters: insertion loss, switch isolation, and the "1 dB compression point." These three performance parameters are tightly coupled, and any one parameter can be emphasized in the design of RF switch components at the expense of others. A fourth performance parameter that is occasionally considered in the design of RF switches is commonly referred to as the switching time or switching speed (defined as the time required to turn one side of a switch on and turn the other side off). Other characteristics that are important in RF switch design include ease and degree (or level) of integration of the RF switch, complexity, yield, return loss and cost of manufacture.

These RF switch performance parameters can be more readily described with reference to a prior art RF switch design shown in the simplified circuit schematics of FIGS. 1a-1c. FIG. 1a shows a simplified circuit diagram of a prior art single pole, single throw (SPST) RF switch 10. The prior art SPST switch 10 includes a switching transistor M1 5 and a shunting transistor M2 7. Referring now to FIG. 1a, depending upon the state of the control voltages of the two MOSFET transistors M1 5 and M2 7 (i.e., depending upon the DC bias applied to the gate inputs of the MOSFET switching and shunting transistors, M1 and M2, respectively), RF signals are either routed from an RF input node 1 to an RF output node 3, or shunted to ground through the shunting transistor M2 7. Actual values of the DC bias voltages depend upon the polarity and thresholds of the MOSFET transistors M1 5 and M2 7. Resistor R0 9, in series with the RF source signal, isolates the bias from the source signal and is essential for optimal switch performance FIG. 1b shows the "on" state of the RF switch 10 of FIG. 1a (i.e., FIG. 1b shows the equivalent small-signal values of the transistors M1 and M2 when the RF switch 10 is "on", with switching transistor M1 5 on, and shunting transistor M2 7 off). FIG. 1c shows the "off" state of the switch 10 of FIG. 1a (i.e., FIG. 1c shows the equivalent small-signal values of the transistors M1 and M2 when the RF switch 10 is "off", with switching transistor M1 5 off, and shunting transistor M2 7 on).

As shown in FIG. 1b, when the RF switch 10 is on, the switching transistor M1 5 is primarily resistive while the shunting transistor M2 7 is primarily capacitive. The "insertion loss" of the RF switch 10 is determined from the difference between the maximum available power at the input node 1 and the power that is delivered to a load 11 at the output node 3. At low frequencies, any power lost is due to the finite on resistance "r" 13 of the switching transistor M1 5 when the switch 10 is on (see FIG. 1b). The on resistance r 13 (FIG. 1b) typically is much less than the source resistor R0 9. The insertion loss, "IL", can therefore be characterized in accordance with Equation 1 shown below:

IL is approximately equal to: $10r/R0 \ln(10) = 0.087 \, r$ (in dB).        Equation 1

Thus, at low frequencies, a 3-$\Omega$ value for r results in approximately 0.25 dB insertion loss.

Because insertion loss depends greatly upon the on resistances of the RF switch transmitters, lowering the transistor on resistances and reducing the parasitic substrate resistances can achieve improvements in insertion loss.

In general, the input-to-output isolation (or more simply, the switch isolation) of an RF switch is determined by measuring the amount of power that "bleeds" from the input port into the output port when the transistor connecting the two ports is off. The isolation characteristic measures how well the RF switch turns off (i.e., how well the switch blocks the input signal from the output). More specifically, and referring now to the "off" state of the RF switch 10 of FIG. 1c, the switching transistor M1 5 off state acts to block the input 1 from the output 3. The shunting transistor M2 7 also serves to increase the input-to-output isolation of the switch 10.

When turned off (i.e., when the RF switch 10 and the switching transistor M1 5 are turned off), M1 5 is primarily capacitive with "feedthrough" (i.e., passing of the RF input signal from the input node 1 to the output node 3) of the input signal determined by the series/parallel values of the capacitors CGD off 15 (Gate-to-Drain Capacitance when the switching transistor M1 is turned off), CGS off 17 (Gate-to-Source Capacitance when the switching transistor M1 is turned off), and CDS1 19 (Drain-to-Source capacitance when the transistor M1 is turned off). Feedthrough of the input signal is undesirable and is directly related to the input-to-output isolation of the RF switch 10. The shunting transistor M2 7 is used to reduce the magnitude of the feedthrough and thereby increase the isolation characteristic of the RF switch.

The shunting transistor M2 7 of FIG. 1c is turned on when the switching transistor M1 5 is turned off. In this condition, the shunting transistor M2 7 acts primarily as a resistor having a value of r. By design, the value of r is much less than the characteristic impedance of the RF source. Consequently, r greatly reduces the voltage at the input of the switching transistor M1 5. When the value of r is much less than the source resistance R0 9 and the feedthrough capacitive resistance of the shunting transistor M2 7, isolation is easily calculated. Switch isolation for the off state of the RF switch 10 is determined as the difference between the maximum available power at the input to the power at the output.

In addition to RF switch insertion loss and isolation, another important RF switch performance characteristic is the ability to handle large input power when the switch is turned on to ensure that insertion loss is not a function of power at a fixed frequency. Many applications require that the switch does not distort power transmitted through a "switched-on" switch. For example, if two closely spaced tones are concurrently passed through an RF switch, non-linearities in the switch can produce inter-modulation (IM) and can thereby create a false tone in adjacent channels. If these adjacent channels are reserved, for instance, for information signals, power in these false tones must be maintained as small as possible. The switch compression, or "1 dB compression point" ("P1 dB"), is indicative of the switch's ability to handle power. The P1 dB is defined as the input power at which the insertion loss has increased by 1 dB from its low-power value. Or stated in another way, the 1 dB compression point is a measure of the amount of power that can be input to the RF switch at the input port before the output power deviates from a linear relationship with the input power by 1 dB.

Switch compression occurs in one of two ways. To understand how switch compression occurs, operation of the MOSFET transistors shown in the RF switch 10 of FIGS. 1a-1c are described. As is well known in the transistor design arts, MOSFETs require a gate-to-source bias that exceeds a threshold voltage, $V_t$, to turn on. Similarly, the gate-to-source bias must be less than $V_t$ for the switch to be off. $V_t$ is positive for "type-N" MOSFETs and negative for "type-P" MOSFETs. Type-N MOSFETs were chosen for the RF switch 10 of FIGS. 1a-1c. The source of a type-N MOSFET is the node with the lowest potential.

Referring again to FIG. 1c, if a transient voltage on the shunting transistor M2 7 results in turning on the shunting transistor M2 7 during part of an input signal cycle, input power will be routed to ground and lost to the output. This loss of power increases for increased input power (i.e., input signals of increased power), and thereby causes a first type of compression. The 1 dB compression point in the RF switch 10 is determined by the signal swing on the input at which point the turned-off shunting transistor M2 7 is unable to remain off. Eventually, a negative swing of the input falls below the potential of the M2 gate, as well as below ground (thus becoming the source). When this difference becomes equal to $V_t$, the transistor M2 7 begins to turn on and compression begins. This first type of compression is caused by the phenomenon of the turning on of a normally off gate in the shunt leg of the RF switch. Once the shunting transistor M2 7 turns on, power at the output node 3 no longer follows power at the switch input in a linear manner. A second type of RF switch compression occurs when the source and drain of the shunting transistor M2 7 break down at excessive voltages. For submicron silicon-on-insulator (SOI) devices, this voltage may be approximately only +1 VDC above the supply voltage. At breakdown, the shunt device begins to heavily conduct current thereby reducing the power available at the output.

FIG. 2 shows a simplified schematic of a prior art single pole double throw (SPDT) RF switch 20. As shown in FIG. 2, the prior art RF switch 20 minimally includes four MOSFET transistors 23, 24, 27 and 28. The transistors 23 and 24 act as "pass" or "switching" transistors (similar to the switching MOSFET transistor M1 5 of FIGS. 1a-1c), and are configured to alternatively couple their associated and respective RF input nodes to a common RF node 25. For example, when enabled (or switched "on"), the switching transistor 23 couples a first RF input signal "$RF_1$", input to a first RF input node 21, to the RF common node 25. Similarly, when enabled, the switching transistor 24 couples a second RF input signal "$RF_2$", input to a second RF input node 22, to the RF common node 25. The shunting transistors, 27 and 28, when enabled, act to alternatively shunt their associated and respective RF input nodes to ground when their associated RF input nodes are uncoupled from the RF common node 25 (i.e., when the switching transistor (23 or 24) connected to the associated input node is turned off).

As shown in FIG. 2, two control voltages are used to control the operation of the prior art RF switch. The control voltages, labeled "SW", and its inverse "SW_", control the operation of the transistors 23, 24, 27 and 28. The control voltages are arranged to alternatively enable (turn on) and disable (turn off) selective transistor pairs. For example, as shown in FIG. 2, when SW is on (in some embodiments this is determined by the control voltage SW being set to a logical "high" voltage level, e.g., "+Vdd"), the switching transistor 23 is enabled, and its associated shunting transistor 28 is also enabled. However, because the inverse of SW, SW_, controls the operation of the second switching transistor 24, and its associated shunting transistor 27, and the control signal SW_ is off during the time period that SW is on (in some embodiments this is determined by SW_ being set to a −Vdd value), those two transistors are disabled, or turned off, during this same time period. In this state (SW "on" and SW_ "off"), the $RF_1$ input signal is coupled to the RF common port 25 (through the enabled switching transistor 23). Because the second switching transistor 24 is turned off, the $RF_2$ input signal is blocked from the RF common port 25. Moreover, the $RF_2$ input signal is further isolated from the RF common port 25 because it is shunted to ground through the enabled shunting transistor 28. As those skilled in the transistor designs arts shall easily recognize, the $RF_2$ signal is coupled to the RF common port 25 (and the $RF_1$ signal is blocked and shunted to ground) in a similar manner when the SW control signal is "off" (and SW_ is "on").

With varying performance results, RF switches, such as the SPDT RF switch 20 of FIG. 2, have heretofore been implemented in different component technologies, including bulk complementary-metal-oxide-semiconductor (CMOS) and gallium-arsenide (GaAs) technologies. In fact, most high performance high-frequency switches use GaAs technology. The prior art RF switch implementations attempt to improve the RF switch performance characteristics described above, however, they do so with mixed results and with varying degrees of integrated circuit complexity and yields. For example, bulk CMOS RF switches disadvantageously exhibit high insertion loss, low compression, and poor linearity performance characteristics. In contrast, due to the semi-insulating nature of GaAs material, parasitic substrate resistances can be greatly reduced thereby reducing RF switch insertion loss. Similarly, the semi-insulating GaAs substrate improves switch isolation.

Although GaAs RF switch implementations offer improved performance characteristics, the technology has several disadvantages. For example, GaAs technology exhibits relatively low yields of properly functioning integrated circuits. GaAs RF switches tend to be relatively expensive to design and manufacture. In addition, although GaAs switches exhibit improved insertion loss characteristics as described above, they may have low frequency limitations due to slow states present in the GaAs substrate. The technology also does not lend itself to high levels of integration, which requires that digital control circuitry associated with the RF switch be implemented "off chip" from the switch. The low power control circuitry associated with the switch has proven difficult to integrate. This is disadvantageous as it both increases the overall system cost or manufacture, size and complexity, as well as reducing system throughput speeds.

It is therefore desirable to provide an RF switch and method for switching RF signals having improved performance characteristics. Specifically, it is desirable to provide an RF switch having improved insertion loss, isolation, and compression. It is desirable that such an RF switch be easily designed and manufactured, relatively inexpensive to manufacture, lend itself to high levels of integration, with low-to-high frequency application. Power control circuitry should be easily integrated on-chip together with the switch functions. Such integration has been heretofore difficult to achieve using Si and GaAs substrates. The present teachings provide such an RF switch and method for switching RF signals.

SUMMARY

A novel RF switch circuit and method for switching RF signals is described. The RF switch circuit may be used in wireless applications, and may be fabricated in a silicon-on-insulator technology. In one embodiment the RF switch is fabricated on an Ultra-Thin-Silicon ("UTSi") substrate. In one embodiment the RF switch includes: an input for receiving an RF signal; a first switching transistor grouping connected to the input to receive the RF signal and connected to an RF common port, wherein the first switching transistor is controlled by a switching voltage (SW); a second switching transistor grouping connected to the first switching transistor grouping and the RF common port, wherein the second switching transistor is controlled by a switching voltage $SW\_$, and wherein $SW\_$ is the inverse of SW so that when the first switching transistor grouping is on, the second switching transistor grouping is off. The switching transistor groupings, when enabled, alternatively connect their respective RF input signals to the RF common port. In this embodiment the RF switch also includes shunting transistor groupings coupled to the switching transistor groupings and also controlled by the switching voltages SW and $SW\_$. The shunting transistor groupings, when enabled, act to alternatively shunt their associated RF input nodes to ground thereby improving RF switch isolation.

The switching and shunting transistor groupings comprise one or more MOSFET transistors connected together in a "stacked" or serial configuration. Within each transistor grouping, the gates of the stacked transistors are commonly controlled by a switching voltage (SW or $SW\_$) that is coupled to each transistor gate through respective gate resistors. The stacking of transistor grouping devices and gate resistors increases the compression point of the switch. The RC time constant formed by the gate resistors and the gate capacitance of the MOSFETs is designed to be much longer than the period of the RF signal, causing the RF voltage to be shared equally across the series connected devices. This configuration increases the 1 dB compression point of the RF switch.

A fully integrated RF switch is described that includes digital switch control logic and a negative power supply voltage generator circuit integrated together with the inventive RF switch. In one embodiment, the fully integrated RF switch provides several functions not present in prior art RF switches. For example, in one embodiment, the fully integrated RF switch includes a built-in oscillator that provides clocking input signals to a charge pump circuit, an integrated charge pump circuit that generates the negative power supply voltages required by the other RF switch circuits, CMOS logic circuitry that generates control signals to control the RF switch transistors, level-shifting and low current voltage divider circuits that provide increased reliability of the switch devices, and an RF buffer circuit that isolates RF signal energy from the charge pump and digital control logic circuits. Several embodiments of the charge pump, level shifting, voltage divider, and RF buffer circuits are described. The inventive RF switch provides improvements in insertion loss, switch isolation, and switch compression. In addition, owing to the higher levels of integration made available by the present inventive RF switch, RF system design and fabrication costs are reduced and reliability is increased using the present method and apparatus.

BRIEF DESCRIPTION OF THE DRAWINGS

FIG. 6b is an electrical schematic of one embodiment of the inverters used to implement the level shifter shown in FIG. 6a.

FIG. 7a is a voltage amplitude versus time plot of a digital input signal and corresponding output signal generated by the inventive level shifter of FIG. 6a; FIG. 7b is a simplified logic symbol for the inventive level shifter of FIG. 6a.

FIG. 8b is a simplified block diagram of the digital control input and interface to the RF buffer circuit of FIG. 8a.

FIG. 9a is an electrical schematic of one embodiment of a low current voltage divider (LCVD) circuit made in accordance with the present RF switch method and apparatus; FIG. 9b is a simplified logic symbol used to represent the voltage divider of FIG. 9a.

FIG. 10 is an electrical schematic of a second embodiment of a level shifting circuit using the low current voltage divider circuit of FIG. 9a in combination with the level shifting circuit of FIG. 6a.

FIGS. 11a and 11b are electrical schematics showing an alternative embodiment of the two-stage level shifter and RF buffer circuit of FIG. 8a.

Like reference numbers and designations in the various drawings indicate like elements.

DETAILED DESCRIPTION

Throughout this description, the preferred embodiment and examples shown should be considered as exemplars, rather than as limitations on the present method and apparatus.

The Inventive RF Switch

Figure 3:
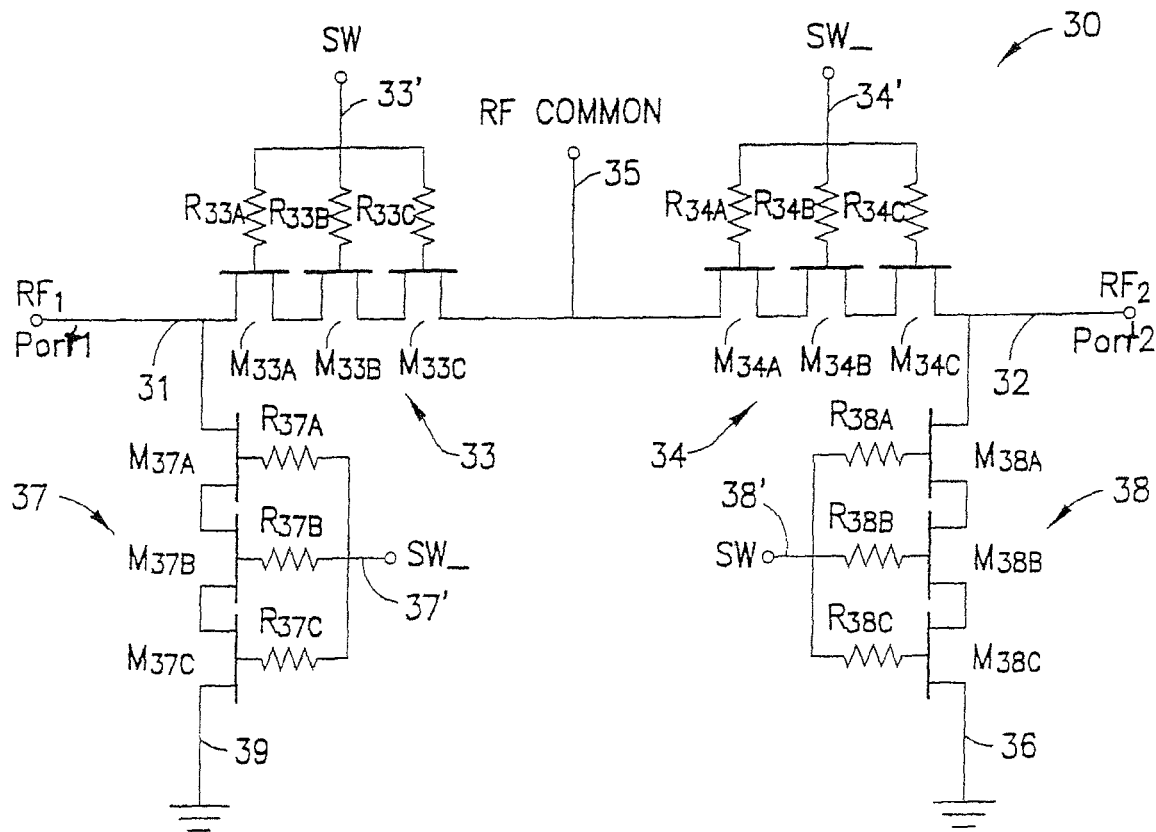
FIG. 3 is an electrical schematic of an RF switch according to one embodiment of the present method and apparatus.

The present method and apparatus is a novel RF switch design and method for switching RF circuits. A first exemplary embodiment of the present inventive RF switch 30 is shown in FIG. 3. As shown in FIG. 3, in one embodiment, the inventive RF switch 30 includes four clusters or "groupings" of MOSFET transistors, identified in FIG. 3 as transistor groupings 33, 34, 37 and 38. Two transistor groupings comprise "pass" or "switching" transistor groupings 33 and 34, and two transistor groupings comprise shunting transistor groupings 37 and 38. Each transistor grouping includes one or more MOSFET transistors arranged in a serial configuration. For example, in the embodiment shown in FIG. 3, the switching grouping 33 includes three switching transistors, $M_{33A}$, $M_{33B}$, and $M_{33C}$. Similarly, the switching grouping 34 includes three switching transistors, $M_{34A}$, $M_{34B}$, and $M_{34C}$. The shunting grouping 37 includes three transistors $M_{37A}$, $M_{37B}$, and $M_{37C}$. Similarly, the shunting grouping 38 includes three transistors, $M_{38A}$, $M_{38B}$, and $M_{38C}$. Although the transistor groupings 33, 34, 37 and 38 are shown in FIG. 3 as comprising three MOSFET transistors, those skilled in the RF switch design arts shall recognize that alternative grouping configurations can be used without departing from the scope or spirit of the present method and apparatus. For example, as described below in more detail, any convenient number of transistors can be used to implement the groupings shown in FIG. 3 without departing from the scope of the present method and apparatus.

In one embodiment of the present inventive RF switch, the MOSFET transistors (e.g., the transistors $M_{37A}$, $M_{37B}$, and $M_{37C}$) are implemented using a fully insulating substrate silicon-on-insulator (SOI) technology. More specifically, and as described in more detail hereinbelow, the MOSFET transistors of the inventive RF switch are implemented using "Ultra-Thin-Silicon (UTSi)" (also referred to herein as "ultrathin silicon-on-sapphire") technology. In accordance with UTSi manufacturing methods, the transistors used to implement the inventive RF switch are formed in an extremely thin layer of silicon in an insulating sapphire wafer. The fully insulating sapphire substrate enhances the performance characteristics of the inventive RF switch by reducing the deleterious substrate coupling effects associated with non-insulating and partially insulating substrates. For example, improvements in insertion loss are realized by lowering the transistor on resistances and by reducing parasitic substrate resistances. In addition, switch isolation is improved using the fully insulating substrates provided by UTSi technology. Owing to the fully insulating nature of silicon-on-sapphire technology, the parasitic capacitance between the nodes of the RF switch 30 is greatly reduced as compared with bulk CMOS and other traditional integrated circuit manufacturing technologies. Consequently, the inventive RF switch exhibits improved switch isolation as compared with the prior art RF switch designs.

As shown in FIG. 3, similar to the switch described above with reference to FIG. 2, the transistor groupings are controlled by two control signals, SW, and its inverse, SW_. The control signals are coupled to the gates of their respective transistors through associated and respective gate resistors. For example, the control signal SW controls the operation of the three transistors in the switching transistor grouping 33 ($M_{33A}$, $M_{33B}$, and $M_{33C}$) through three associated and respective gate resistors ($R_{33A}$, $R_{33B}$, and $R_{33C}$, respectively). The control signal SW is input to an input node 33' to control the switching transistor grouping 33. SW is also input to an input node 38' to control the shunting transistor grouping 38. Similarly, the inverse of SW, SW_, controls the switching transistor grouping 34 via an input node 34'. SW_ is also input to an input node 37' to control the shunting transistor grouping 37.

In one embodiment, the transistor grouping resistors comprise approximately 30 K ohm resistors, although alternative resistance values can be used without departing from the spirit or scope of the present method and apparatus. In addition, in some embodiments of the present method and apparatus, the gate resistors comprise any resistive element having a relatively high resistance value. For example, reversed-biased diodes may be used to implement the gate resistors in one embodiment. As described in more detail below, the gate resistors help to increase the effective breakdown voltage across the series connected transistors.

Figure 1A:
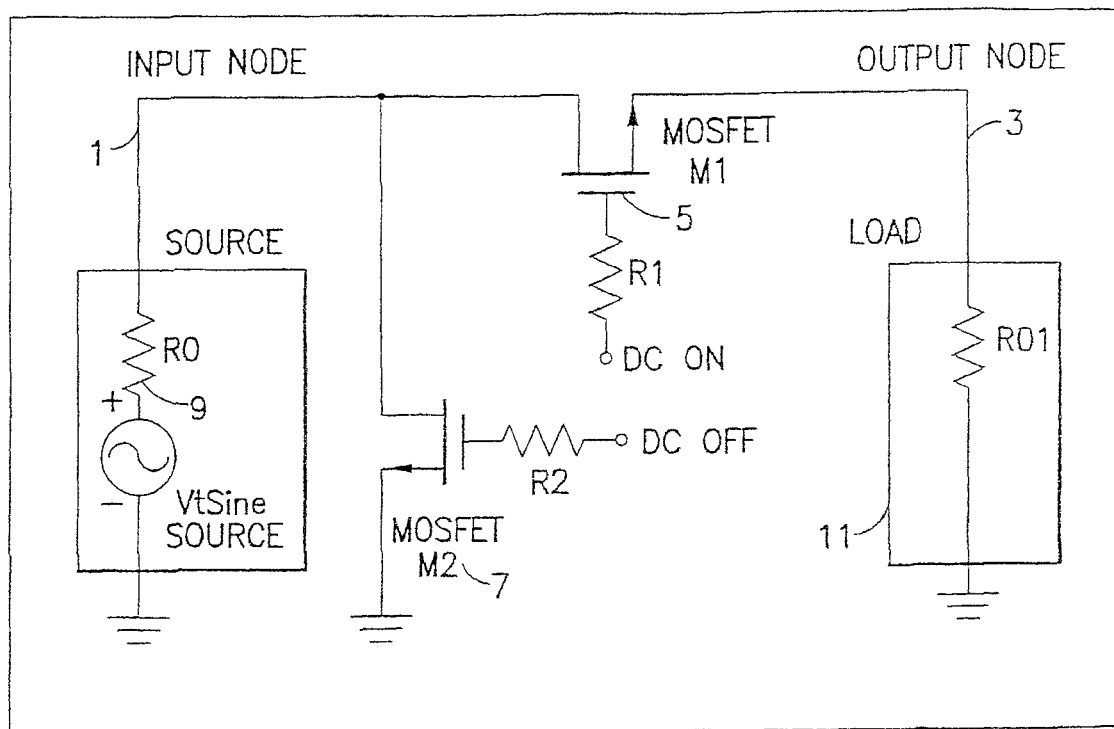
FIG. 1a is a simplified electrical schematic of a prior art single pole, single throw (SPST) RF switch used to demonstrate performance characteristics of the RF switch.
Figure 1B:
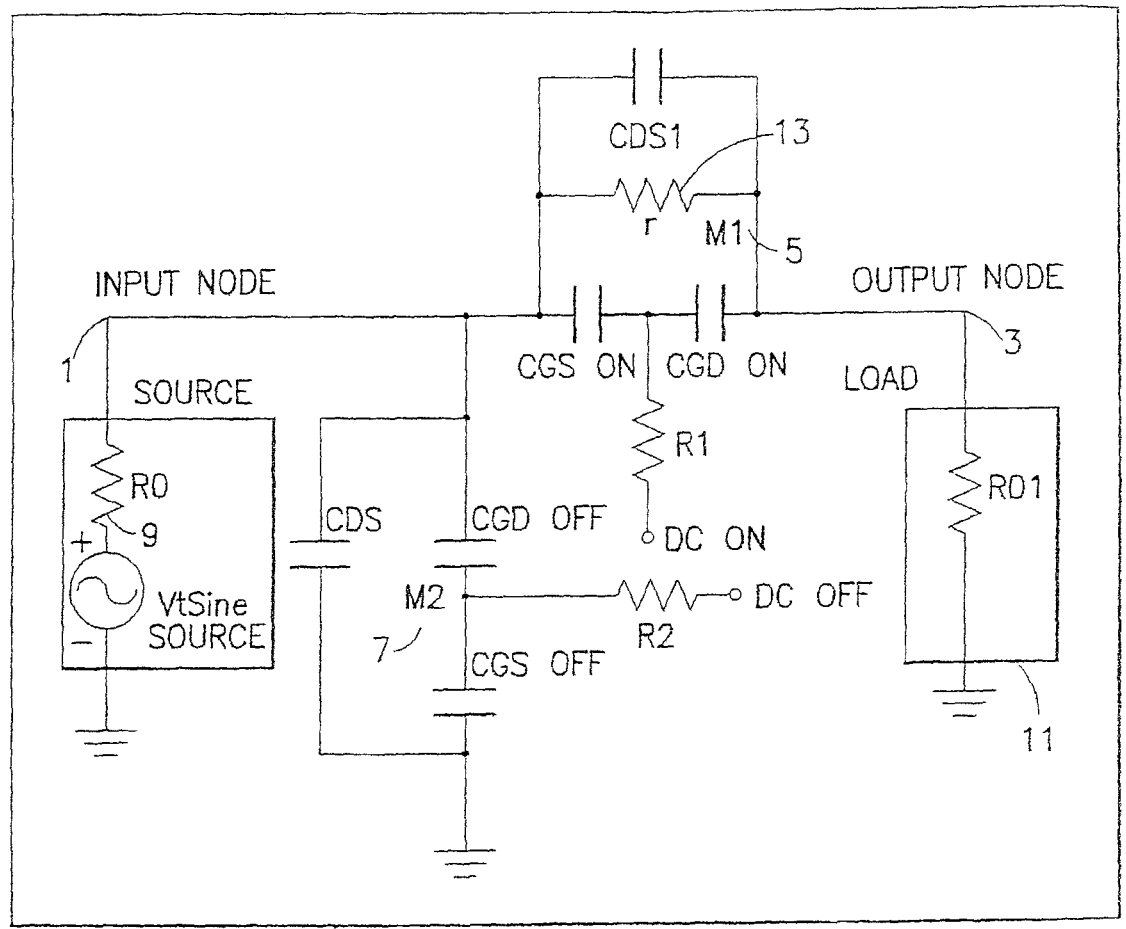
FIG. 1b is a simplified electrical schematic of the SPST RF switch of FIG. 1a showing the dominant characteristics of the switch when the switch is turned "on" allowing the RF signal to pass from an input node to an output node.
Figure 1C:
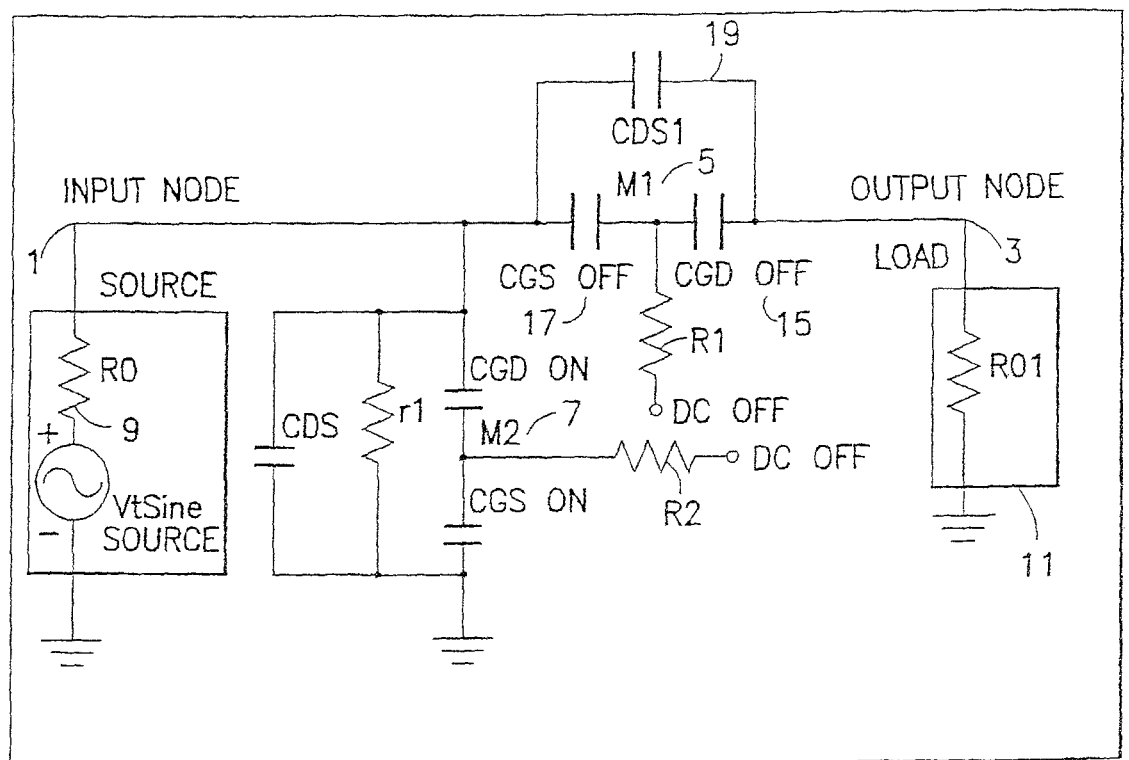
FIG. 1c shows the equivalent small-signal electrical characteristics of the RF switch of FIGS. 1a and 1b when the RF switch is turned "off" thereby blocking the RF signal from the output node.
Figure 2:
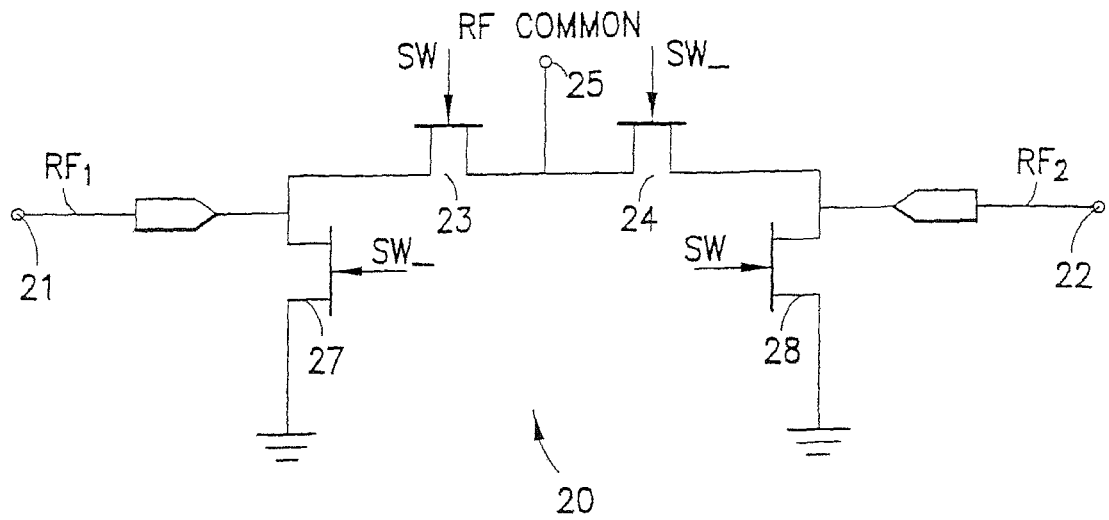
FIG. 2 is a simplified electrical schematic of a prior art single pole double throw (SPDT) RF switch.

The control signals function to control the enabling and disabling of the transistor groupings 33, 34, 37 and 38, and the RF switch 30 generally functions to pass and block RF signals in a manner that is similar to the control of the analogous transistors of the switch of FIG. 2. More specifically, the switching transistor groupings 33 and 34 act as pass or switching transistors, and are configured to alternatively couple their associated and respective RF input nodes to a common RF node 35. For example, when enabled, the switching transistor grouping 33 couples a first RF input signal "RF$_1$", input to a first RF input node 31, to the RF common node 35. Similarly, when enabled, the switching transistor grouping 34 couples a second RF input signal "RF$_2$", input to a second RF input node 32, to the RF common node 35. The shunting transistor groupings, 37 and 38, when enabled, act to alternatively shunt their associated and respective RF input nodes to ground when their associated RF input nodes are uncoupled from the RF common node 35 (i.e., when the switching transistor grouping (33 or 34) that is connected to the associated input node is turned off).

The control voltages are connected to alternatively enable and disable selective pairs of transistor groupings. For example, as shown in FIG. 3, when SW is on (in some embodiments this is determined when the control voltage SW is set to a logical "high" voltage level), the switching transistor grouping 33 is enabled (i.e., all of the transistors in the grouping 33 are turned on), and its associated shunting transistor grouping 38 is also enabled (i.e., all of the transistors in the grouping 38 are turned on). However, similar to the operation of the switch of FIG. 2, because the inverse of SW, SW_, controls the operation of the second switching transistor grouping 34, and its associated shunting transistor grouping 37, these two transistors groupings are disabled (i.e., all of the transistors in the groupings 34, 37 are turned off) during this time period. Therefore, with SW on, the $RF_1$ input signal is coupled to the RF common port 35. The $RF_2$ input signal is blocked from the RF common port 35 because the switching transistor grouping 34 is off. The $RF_2$ input signal is further isolated from the RF common port 35 because it is shunted to ground through the enabled shunting transistor grouping 38. As those skilled in the RF switch design arts shall recognize, the $RF_2$ signal is coupled to the RF common port 35 (and the $RF_1$ signal is blocked and shunted to ground) in a similar manner when the SW control signal is off (and the SW_ control signal is on).

One purpose of the stacking of MOSFET transistors and using gate resistors as shown in the inventive RF switch 30 of FIG. 3 is to increase the breakdown voltage across the series connected transistors. The RC time constant formed by the gate resistor and the gate capacitance of the MOSFETs is designed to be much longer than the period of the RF signal. Thus, very little RF energy is dissipated through the gate resistor. This arrangement effectively causes the RF voltage to be shared equally across the series connected transistors. The net effect is that the breakdown voltage across the series connected devices is increased to n times the breakdown voltage of an individual FET, where n is the number of transistors connected in series. This configuration increases the 1 dB compression point of the inventive RF switch 30.

To achieve improved switch performance, the RC time constant must be sized so that it is large with respect to the period of the RF signal. This largely places a constraint on the minimum value of R that can be used to implement the gate transistors. As noted above, in one embodiment of the present method and apparatus, a typical value of R is 30 k-ohms, although other resistance values can be used without departing from the scope of the present method and apparatus. Because a MOSFET gate input draws no DC current, there is no change in the biasing of the devices due to IR drops across this resistance.

Advantageously, the present inventive RF switch 30 can accommodate input signals of increased power levels. Owing to the serial arrangement of the MOSFET transistors that comprise the transistor groupings (33, 34, 37 and 38), increased power signals can be presented at the RF input nodes (i.e., at the input nodes 31 and 32) without detrimentally affecting switch operation. Those skilled in the transistor design arts art shall recognize that greater input power levels can be accommodated by increasing the number of transistors per transistor grouping, or by varying the physical configuration of the transistors. For example, in one embodiment, the transistors are approximately 0.5×2,100 micro-meters in dimension. However, alternative configurations can be used without departing from the scope or spirit of the present method and apparatus.

Silicon-on-Insulator (SOI) Technologies

As noted above in the description of the RF switch of FIG. 3, SOI technology is attractive in implementing RF switches due to the fully insulating nature of the insulator substrate. As is well known, SOI has been used in the implementation of high performance microelectronic devices, primarily in applications requiring radiation hardness and high speed operation. SOI technologies include, for example, SIMOX, bonded wafers having a thin silicon layer bonded to an insulating layer, and silicon-on-sapphire. In order to achieve the desired switch performance characteristics described above, in one embodiment, the inventive RF switch is fabricated on a sapphire substrate.

Fabrication of devices on an insulating substrate requires that an effective method for forming silicon CMOS devices on the insulating substrate be used. The advantages of using a composite substrate comprising a monocrystalline semiconductor layer, such as silicon, epitaxially deposited on a supporting insulating substrate, such as sapphire, are well-recognized, and can be realized by employing as the substrate an insulating material, such as sapphire ($Al_2O_3$), spinel, or other known highly insulating materials, and providing that the conduction path of any inter-device leakage current must pass through the substrate.

An "ideal" silicon-on-insulator wafer can be defined to include a completely monocrystalline, defect-free silicon layer of sufficient thickness to accommodate the fabrication of active devices therein. The silicon layer would be adjacent to an insulating substrate and would have a minimum of crystal lattice discontinuities at the silicon-insulator interface. Early attempts to fabricate this "ideal" silicon-on-insulator wafer were frustrated by a number of significant problems, which can be summarized as (1) substantial incursion of contaminants into the epitaxially deposited silicon layer, especially the p-dopant aluminum, as a consequence of the high temperatures used in the initial epitaxial silicon deposition and the subsequent annealing of the silicon layer to reduce defects therein; and (2) poor crystalline quality of the epitaxial silicon layers when the problematic high temperatures were avoided or worked around through various implanting, annealing, and/or re-growth schemes.

It has been found that the high quality silicon films suitable for demanding device applications can be fabricated on sapphire substrates by a method that involves epitaxial deposition of a silicon layer on a sapphire substrate, low temperature ion implant to form a buried amorphous region in the silicon layer, and annealing the composite at temperatures below about 950° C.

Examples of and methods for making such silicon-on-sapphire devices are described in U.S. Pat. No. 5,416,043 ("Minimum charge FET fabricated on an ultrathin silicon on sapphire wafer"); U.S. Pat. No. 5,492,857 ("High-frequency wireless communication system on a single ultrathin silicon on sapphire chip"); U.S. Pat. No. 5,572,040 ("High-frequency wireless communication system on a single ultrathin silicon on sapphire chip"); U.S. Pat. No. 5,596,205 ("High-frequency wireless communication system on a single ultrathin silicon on sapphire chip"); U.S. Pat. No. 5,600,169 ("Minimum charge FET fabricated on an ultrathin silicon on sapphire wafer"); U.S. Pat. No. 5,663,570 ("High-frequency wireless communication system on a single ultrathin silicon on sapphire chip"); U.S. Pat. No. 5,861,336 ("High-frequency wireless communication system on a single ultrathin silicon on sapphire chip"); U.S. Pat. No. 5,863,823 ("Selfaligned edge control in silicon on insulator"); U.S. Pat. No. 5,883,396 ("High-frequency wireless communication system on a single ultrathin silicon on sapphire chip"); U.S. Pat. No. 5,895,957 ("Minimum charge FET fabricated on an ultrathin silicon on sapphire wafer"); U.S. Pat. No. 5,920,233 ("Phase locked loop including a sampling circuit for reducing spurious side bands"); U.S. Pat. No. 5,930,638 ("Method of making a low parasitic resistor on ultrathin silicon on insulator"); U.S. Pat. No. 5,973,363 ("CMOS circuitry with shortened P-channel length on ultrathin silicon on insulator"); U.S. Pat. No. 5,973,382 ("Capacitor on ultrathin semiconductor on insulator"); and U.S. Pat. No. 6,057,555 ("High-frequency wireless communication system on a single ultrathin silicon on sapphire chip"). All of these referenced patents are incorporated herein in their entirety for their teachings on ultrathin silicon-on-sapphire integrated circuit design and fabrication.

Using the methods described in the patents referenced above, electronic devices can be formed in an extremely thin layer of silicon on an insulating synthetic sapphire wafer. The thickness of the silicon layer is typically less than 150 nm. Such an "ultrathin" silicon layer maximizes the advantages of the insulating sapphire substrate and allows the integration of multiple functions on a single integrated circuit. Traditional transistor isolation wells required for thick silicon are unnecessary, simplifying transistor processing and increasing circuit density. To distinguish these above-referenced methods and devices from earlier thick-silicon embodiments, they are herein referred to collectively as "ultrathin silicon-on-sapphire."

In some preferred embodiments of the method and apparatus, the MOS transistors are formed in ultrathin silicon-on-sapphire wafers by the methods disclosed in U.S. Pat. Nos. 5,416,043; 5,492,857; 5,572,040; 5,596,205; 5,600,169; 5,663,570; 5,861,336; 5,863,823; 5,883,396; 5,895,957; 5,920,233; 5,930,638; 5,973,363; 5,973,382; and 6,057,555. However, other known methods of fabricating ultrathin silicon-on-sapphire integrated circuits can be used without departing from the spirit or scope of the present method and apparatus.

As described and claimed in these patents, high quality silicon films suitable for demanding device applications can be fabricated on insulating substrates by a method that involves epitaxial deposition of a silicon layer on an insulating substrate, low temperature ion implantation to form a buried amorphous region in the silicon layer, and annealing the composite at temperatures below about 950° C. Any processing of the silicon layer which subjects it to temperatures in excess of approximately 950° C. is performed in an oxidizing ambient environment. The thin silicon films in which the transistors are formed typically have an areal density of electrically active states in regions not intentionally doped which is less than approximately $5. \times 10^{11}$ cm$^{-2}$.

As noted above, UTSi substrates are especially desirable for RF applications because the fully insulating substrate reduces the detrimental effects of substrate coupling associated with traditional substrates (i.e., substrates that are not fully insulating). Consequently, in one embodiment, the RF switch 30 of FIG. 3 is fabricated on an UTSi substrate.

RF Switch Design Tradeoffs

Several design parameters and tradeoffs should be considered in designing and implementing the inventive RF switch 30 described above with reference to FIG. 3. The inventive RF switch can be tailored to meet or exceed desired system design requirements and RF switch performance objectives. The design tradeoffs and considerations that impact the inventive RF switch design are now described.

As described above with reference to FIG. 3, the RF switch 30 is implemented using MOSFET transistors, which may be "N-type" or "P-type". However, N channel transistors are preferred for RF switches implemented in CMOS technology. N channel transistors are preferred because, for a given transistor size, the "on" resistance of an N channel transistor is much lower than for a P channel transistor due to the higher mobility in silicon of electrons versus holes. The control voltages are selected to insure that the on resistance of the "on" transistor is reduced. The control voltages are also selected to insure that the "off" transistor remains off when disabled.

As is well known in the transistor design arts, in an N channel MOS transistor, the "on" resistance is inversely proportional to the difference between the voltage applied at the transistor gate and the voltage applied at the transistor source. This voltage is commonly referred to as the "Vgs" (gate-to-source voltage). It is readily observed that as the magnitude of the RF signal (Vs) increases at the input port (e.g., at the first RF input node 31 of FIG. 3), and hence at the RF common port 35, the Vgs of the on transistors decrease (e.g., the Vgs of the transistor M33$_A$ in the switching transistor grouping 33 decreases as the magnitude of the RF 1 signal increases). This argues for making the gate control voltage (e.g., SW at the input node 33') as positive as possible. Unfortunately, reliability concerns limit the extent to which the gate control voltage can be made positive.

A similar concern exists for the "off" transistors. It is important to note that for typical RF switch applications, the RF input signals (e.g., the RF 1 input signal) generally swing about a zero reference voltage. The off transistors (e.g., the transistors in the shunting transistor grouping 37) must remain disabled or turned off during both the positive and negative voltage excursions of the RF input signal. This argues for making the gate control voltage of the off transistors (e.g., the SW_ control voltage signal) as negative as possible. Again, reliability concerns limit the extent to which this gate control voltage can be made negative.

For a CMOS switch, the design of the off transistor also limits the 1 dB compression point of the switch. As is well known in the transistor design arts, MOS transistors have a fundamental breakdown voltage between their source and drain. When the potential across the device exceeds this breakdown voltage, a high current flows between source and drain even when a gate potential exists that is attempting to keep the transistor in an off state. Improvements in switch compression can be achieved by increasing the breakdown voltage of the transistors. One method of fabricating a MOS transistor with a high breakdown voltage is to increase the length of the gate. Unfortunately, an increase in gate length also disadvantageously increases the channel resistance of the device thereby increasing the insertion loss of the device. The channel resistance can be decreased by making the device wider; however, this also decreases the switch isolation. Hence, tradeoffs exist in MOS switch designs.

As described above with reference to the inventive RF switch 30 of FIG. 3, the transistors are stacked in a series configuration to improve the switch 1 dB compression point. The relatively high value gate resistors, in combination with the stacking configuration of the transistors in the transistor groupings, increase the effective breakdown voltage across the series connected transistors. The switch elements are designed and fabricated such that the RC time constant (determined by the resistance values of the gate resistors and the gate capacitance of the MOSFETs) is much longer than the period of the RF signal processed by the RF switch 30. As noted above, the net effect of the stacking configuration and the relatively high resistance gate resistors is to increase the breakdown voltage across the series connected transistors by a factor of n times the breakdown voltage of an individual transistor (where n equals the number of transistors connected in series in a transistor grouping).

An additional design consideration concerns the "body tie" used in traditional bulk CMOS transistors. As is well known in the transistor design arts, the body tie electrically couples the device either to the well or to the substrate. The well-substrate junction must remain reversed biased at all times. The source-to-body and drain-to-body junctions must remain reversed biased at all times. In general, for bulk CMOS designs, the well (for N-well technology) is tied to the most positive potential that will be applied to the circuit. The substrate (for P-well technology) is tied to the most negative potential that will be applied to the circuit. Because the RF input signal swings symmetrically above and below ground, bulk CMOS switch designs exhibit poor insertion loss, isolation, and 1 dB compression point performance. For these reasons, and those described above, the present RF switch 30 is preferably implemented on an insulating substrate.

Implementing the inventive RF switch on an insulating substrate provides several advantages such as improved switch isolation and reduced insertion loss. Further advantages are achieved by implementing the inventive RF switch using UTSi technology. For example, as compared with the prior art RF switch implementations in GaAs, improvements in integrated circuit yields, reduced fabrication costs, and increased levels of integration are achieved using UTSi. As is well known in the integrated circuit design arts, GaAs does not lend itself to high levels of integration. Thus, the digital control circuitry and other circuitry associated with the operation and function of the RF switch (such as a negative voltage power supply generator, level shifting, low current voltage divider and RF buffer circuits) must often be implemented off-chip (i.e., these functions are not easily integrated with the RF switch). This leads to increased costs and reduced performance of the prior art RF switch implementations.

In contrast, in accordance with the present RF switch method and apparatus, using UTSi technology, the circuitry necessary for the proper operation and functioning of the RF switch can be integrated together on the same integrated circuit as the switch itself. For example, and as described below in more detail, by implementing the RF switch in UTSi technology, the RF switch can be integrated in the same integrated circuit with a negative voltage generator and the CMOS control logic circuitry required to control the operation of the RF switch. The complexity of the RF switch is also reduced owing to the reduction in control lines required to control the operation of the switch. Advantageously, the RF switch control logic can be implemented using low voltage CMOS transistors. In addition, even for high power RF switch implementations, a single, relatively low power external power supply can be used to power the present inventive RF switch. This feature is advantageous as compared to the prior art GaAs implementations that require use of a relatively high power external power supply and power generation circuitry necessary to generate both positive and negative power supplies. For example, in the exemplary embodiments described below with reference to FIGS. 4-12, the present inventive RF switch requires only a single 3 V external power supply. The prior art switch designs typically require at least a 6 volt external power supply, and external voltage generation circuitry to generate both positive and negative power supplies.

Fully Integrated RF Switch

Figure 4:
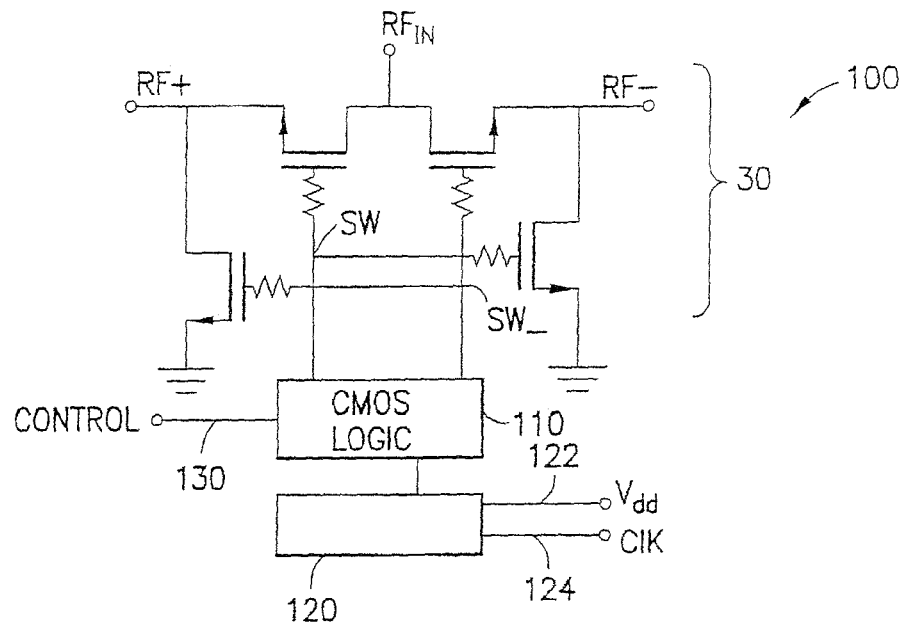
FIG. 4 is a simplified block diagram of an exemplary fully integrated RF switch made in accordance with the present method and apparatus.

FIG. 4 shows a simplified block diagram of an exemplary fully integrated RF switch 100 made in accordance with the present method and apparatus. As shown in FIG. 4, the fully integrated RF switch 100 includes the inventive RF switch 30 described above in FIG. 3 (shown in a simplified schematic representation in FIG. 4), CMOS control logic 110, and a negative voltage generator circuit 120 (implemented in one embodiment using a "charge pump" circuit). A control signal 130 is input to the CMOS logic block 110. In one embodiment, the control signal 130 ranges from 0 volts to +Vdd, however those skilled in the digital logic design arts shall recognize that other logic levels can be used without departing from the scope or spirit of the present method and apparatus. For the reasons provided above, in one exemplary embodiment, the fully integrated RF switch 100 is fabricated on UTSi substrates, although other insulating substrate technologies can be used.

As described in more detail below, the fully integrated RF switch 100 includes several functions and features not present in the prior art RF switch of FIG. 2. For example, in addition to the inventive RF switch 30 (which makes use of the novel transistor stacking and gate transistor configuration described above with reference to FIG. 3), the fully integrated RF switch 100 integrates the negative voltage generator and RF switch control functions together on the same integrated circuit as the inventive RF switch. As described below in more detail, the fully integrated RF switch 100 includes a built-in oscillator that provides clocking input signals to a charge pump circuit, an integrated charge pump circuit that generates the negative power supply voltages required by the other RF switch circuits, CMOS logic circuitry that generates the control signals that control the RF switch transistors, a level-shifting circuit that provides increased reliability by reducing the gate-to-drain, gate-to-source, and drain-to-source voltages of the switch transistors, and an RF buffer circuit that isolates RF signal energy from the charge pump and digital control logic circuits. Each of these circuits is described below in more detail with reference to their associated figures.

Negative Voltage Generator—Charge Pump—A First Embodiment

As shown in FIG. 4, one embodiment of the fully integrated RF switch 100 includes a negative voltage generator or charge pump 120. The negative voltage generator 120 generates the negative power supply voltage (specified hereafter as "−Vdd") required by other circuits of the fully integrated RF switch 100. Two sets of inputs are provided to the negative voltage generator 120: a positive DC power supply voltage signal (Vdd) 122; and a clocking input (shown in the figure as a single input signal, "Clk") 124. Although the clocking input 124 is shown as a single input signal in FIG. 4, as described below with reference to FIG. 5b, in some embodiments of the present inventive RF switch, the clocking input 124 may comprise two or more clock input signals.

In addition, in the embodiment shown in FIG. 4, the positive supply voltage that is input to the negative voltage generator circuit 120 comprises a 3 VDC power supply. However, other power supply levels may be used without departing from the scope or spirit of the present method and apparatus. For example, if desired, a 3.5 VDC, 5 VDC or any other convenient positive DC power supply can be input to the negative voltage generator circuit 120 of FIG. 4. The positive power supply signal is typically generated by an external low voltage power supply.

Figure 5A:
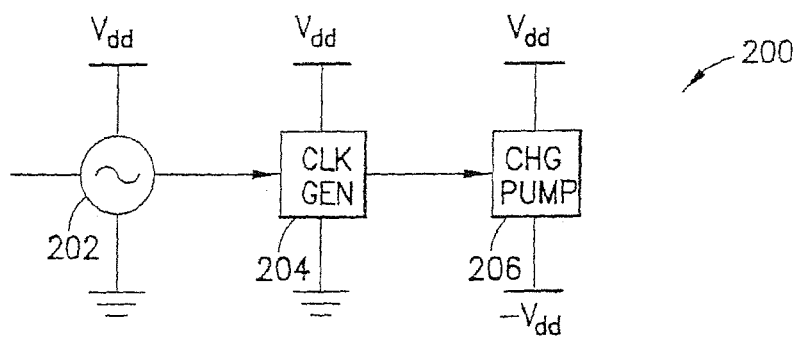
FIG. 5a is a simplified block diagram of one exemplary embodiment of the negative voltage generator shown in the simplified block diagram of FIG. 4.

In one embodiment of the present method and apparatus, the negative voltage generator 120 of FIG. 4 is implemented using a charge pump circuit. FIG. 5a shows a simplified block diagram of one exemplary embodiment 200 of the negative voltage generator 120 of FIG. 4. As shown in the simplified block diagram of FIG. 5a, the negative voltage generator includes an oscillator 202, a clock generator circuit 204, and an inventive charge pump circuit 206. The oscillator 202 output is input to the clock generator circuit 204. The output of the clock generator circuit 204 is input to the charge pump circuit 206. The negative voltage generator 120 provides the negative power supply voltage used by the other circuits of the fully integrated RF switch 100.

Many prior art RF switches disadvantageously require that the negative power supply voltages be generated by circuitry that is external to the RF switch circuitry. Other RF switch implementations use a coupling approach necessary to shift the DC value of the RF input signal to the midpoint of the applied bias voltage. This approach generally requires that relatively high bias voltages be applied because of the effective halving of the FET gate drive due to this level shifting. If the bias voltages are not increased, this produces a negative effect on the switch insertion loss because the gate drive is thereby reduced and the FET channel resistances are increased.

Figure 5B:
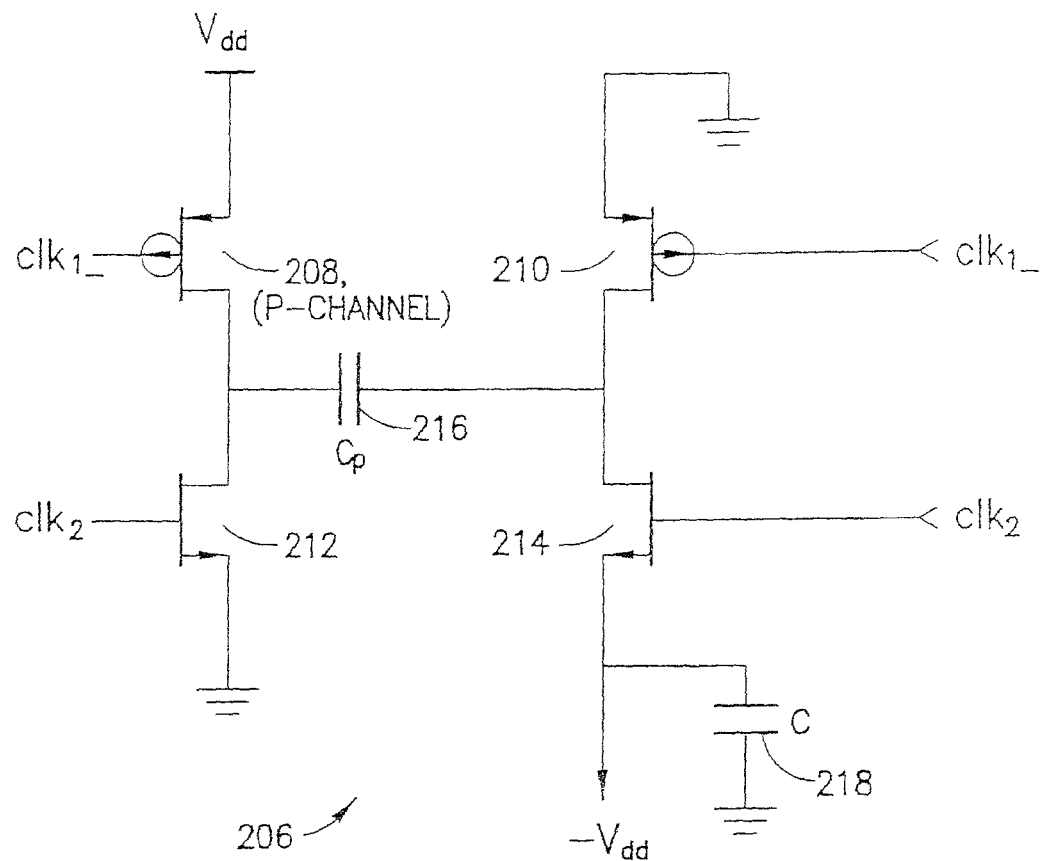
FIG. 5b is an electrical schematic of a first embodiment of a charge pump circuit that is used to generate a negative supply voltage to the RF switch of FIG. 4.

To address these problems, one embodiment of the fully integrated RF switch 100 uses the inventive charge pump circuit 206 shown in detail in FIG. 5b. As shown in FIG. 5b, a first embodiment of the charge pump circuit 206 includes two P-channel MOSFET transistors, 208 and 210, connected in series with two N-channel MOSFET transistors 212 and 214. The left leg of the charge pump circuit 206 (comprising the first P-channel transistor 208 connected in series with the first N-channel transistor 212) is coupled to the right leg of the charge pump circuit (comprising the second P-channel transistor 210 connected in series with the second N-channel transistor 214) using a first capacitor Cp 216. The source of the second P-channel transistor 214 is coupled to a second capacitor, an output capacitor, C 218, as shown. Two non-overlapping clock control signals, "Clk1" and "Clk2", are used to control the operation of the transistors 208, 210, 212 and 214. For example, as shown in FIG. 5b, the inverse of "Clk1", "Clk1_", control the gates of the P-channel transistors 208, 210. The other non-overlapping clock control signal, "Clk2", controls the gate of the N-channel transistors 212, 214, as shown.

The charge pump 206 generates a negative power supply voltage (−Vdd) by alternately charging and discharging the two capacitors (Cp 216 and the output capacitor C 218) using the non-overlapping clock input signals Clk1 and Clk2 to drive the transistor gates. The negative power supply voltage, −Vdd, is generated from the charge that is stored on the capacitor C 218. In one embodiment, a pulse shift circuit (not shown) is used to generate a pulse train that drives the charge pump (i.e., the pulse train is input as the clock input signals Clk1 and Clk2). As the pulse train is applied to the charge pump 206, the capacitor Cp 216 is applied the positive power supply Vdd and then discharged across the output capacitor C 218 in an opposite direction to produce the negative power supply voltage −Vdd. No transistor in the charge pump must standoff more than Vdd across any source/drain nodes, hence greatly increasing the reliability of the charge pump 206.

In one embodiment of the inventive charge pump circuit 206, the output C 218 has a capacitance of approximately 200 pF, and Cp 216 has a capacitance of approximately 50 pF. Those skilled in the charge pump design arts shall recognize that other capacitance values can be used without departing from the scope or spirit of the present method and apparatus.

In one embodiment, as shown in the simplified block diagram of FIG. 5a, the two non-overlapping clock signals are derived from an oscillator signal generated by an internal oscillator 202. As shown in FIG. 5a, the oscillator 202 inputs an oscillation signal to a clock generator circuit 204, which in turn, generates the two non-overlapping clock signals (in any convenient well known manner) that control the charge pump transistor gates. In one embodiment of the present inventive fully integrated RF switch 100, the oscillator 202 comprises a relatively low frequency (on the order of a few MHz) oscillator. In this embodiment, the oscillator comprises a simple relaxation oscillator. However, as those skilled in the integrated circuit arts shall recognize, other types of oscillators can be used to practice the present method and apparatus without departing from its spirit or scope.

Figure 5C:
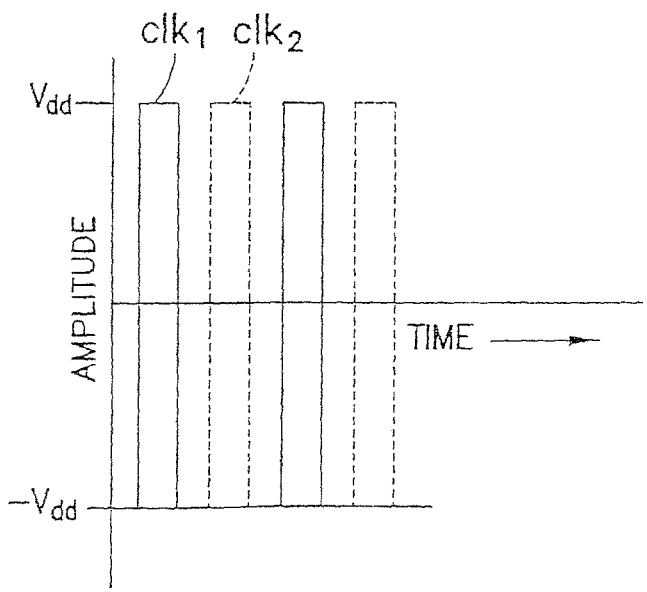
FIG. 5c is a plot of voltage amplitude versus time showing the voltage amplitude of two non-overlapping clock signals used to control the charge pump circuit of FIG. 5b varying over time.

FIG. 5c shows the voltage amplitude of the two non-overlapping clock signals, Clk1 and Clk2, varying over time. As shown in FIG. 5c, the two non-overlapping clock signals vary in voltage amplitude from −Vdd to +Vdd. In one embodiment, the clock signals vary from −3 VDC to +3 VDC. This arrangement improves the efficiency of the charge pump 206.

The charge pump transistors, 208, 210, 212 and 214 advantageously comprise single-threshold N-channel (212, 214) and P-channel (208, 210) devices. Previous charge pump circuits require use of multi-threshold level devices. These previous implementations are therefore more complex in design and cost than the inventive charge pump circuit 206 of FIG. 5b. In one embodiment of the present charge pump 206, the P-channel transistors 208, 210 have widths of approximately 20 micro-meters, and lengths of approximately 0.8 micro-meters. The N-channel transistors 212, 214 have widths of approximately 8 micro-meters, and lengths of approximately 0.8 micro-meters. Those skilled in the integrated circuit design arts shall recognize that other transistor dimensions can be used without departing from the scope or spirit of the present method and apparatus. The inventive charge pump circuit 206 is very efficient and performs well despite temperature and process variations.

Level Shifting Circuitry

Because the charge pump circuitry effectively doubles the power supply voltages that are applied to the circuit, careful attention must be paid to any potential reliability issues associated with these higher voltages. In order to implement the charge pump in a manner that increases the reliability of the transistors, level shifting circuitry is used to limit the gate-to-source, gate-to-drain, and drain-to-source voltages on the transistors to acceptable levels.

Figure 6A:
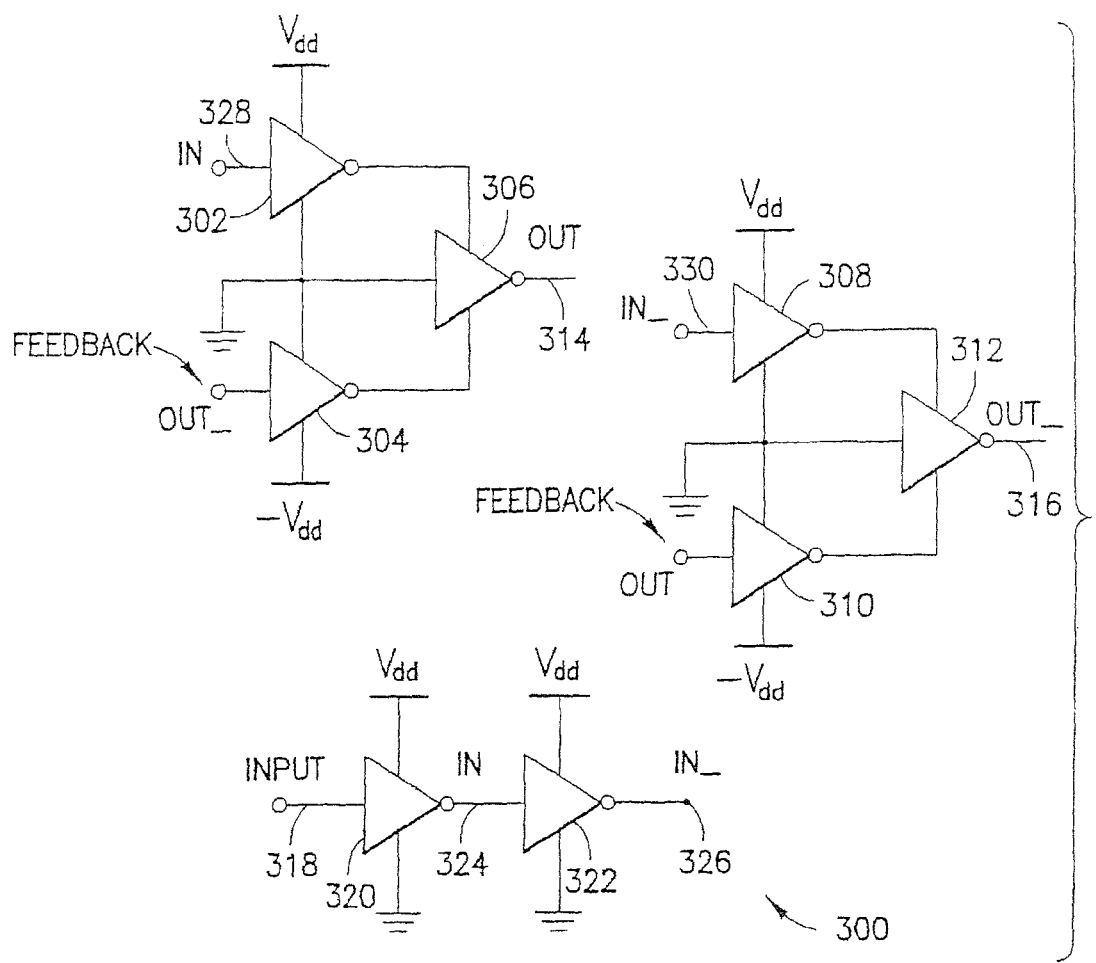
FIG. 6a is an electrical schematic of a first embodiment of an inventive level shifting circuit.

An inventive level shifting circuit 300 made in accordance with the present method and apparatus is shown in FIG. 6a. The level shifting circuit 300 is used to convert or shift typical or "normal" digital input signals (digital signals typically range from ground (GND) to +Vdd) such that they range from −Vdd to +Vdd. The reliability of the fully integrated RF switch transistors is thereby increased. In one embodiment of the present method and apparatus, the control signals are shifted to −3 VDC to +3 VDC, although those skilled in the RF switch control arts shall recognize that other level shifting voltage ranges can be used without departing from the spirit or scope of the present method and apparatus.

As shown in FIG. 6a, the inventive level shifting circuit 300, hereinafter referred to as the level shifter 300, comprises a plurality of inverters coupled in a feedback configuration. More specifically, in the embodiment shown in FIG. 6a, the level shifter 300 includes two groups of inverters used to generate first and second shifted output signals, "out" on a first output node 314, and its inverse "out_" on a second output node 316. The first group of inverters comprises inverters 302, 304 and 306. A second group of inverters comprises inverters 308, 310 and 312. A typical or "normal" digital input signal (i.e., a digital input signal that ranges from GND to +Vdd) is input to the level shifter 300 at an input node 318 of a first inverter 320. The first inverter 320 generates a first input signal "in" (on an output node 324) which is input to a second inverter 322. The second inverter 322 generates a second input signal "in_", the inverse of the first input signal "in", on an output node 326. Therefore, the first and second inverters, 320, 322, generate the signals that are input to the two groups of inverters described above. For example, the first input signal "in" is coupled to the input 328 of the inverter 302. Similarly, the second input signal "in_" is coupled to the input 330 of the inverter 308.

The output of the first group of inverters, "out", is generated by a first output inverter 306, and is provided on a first output node 314. The output of the second group of inverters, "out_", is generated by a second output inverter 312, and is provided on a second output node 316. The two level shifter outputs, "out" and "out_", are input to other circuits of the fully integrated RF switch 100 of FIG. 4. For example, in one embodiment, the first output, "out", is coupled to the gates of the devices of the switching transistor grouping 33 and the shunting transistor grouping 38 (i.e., the "out" signal on the first output node 314 of FIG. 6a is coupled to the "SW" control input signal of FIG. 3, at the input nodes 33' and 38', and thereby controls the operation of the switching transistor grouping 33 and the shunting transistor grouping 38 as described above with reference to FIG. 3). Similarly, in this embodiment, the second level shifter output, "out_", is coupled to the "SW_" control input signal of FIG. 3 (at the input nodes 34' and 37') and thereby controls the switching transistor grouping 34 and the shunting transistor grouping 37 as described above.

The level shifter 300 of FIG. 6a shifts the DC level of an input signal (i.e., the input signal provided on the input node 318) while leaving the frequency response of the input signal unchanged. The level shifter 300 takes full advantage of the floating technology offered by the silicon-on-insulator substrate implementation of the fully integrated RF switch 100. The inverters of the level shifter 300 operate on a differential basis, i.e., the level shifter shifts the digital input signals based upon the difference between two voltage signals. More specifically, as long as the difference between the power supply signals provided to the inverters (such as, for example, the output inverters 306 and 312) is on the order of Vdd, the level shifter 300 reliably functions to shift the input signals to a range between −Vdd to +Vdd. In one embodiment, Vdd is equal to 3 VDC. In this embodiment, the transistors comprising the inverters of the level shifter 300 (e.g., the output inverters 306 and 312) never have greater than 3 VDC applied across their source/drain nodes. This increases the reliability of the transistor devices.

Referring again to FIG. 6a, the level shifter uses a feedback approach to shift the digital input signals to voltage levels ranging from −Vdd to +Vdd. Specifically, the output of the second group of inverters (308, 310, 312) on the second output node 316 (i.e., the "out_" signal) is provided as feedback to an input of the first group of inverters at the input of the inverter 304. Similarly, the output of the first group of inverters (302, 304, 306) on the first output node 314 (i.e., the "out" output signal) is provided as input to the second group of inverters, specifically, is provided as input to the inverter 310.

When the digital input signal on the input node 318 reaches a logical "high" state (i.e., in some embodiments, when the input signal transitions from GND to +Vdd), the "in" signal (at the node 324) and the "in_" signal (at the node 326) go to ground (e.g., 0 VDC) and Vdd (e.g., 3 VDC), respectively. The "out" signal at the first output node 314 is driven to +Vdd. At the same time, the "out_" signal at the second output node 316 is driven towards −Vdd. The feedback (of "out_" fed back to the input of the inverter 304 and "out" fed forward to the input of the inverter 310) configuration ensures the rapid change in state of the level shifter 300. The level shifter 300 works similarly when the input signal transitions from a logic high to a logic low state (i.e., transitions from +Vdd to GND). When the digital input signal on the input node 318 reaches a logic "low" state, the "in" signal (at the node 324) and the "in_" signal (at the node 326) go to Vdd (e.g., 3 VDC), and ground, respectively. The "out" signal at the first output node 314 is driven to −Vdd. At the same time, the "out_" signal at the second output node 316 is driven towards +Vdd. The feedback again ensures the rapid change in state of the level shifter 300. The grounding contribution ensures that the level shifter inverters never see more than a full Vdd voltage drop across the source/drain nodes of the MOSFET transistors of the inverters.

Figure 6B:
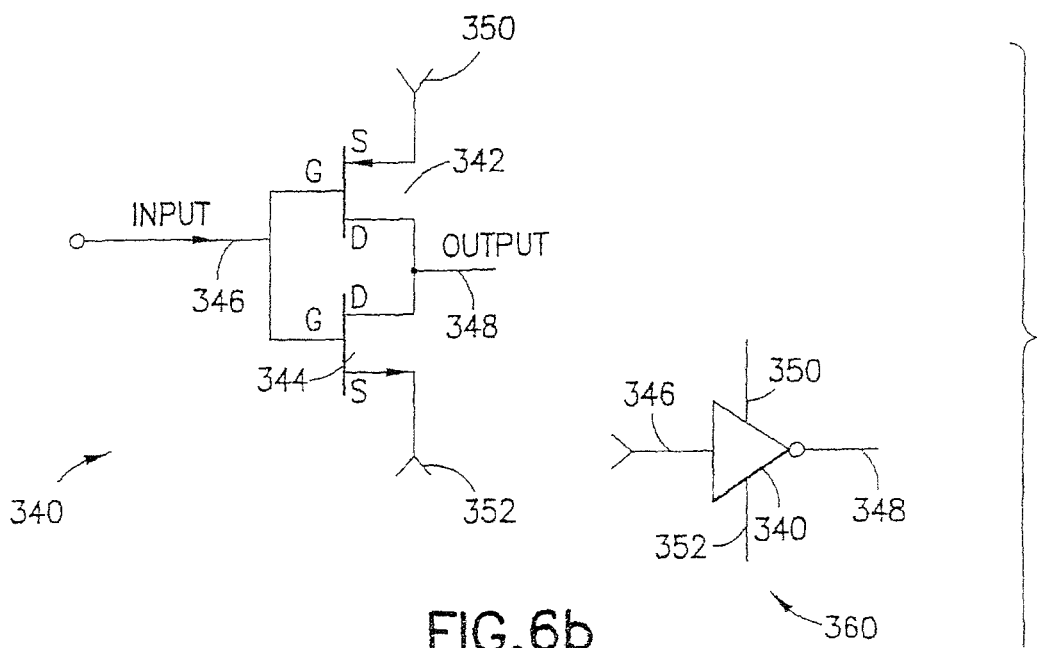

FIG. 6b shows one embodiment of the inverters (e.g., the inverters 302, 304, and 306) used to implement the level shifter 300 of FIG. 6a. As shown in FIG. 6b, the inverter 340 includes two MOSFET devices, a P-channel transistor 342 and an N-channel transistor 344. The devices are connected in series as shown, having their gates coupled together and controlled by an input signal provided at an input node 346. The source of the P-channel transistor 342 is coupled to a first power supply voltage signal at node 350, while the source of the N-channel transistor 344 is coupled to a second power supply voltage signal at a node 352. The device drains are coupled together as shown to produce an output of the inverter at an output node 348. In one embodiment of the present inventive inverter 340, the P-channel transistor 342 has a width of 5 micro-meters and a length of 0.8 micro-meters. In this embodiment, the N-channel transistor has a width of 2 micro-meters and a length of 0.8 micro-meters. Those skilled in the transistor design arts shall recognize that other physical dimensions can be used for the transistors of the inverter 340 without departing from the scope or spirit of the present method and apparatus. A logical representation of the inverter 340 is also shown as symbol 360 in FIG. 6b.

Figure 7A:
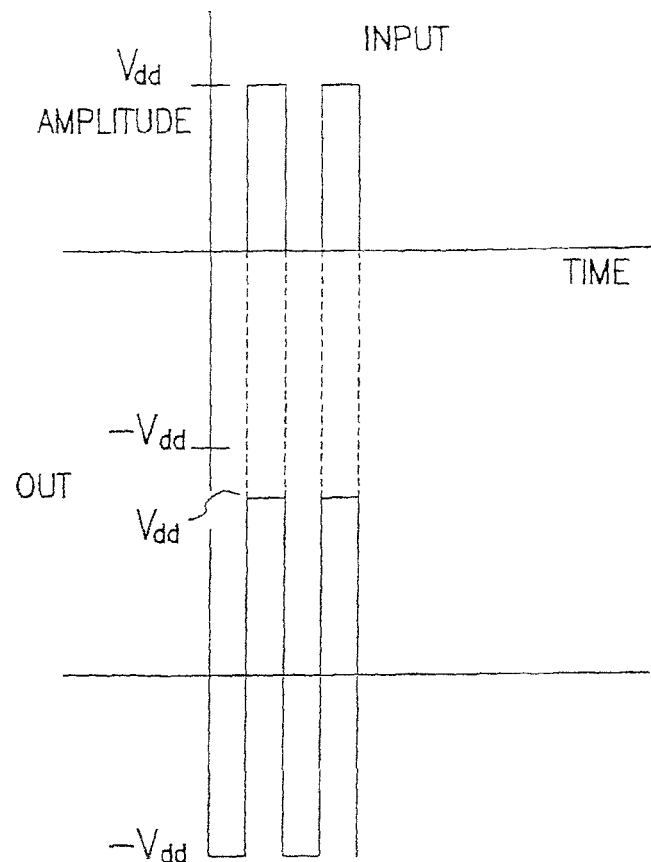

Thus, using the present inventive level shifter 300, digital input signals that initially range from GND to +Vdd are shifted to range from −Vdd to +Vdd. FIG. 7a shows a voltage amplitude versus time plot of the digital input signal and the corresponding output signal that is generated by the inventive level shifter 300 of FIG. 6a. As shown in FIG. 7a, the digital input signal ranges from ground, or 0 VDC to Vdd. The output of the inventive level shifter 300 ranges from −Vdd to +Vdd. In one embodiment of the present inventive RF switch, the input signal ranges from 0 VDC to +3 VDC, and the output of the level shifter 300 ranges from −3 VDC to +3 VDC. Other values of power supply voltages can be used without departing from the scope or spirit of the present method and apparatus. For example, in one embodiment, the input signal can range from 0 to +3.5 VDC, or from 0 to 4 VDC. In this embodiment, the level shifter shifts the signal to range from −3.5 (or −4) VDC, to +3.5 (or +4) VDC.

Figure 7B:
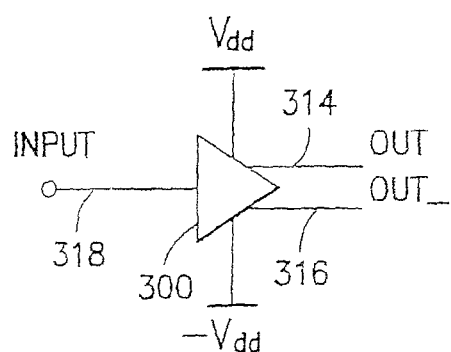

FIG. 7b shows a simplified logic symbol for the inventive level shifter 300 of FIG. 6a. This logic symbol is used in subsequent figures. As shown in FIG. 7b, the digital input signal is provided on the input node 318 (the same input node 318 described above with reference to FIG. 6a). The level shifter 300 provides two shifted outputs, "out" and its inverse "out_", and these are provided on output nodes 314 and 316, respectively (the same output nodes 314, 316 described above with reference to FIG. 6a).

RF Buffer Circuit

Figure 8B:
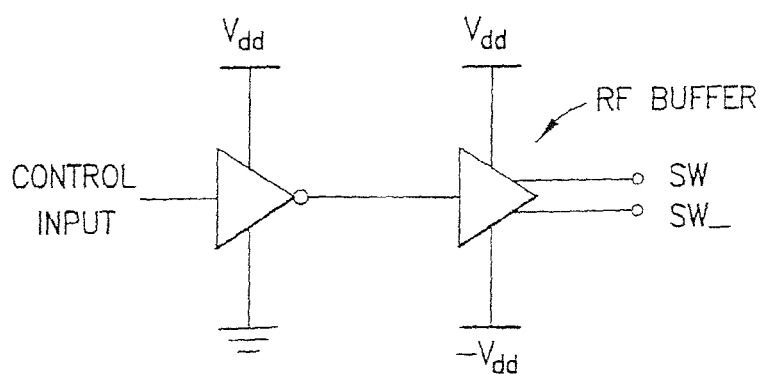
Figure 8A:
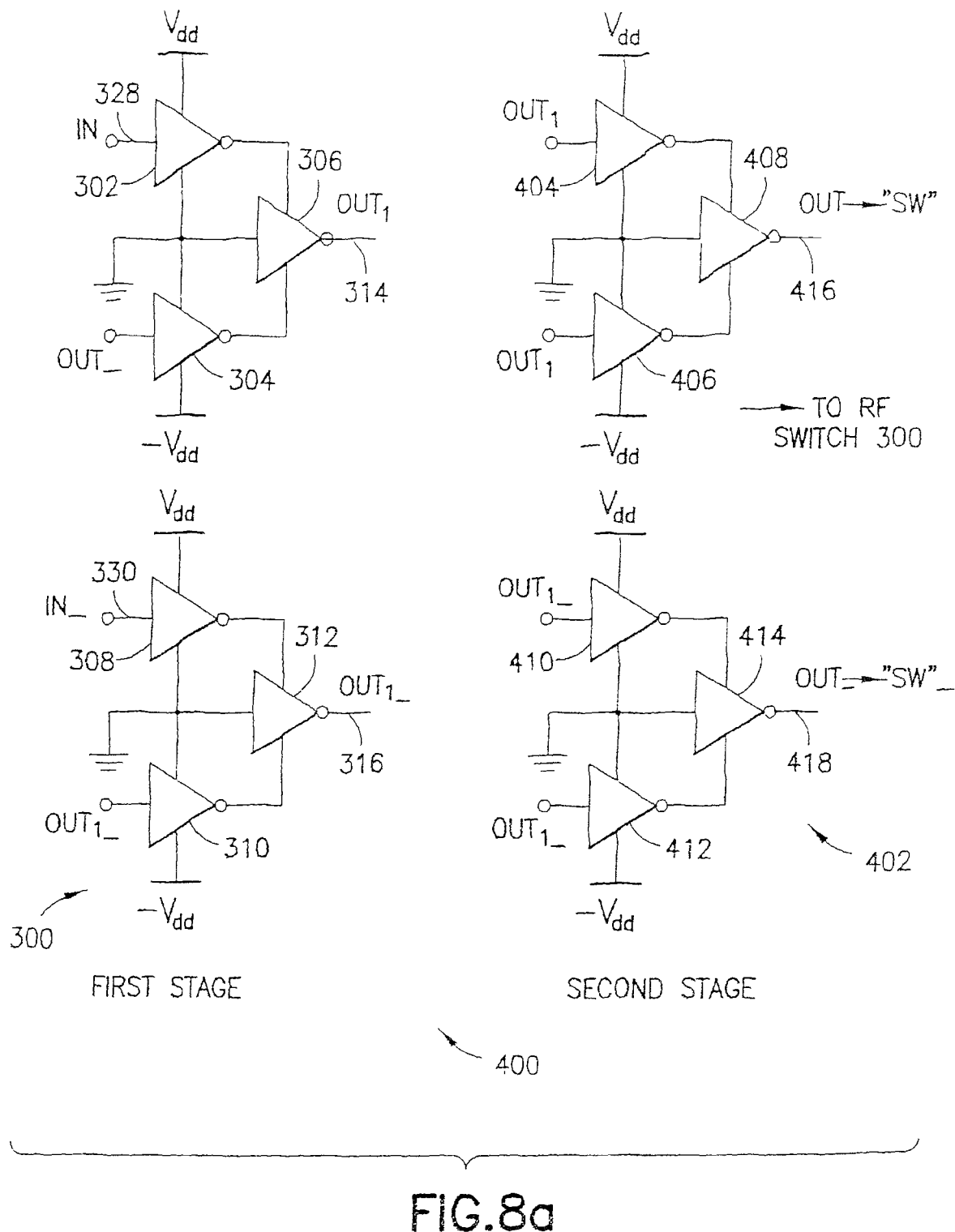
FIG. 8a is an electrical schematic of one embodiment of a two-stage level shifter and RF buffer circuit including a first stage level shifter and a second stage RF buffer circuit.

FIG. 8a is an electrical schematic of a two-stage level shifter and RF buffer circuit 400. FIG. 8b is a simplified block diagram of the digital control input and interface to the RF buffer circuit 400. The two-stage level shifter and RF buffer circuit 400 of FIG. 8a comprises a first stage level shifter 300 and a second stage RF buffer circuit 402. The first stage level shifter 300 is identical to that described above with reference to FIGS. 6a, 6b, 7a and 7b, and is therefore not described in more detail here. As described above, the level shifter stage 300 shifts the logic levels of the digital control signals to range from −Vdd and +Vdd. The second stage of the circuit 400 comprises the RF buffer circuit 402. The RF buffer circuit 402 acts as a driver stage only (i.e., no level shifting is performed by the RF buffer circuit).

The RF buffer electrically isolates the digital control signals (such as those generated by the CMOS logic block 110 of FIG. 4) from the RF switch 30 described above with reference to FIG. 3. The RF buffer 402 functions to inhibit drooping of the control voltages (SW, SW_, which are also referred to herein and shown in FIG. 8a as the control signals "out" and "out_, respectively) that control the enabling and disabling of the transistors in the RF switch 30. As described below in more detail, the RF buffer 402 also functions to prevent coupling of large power RF signals to the negative power supply (i.e., −Vdd) that is generated by the charge pump circuit 206 described above with reference to FIGS. 5a-5c. More specifically, the RF buffer 402 prevents large power RF signals extent in the RF switch 30 from RF-coupling to, and thereby draining current from, the negative power supply generated by the charge pump 206 (FIG. 5b).

When very large power RF input signals are input to the inventive RF switch 30, coupling of the RF signals to the digital logic signals can occur unless an RF buffer circuit is used to isolate the digital logic signals from the RF switch. The RF coupling can and usually will detrimentally affect the RF transistor control signals (SW and SW_). For example, when RF input signals on the order of approximately 30 dBm are input to a 1 watt RF switch 30, RF coupling can cause voltage swings of several tenths of a volt on the digital control lines. This is due to the feedback of RF signals from the RF switch through to the digital control circuitry. This RF coupling effect can adversely affect the enabling and disabling of the RF transistor groupings and hence the proper operation of the RF switch 30. The buffer circuit 402 of FIG. 8a prevents the undesirable RF coupling effect.

As shown in FIG. 8a, the inventive buffer circuit 402 is very similar in configuration to the level shifter 300 described above and shown as the first stage of the two-stage circuit 400. Similar to the level shifter 300, the RF buffer 402 comprises two groups of inverters, a first group of inverters (404, 406 and 408) and a second group of inverters (410, 412, and 414). The output of the first group of inverters (404, 406, and 408), generated by the first output inverter 408, is labeled "out" in the figure and is provided at a first output node 416. The output of the second group of inverters (410, 412, and 414), generated by the second output inverter 414, is labeled "out_", and is provided at a second output node 418. The output signal "out_" is the inverse of the output signal "out".

Importantly, although the first stage level shifter 300 uses feedback to perform the level shifting function (as described above with reference to FIG. 6a), the RF buffer circuit 402 does not feedback its output signals to the input. Consequently, the digital input signals input to the first stage (i.e., the control input signals that are input to the level shifter 300 at the nodes 328 and 330) are isolated from the output signals that are used to control the RF switch transistors (i.e., the control output signals "out" and its inverse signal "out_" at the output nodes 416 and 418, respectively, and coupled to the SW and SW_ control signal lines, respectively).

More specifically, and referring again to FIG. 8a, the level shifter 300 inputs the digital control signals "in" and its inverse signal "in_" at the nodes 328, 330 respectively (as described in more detail above with reference to FIG. 6a). The first output of the level shifter 300, "out1", at the output node 314, is fed back to the input of the inverter 310 as shown. Similarly, the second output of the level shifter 300, "out1_", at the output node 316, is fed back to the input of the inverter 304. As described above, because of this feedback topology, RF coupling occurs (i.e., the level shifter output signals have RF signals superimposed thereon) if the output signals of the level shifter are used to directly control the RF switch transistors (i.e., in the absence of the buffer circuit 402). Therefore the inventive RF buffer circuit 402 is used without feedback of the output signals to isolate the input signals (i.e., the digital input signals "in" and "in_) from the RF signals present in the RF switch. As shown in FIG. 8a, the first output signal "out1" of the level shifter 300 is input to the inverters 404, 406 of the RF buffer circuit. Similarly, the second output signal "out1_" of the level shifter 300 is input to the inverters 410, 412 of the buffer circuit. The two control outputs of the RF buffer circuit 402 ("out" and "out_") control the enabling and disabling of the transistors of the RF switch and are not provided as feedback to the level shifter. Hence, improved isolation between the RF switch and the digital logic circuitry is achieved.

In one embodiment, the inverters used to implement the two-stage level shifter and RF buffer circuit 400 comprise the inverter 340 described above with reference to FIG. 6b. However, those skilled in the inverter design arts shall recognize that alternative inverter designs can be used in implementing the two-stage circuit 400 without departing from the scope or spirit of the present method and apparatus. In one embodiment, the transistors used to implement the first stage level shifter 300 are physically smaller than those used to implement the second stage RF buffer circuit 402. Larger dimension transistors are used in the RF buffer circuit 402 to achieve an efficient amplification of the control signals. For example, in one embodiment, the transistors used to implement the RF buffer are three times wider than those used to implement the level shifter 300, resulting in an amplification of approximately three times the current. Those skilled in the transistor design arts shall recognize that other convenient transistor dimensions can be used to achieve any desired amplification of the digital control signals.

Voltage Divider for Use in an Alternative Level Shifting Circuit

Figures 9A, 9B:
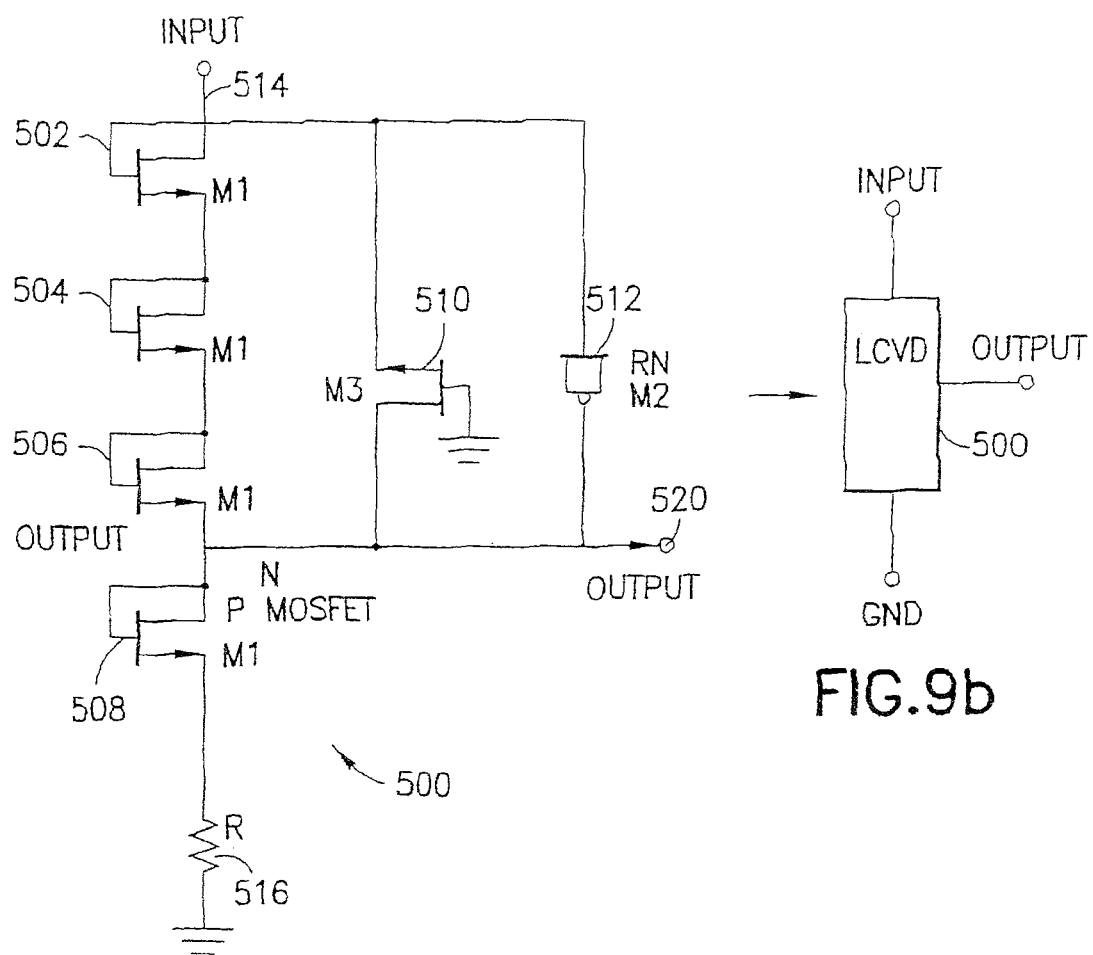

FIG. 9a is an electrical schematic of one embodiment of a low current voltage divider ("LCVD") circuit 500 that is used in the feedback path of one embodiment of the level shifter 300 described above with reference to FIG. 6a. FIG. 9b shows a simplified logic symbol that is used to represent the voltage divider 500 of FIG. 9a. The voltage divider 500 is used in one embodiment to address potential gate oxide reliability issues related to excessive voltage swings across the gate oxides of the feedback inverter transistors. As described above with reference to the level shifter 300, although the source-to-drain voltages of the various MOSFETs used to implement the level shifter are never applied voltages greater than Vdd, because the outputs of the level shifter (i.e., the output signals "out" and "out_) can swing as much as 2*Vdd (i.e., from −Vdd to +Vdd), the gate oxides of the feedback inverters 304 and 310 can have applied voltages of 2*Vdd. These feedback voltage levels can be applied across the gate oxides of the feedback inverters 304, 310, and can result in gate oxide reliability problems.

The gate oxide reliability issues can be averted by ensuring that the maximum voltage applied across the gate oxide of the feedback inverters 304, 310 is lowered to approximately Vdd (as contrasted with gate oxide voltages of 2*Vdd). Therefore, in one embodiment of the present inventive fully integrated RF switch, the voltage divider of FIG. 9a limits the voltages applied to the gates of the level shifter feedback inverters 304, 310. In this embodiment, instead of directly feeding back the level shifter outputs to their respective feedback inverters as shown in the level shifter of FIG. 6a (i.e., the outputs "out" and "out_", at the output nodes 314, 316, respectively), the level shifter output signals are first conditioned by the voltage divider 500 of FIG. 9a before being fed back to the feedback inverters. As described below in more detail, the voltage divider 500 ensures that the voltages applied to the gate oxides of the feedback inverters 304, 310 do not exceed more than approximately Vdd plus a small voltage drop (the voltage drop being a function of the number of transistors used to implement the voltage divider 500 and a transistor threshold voltage). In one embodiment Vdd is 3 VDC, and the voltage drop is 0.9 VDC. In this embodiment, the voltage divider 500 ensures that the gate oxides are never applied voltages exceeding approximately 3.9 VDC (i.e., the feedback inverters are applied voltages that range from −3 VDC to 0.9 VDC).

Referring now to FIG. 9a, the voltage divider 500 includes a plurality of MOSFET devices (502, 504, 506 and 508) coupled together in a serial configuration (i.e., stacked on top of each other in a source to drain arrangement as shown). In one embodiment, the gate and drain of the MOSFETs 502, 504, 506 and 508 are coupled together to implement stacked diodes. The diode-implementing MOSFETs, hereafter referred to as "diode devices", are stacked in series as shown. The voltage divider 500 also includes a MOSFET M3 510 and an output MOSFET M2 512. The function of these two transistors is described in more detail below.

The diode devices are used to divide the voltage of an input signal provided to the voltage divider 500 at an input node 514. As shown in FIG. 9a, the signal that is divided by the voltage divider 500 is provided as input to the drain (and connected gate) of the first device 502. Once the input signal exceeds a positive voltage level of (n*Vthn), where "n" is the number of diode devices used to implement the voltage divider 500, and Vthn is the threshold voltage of the device (i.e., the "diode-drop" from the drain to the source of the device), the diode devices (502, 504, 506, and 508) begin to conduct current heavily. In the embodiment shown in FIG. 9a, n=4, and Vthn=0.7 volts, although alternative values for "n" and Vthn can be used without departing from the scope or spirit of the present method and apparatus. For example, in other embodiments, the input signal provided to the divider can be limited to any desired voltage level by varying the number of diode devices used to implement the voltage divider 500 (i.e., by varying the value of "n"). In the embodiment shown in FIG. 9a, once the input voltage exceeds a voltage level of (4*0.7), or 2.8 volts, the stacked diode devices begin conducting heavily.

A ballast resistor, R 516, is connected to the source of the output diode device 508 as shown. Once the diode devices turn on fully, the ballast resistor R 516 drops any additional input voltage that exceeds the value of n*Vthn. In the embodiment shown in FIG. 9a, the ballast resistor R 516 drops any additional input voltage exceeding the value of (input voltage−(4*Vthn)). The output of the voltage divider 500 is tapped from the connected gate-drain of the output diode device 508. The voltage-divided output signal is provided on an output node 520. Due to the diode voltage drops of the diode devices 502, 504, 506, (i.e., 3*Vthn), and the voltage dropped across the ballast resistor R 516, the output at the output node 520 is guaranteed to never exceed approximately (input voltage−(3*Vthn)). For Vthn=approximately 0.7 volts, and a maximum input voltage of approximately 3 volts, the output node 520 will never exceed (3 VDC−(3*0.7 VDC)), or 0.9 VDC. Thus, in the embodiment shown in FIG. 9a, for an input voltage ranging between −3 VDC to +3 VDC, the voltage divider 500 limits the output of the output node 520 to a range of −3 VDC to 0.9 VDC.

The output MOSFET M2 512 is configured as a capacitor and is used to assist in accelerating the switching time of the voltage divider 500. The MOSFET M3 510 assures that the output node 520 swings to the potential of the input signal at the input node 514 when the input goes to a negative potential. This is accomplished by the device M3 510 turning on when the input signal goes to a negative potential. Thus, when the input signal goes to a −Vdd potential (e.g., −3 VDC), the output signal at the output node 520 also goes to −Vdd. The output device 508 is reversed biased during negative voltage swings of the input signal assuring that no DC current is drained from the negative power supply during the negative voltage swings of the input signal. When the voltage divider output is approximately −3 VDC, the voltage divider 500 draws no current. This is important because a current at −3 VDC discharges the charge pump circuit described above with reference to FIG. 5b. When the voltage divider output is approximately 0.9 volts, the current that is drawn is very small if the ballast resistor R 516 is selected to be relatively large. However, because the current in this case occurs between a positive voltage (0.9 volts) and ground, no additional charge pump current is delivered due to the operation of the voltage divider 500 of FIG. 9a.

In one embodiment, the ballast resistor R 516 has a value of 100 k-ohms. In one embodiment all of the devices of the voltage divider 500 have the same length. For example, in one embodiment, all of the devices have a length of 0.8 micro-meters. In one embodiment, all of the diode devices (502, 504, 506, and 508) have identical physical dimensions. In one embodiment, the diode devices each have a width of 2 micro-meters, the device M3 510 has the same width of 2 micro-meters, and the output MOSFET M2 512 has a width of 14 micro-meters. Those skilled in the integrated circuit design arts shall recognize that other values and alternative configurations for the devices shown in FIG. 9a can be used without departing from the scope or spirit of the present method and apparatus. For example, those skilled in the electrical circuit design arts shall recognize that other voltage divider output levels can easily be accommodated by varying the number "n" of diode elements, varying the values of Vthn, or by tapping the output node 520 at a different point in the stack of diode devices (e.g., by tapping the output from the drain of diode device 506, or 504, instead of from the drain of device 508 as shown).

Modified Level Shifter Using the Voltage Divider

Figure 10:
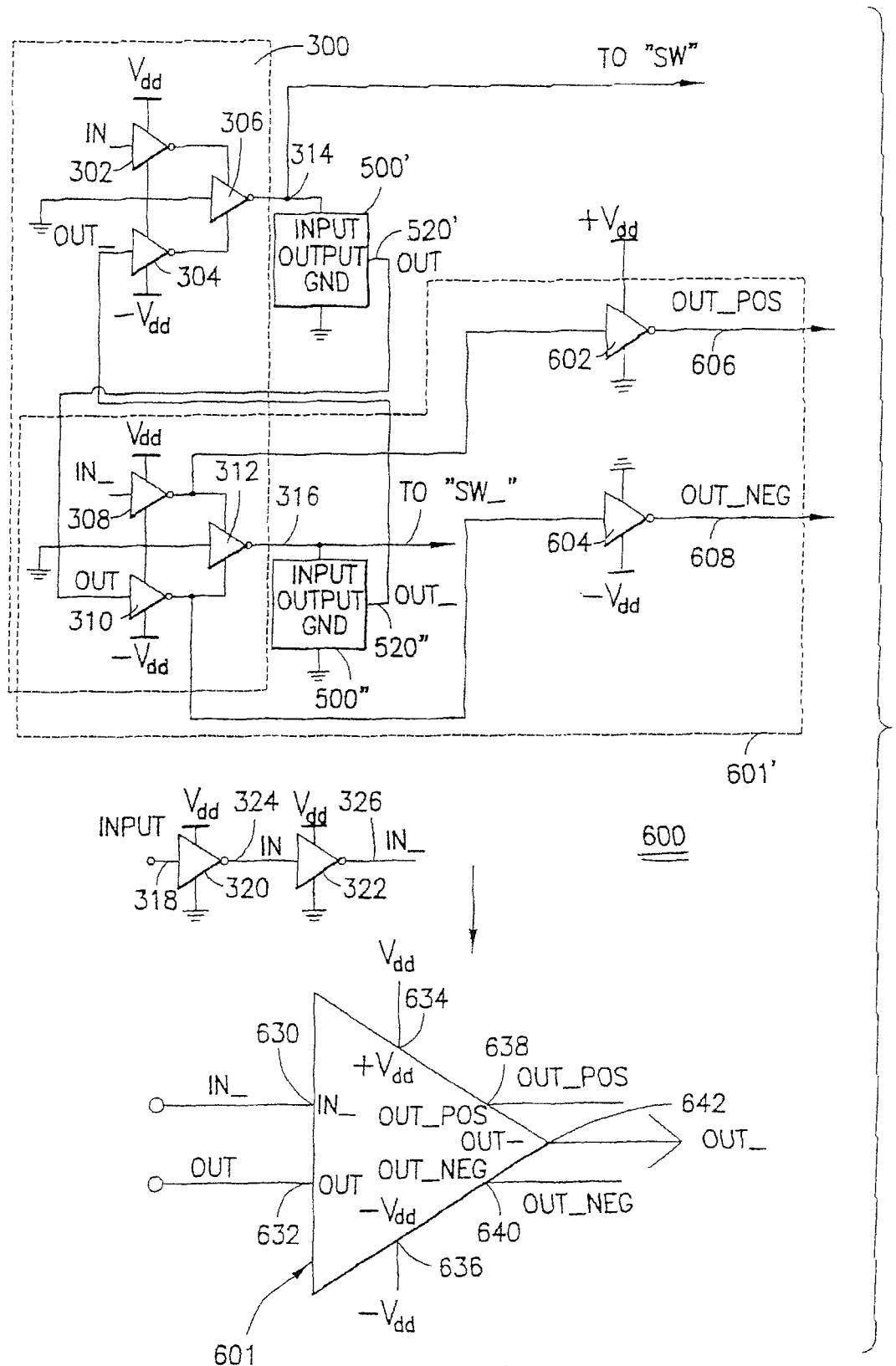

By reducing the voltages that are applied to the gate oxides of the RF switch transistors, the voltage divider 500 of FIGS. 9a and 9b advantageously can be used to increase the reliability of the transistors in both the level shifter 300 and the charge pump circuit described above. For example, FIG. 10 shows a modified level shifter 600 using the voltage divider 500 of FIG. 9a in combination with the level shifter 300 of FIG. 6a. As shown in FIG. 10, the output (at output node 314) of the inverter 306 of the level shifter 300 is applied to an input of a first voltage divider 500'. Similarly, the output (at the output node 316) of the inverter 312 of the level shifter 300 is applied to an input of a second voltage divider 500". The outputs of the voltage dividers are fed back to the input of the feedback inverters 304, 310 as shown in FIG. 10. Specifically, and referring to FIG. 10, the output of the first voltage divider, "out", on the output node 520' is fed back to the input of the feedback inverter 310. Similarly, the output of the second voltage divider, "out_", on the output node 520" is fed back to the input of the feedback inverter 304. As described above with reference to FIG. 9a, the level shifters 500' and 500" reduce the feedback voltages to ranges of −Vdd to approximately +0.9 VDC. This reduced voltage swing on the feedback paths does not alter the function of the level shifter 600.

Note that the RF switch control signals, "SW" and "SW_", can be tapped from the level shifter outputs prior to their input to the voltage dividers 500' and 500", and provided as input to the inventive RF switch 30 of FIG. 3. For example, as shown in FIG. 10, the output of inverter 306 at the output node 314 can be tapped and used to generate the switch control signal "SW". Similarly, the output of the inverter 312 at the output node 316 can be tapped and used to generate the switch control signal "SW_". In one embodiment, as described above with reference to the two-stage level shifter and RF buffer circuit 400 of FIG. 8a, the control signals tapped from the nodes 314, 316 are first buffered before being coupled to the RF switch transistors. The switch control signals, SW and SW_, are allowed to have a full-rail voltage swing which does not create gate oxide reliability problems in the RF switch. More specifically, the switch control signals range from −Vdd to +Vdd (i.e., the voltage levels of the switch control signals are not limited by the voltage dividers). The full voltage swings of the switch control signals do not raise gate oxide reliability issues with respect to the RF switch MOSFETs because the sources of the RF switch MOSFETs are grounded. The switch input signals are therefore relative to ground in the RF switch MOSFETs. Consequently, the MOSFETs are applied either a positive Vdd voltage relative to ground across the gate oxides, or a negative Vdd voltage relative to ground across the gate oxides.

FIG. 10 also shows a simplified symbolic representation 601 of a section of the modified level shifter 600. The symbol 601 represents the portion indicated by the dashed region 601' of FIG. 10. As shown in FIG. 10, the symbolic modified level shifter 601 includes a first input "in_" 630 corresponding to the input node 326 ("in_"). The symbolic level shifter 601 also includes a second input "out" 632 corresponding to the input to the feedback inverter 310. Note that this signal is also derived from the output 520' of the first voltage divider 500'. A positive power supply voltage is input at a +Vdd input 634. A negative power supply voltage is input at a −Vdd input 636. The modified level shifter 601 has three output signals, "out_pos" (at output 638), "out_neg" (at output 640), and "out_" (at output 642). These outputs correspond to the output nodes 606, 608, and 520" described above. For ease of understanding, the symbolic representation of the level shifter 601 is used in the figures described below.

The potential gate oxide reliability problems associated with the level shifter 300 described above with reference to FIG. 6a are averted using the voltage dividers 500' and 500" in the feedback paths of the modified level shifter 600. In addition, the voltage dividers 500' and 500" can also function to reduce potential gate oxide reliability problems associated with the charge pump circuit. As shown in FIG. 10, the outputs of the inverters 308 and 310 are tapped from the level shifter 300 and provided as input to two output inverters to produce two output signals, "out_pos" and "out_neg." More specifically, the output of the inverter 308 is provided as input to a first output inverter 602. Similarly, the output of the feedback inverter 310 is provided as input to a second output inverter 604.

By coupling the output inverters 602, 604 in this manner, the modified level shifter 600 output signals never exceed Vdd (or −Vdd). More specifically, the first output inverter 602 generates an output signal, "out_pos", at a first output node 606, that ranges from GND (i.e., 0 VDC) to +Vdd. The second output inverter 604 generates a second output signal, "out_neg", at a second output node 608, which ranges from −Vdd to GND. When the input signal "in_" goes to GND, the output signal "out_pos" also goes to GND. The output signal "out_neg" transfers from GND to −Vdd. When the input signal "in_" goes positive to +Vdd, "out_pos" also goes to Vdd, and "out_neg" transfers from −Vdd to GND. Thus, using the present modified level shifter 600, the "out_pos" output signal ranges from GND to +Vdd, while the "out_neg" output signal ranges from −Vdd to GND. As described below in more detail, the two output signals, "out_pos" and "out_neg", are used to address potential gate oxide reliability problems in a modified charge pump circuit. As described now with reference to FIGS. 11a and 11b, these output signals can also be used to address potential gate oxide reliability problems in the RF buffer circuit.

Modified Level Shifter and RF Buffer Circuit

The two-stage level shifter and RF buffer 400 described above with reference to FIG. 8a can experience voltage swings at the RF buffer inverter inputs of approximately 2*Vdd. As already described, this level of voltage swing may present gate oxide reliability problems and detrimentally affect the function of the RF buffer transistors.

Figure 11A:
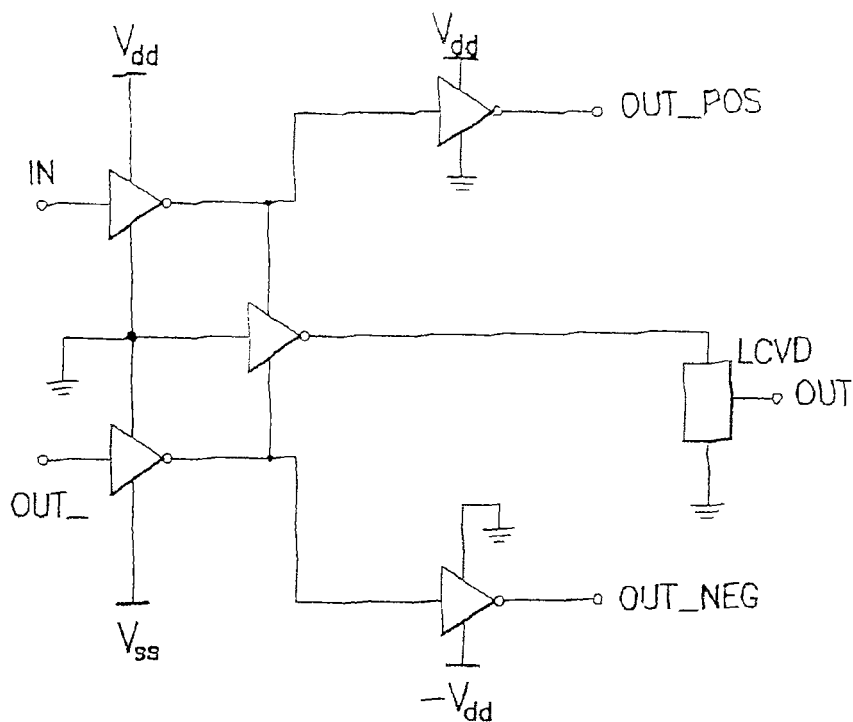
Figure 11B:
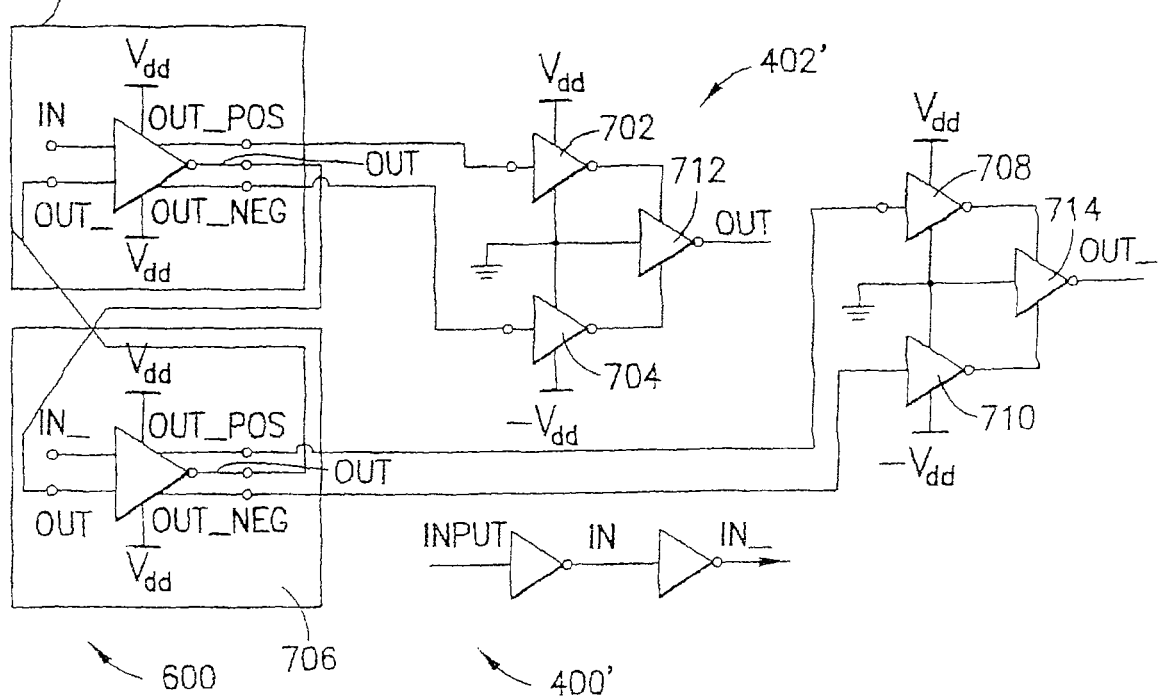

FIGS. 11a and 11b show an alternative embodiment 400' of the two-stage level shifter and RF buffer circuit 400 described above with reference to FIG. 8a. The alternative embodiment of the RF buffer shown in FIG. 11b uses the voltage divider circuit described above to assure that voltages on the gate oxides of the RF buffer never exceed greater than 0.9 volts above Vdd. As shown in FIG. 11b, the alternative two-stage level shifter and RF buffer circuit 400' includes a first stage level shifter circuit 600 coupled to a second stage RF buffer circuit 402'. In this embodiment of the level shifter and RF buffer circuit 400', the modified level shifter outputs, "out_pos" and "out_neg", described above with reference to FIG. 10, are used as input to the RF buffer inverters to generate the RF buffer output signals "out" and "out_". For example, as shown in FIG. 11b, the "out_pos" and "out_neg" output signals generated by a first modified level shifter 700 are input to two RF buffer inverters, 702, 704, respectively. Similarly, the "out_pos" and "out_neg" output signals generated by a second modified level shifter 706 are input to two RF buffer inverters, 708, 710, respectively. In accordance with the alternative embodiment 400' shown in FIGS. 11a and 11b, when an input signal "in" is a logical high signal, the "out_pos" output goes to Vdd while the "out_neg" goes to GND. Thus, when the input signal "in" is a logical high value, the output of the inverter 702 goes to GND, and the output of the inverter 704 goes to −Vdd. Therefore, when the input signal "in" is high, the output of the inverter 712 ("out") goes to −Vdd. When the input signal "in" is low, the opposite outputs are produced.

The RF buffer inverters 702, 704 are used to control the power supply voltages of a first RF output inverter 712. Similarly, the RF buffer inverters 708, 710 are used to control the power supply voltages of a second RF output inverter 714. In this embodiment, the RF buffer output signals, "out" and "out_", are used to control the RF switch (i.e., output signal "out" acts as control voltage "SW", while "out_" acts as control voltage "SW_").

Modified Charge Pump—An Alternative Embodiment

As noted above, the two output signals "out_pos" and "out_neg" generated by the modified level shifter 600 of FIG. 10 can be used in an alternative embodiment of the charge pump circuit to reduce or eliminate potential gate oxide reliability problems associated with excessive voltages applied to the charge pump. As described above with reference to FIGS. 5b and 5c, the clock signals used to control the gates of the charge pump transistors (i.e., the P-channel transistors 208, 210, and the N-channel transistors 212, 214) have voltage swings of 2*Vdd. For example, as shown in FIG. 5c, the charge pump clock signals, "Clk1" and "Clk2", range from the negative power supply voltage −Vdd to the positive power supply voltage +Vdd. Similar to the gate oxide reliability issues described above with reference to the RF buffer and level shifter circuits, this full-rail voltage swing may present oxide reliability problems in the charge pump circuit. Therefore, a modified charge pump circuit is shown in FIG. 12 which reduces or eliminates potential gate oxide reliability problems by limiting the voltages applied to gate oxides to range from −Vdd to 0.9 volts.

Figure 12:
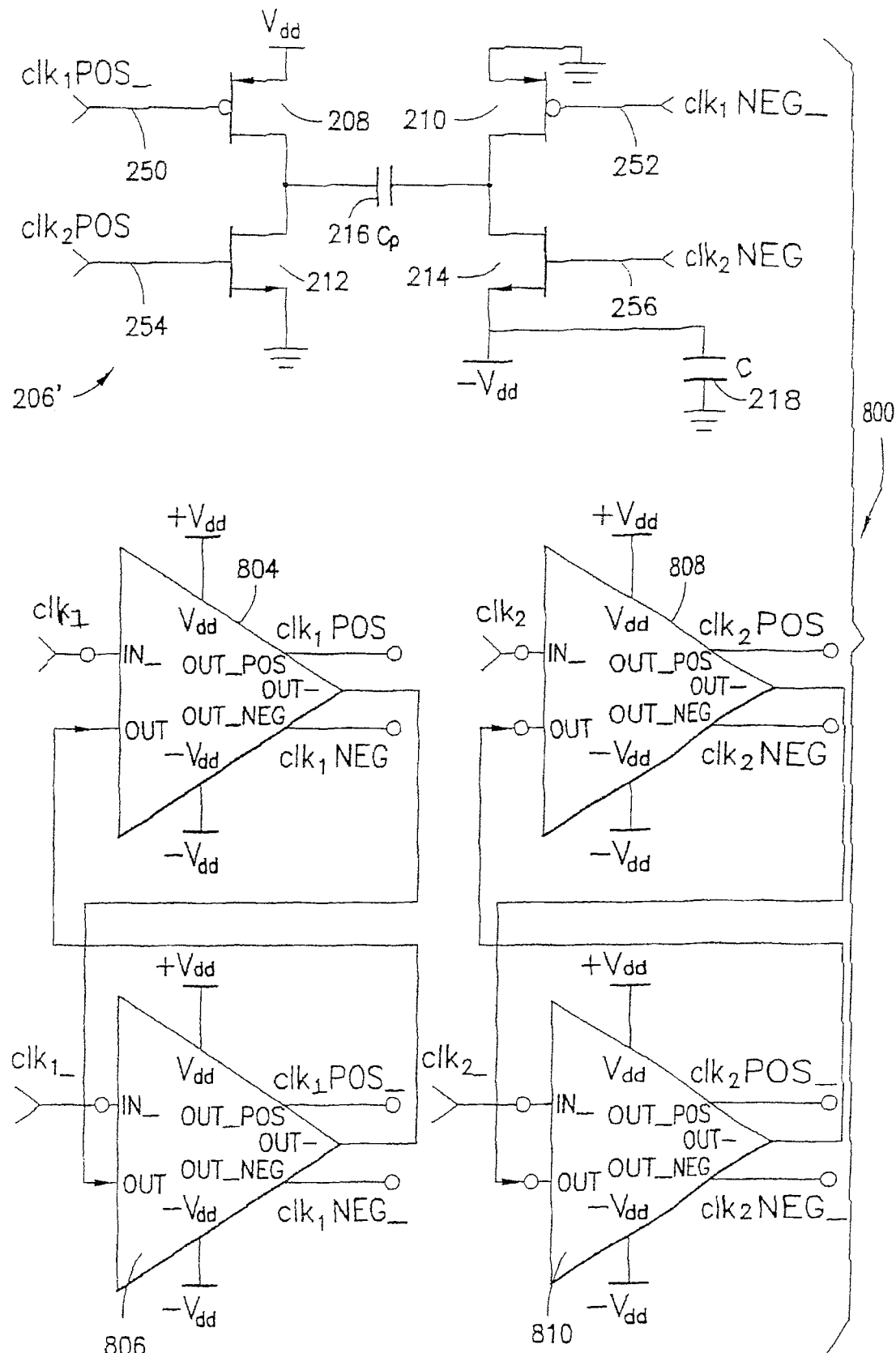
FIG. 12 is an electrical schematic of a modified charge pump using the level shifting circuit of FIG. 10.

FIG. 12 shows a modified charge pump 800 that uses the modified level shifter 600 described above with reference to FIG. 10. As shown in FIG. 12, the modified charge pump 800 comprises a charge pump circuit 206' and an inventive charge pump clock generation circuit 802. The charge pump clock generation circuit 802 generates the clock control signals used by the charge pump circuit 206'. The charge pump circuit 206' is very similar in design to the charge pump 206 described above with reference to FIG. 5b. For example, the charge pump 206' includes a pair of P-channel transistors 208, 210, and a pair of N-channel transistors 212, 214, in addition to a pass capacitor Cp 216 and an output capacitor C 218. In one embodiment of the charge pump circuit 206', the output capacitor C 218 has a capacitance on the order of a few hundred pF, and the capacitor Cp 216 has a capacitance of approximately 50 pF. Those skilled in the charge pump design arts shall recognize that other capacitance values can be used without departing from the scope or spirit of the present method and apparatus.

The charge pump 206' functions very similarly to the charge pump 206 described above with reference to FIG. 5a, and therefore its operation is not described in detail again here. The charge pump 206' shown in FIG. 12 differs from the charge pump 206 in that the control signals used to control the charge pump 206' transistor gates (i.e., the gates of the transistors 208, 210, 212, and 214) are limited to half-rail voltage swings (i.e., they are limited to range from −Vdd to ground, or from ground to Vdd). Potential gate oxide reliability problems invoked when the gate control voltages are allowed to swing a full rail (i.e., from −Vdd to Vdd) are thereby reduced or eliminated.

As shown in FIG. 12, the charge pump clock generation circuit 802 includes four modified level shifters 804, 806, 808 and 810, coupled together in a feedback configuration. In one embodiment of the modified charge pump, the four modified level shifters are implemented by the modified level shifter 600 described above with reference to FIG. 10. FIG. 12 shows the level shifters using the symbolic representation 601 of the level shifter 600 of FIG. 10. In this embodiment, the level shifters 804, 806, 808, and 810 perform identically to the level shifter 600 of FIG. 10. The two non-overlapping clock signals, "Clk1", and "Clk2" (and their inverse signals, "Clk1_" and "Clk2_", respectively) are input to the "in_" inputs of the level shifters as shown in FIG. 12. The two input clock signals, "Clk1" and "Clk2", are identical to the non-overlapping clock signals described above with reference to FIGS. 5a-5c. As shown above with reference to FIG. 5c, the two non-overlapping clock signals vary in voltage amplitude from −Vdd to +Vdd. In one embodiment, the clock signals vary from −3 VDC to +3 VDC.

The four modified level shifters generate the half-rail clock control signals that are used to control the charge pump 206'. Specifically, as shown in FIG. 12, the four level shifters generate the "CLK1POS_", "CLK1NEG_", "CLK2POS", and "CLK2NEG" control signals that are input to the charge pump transistor gate control nodes 250, 252, 254 and 256, respectively. In the embodiment shown in FIG. 12, the level shifters 806 and 808 generate the four transistor gate control signals "CLK1POS_", "CLK1NEG_", "CLK2POS", and "CLK2NEG". The level shifter 806 generates the "CLK1POS_" and "CLK1NEG_" gate control signals, while the level shifter 808 generates the "CLK2POS", and "CLK2NEG" gate control signals. More specifically, as shown in FIG. 12, the "out_pos" output of the level shifter 806 ("CLK1POS_") is coupled to control the transistor gate input 250 of the transistor 208. The "out_neg" output of the level shifter 806 ("CLK1NEG_") is coupled to control the transistor gate input 252 of the transistor 210. Similarly, the "out_pos" output of the level shifter 808 ("CLK2POS") is coupled to control the transistor gate input 254 of the transistor 214. Finally, the "out_neg" output of the level shifter 808 ("CLK2NEG") is coupled to control the transistor gate input 256 of the transistor 214. The clock generation circuit 802 functions to prevent excessive voltages across the gate oxides of the charge pump transistors.

Those skilled in the transistor design arts shall recognize that other control configurations can be used without departing from the spirit or scope of the present method and apparatus. For example, the other two level shifters (804, 810) can be used to generate the control signals in an alternative embodiment of the modified charge pump. Also, as described above with reference to the charge pump circuit 206, alternative transistor configurations (N-channel and P-channel) can be used to implement the modified charge pump 206' of the present method and apparatus.

As shown in FIG. 12, the four level shifters 804, 806, 808 and 810 are coupled together in level shifter pairs (804 with 806, and 808 with 810) in a feedback configuration that is very similar to the feedback topology of the level shifter described above with reference to FIG. 6a. For example, the "out_" output node of the level shifter 804 is provided as feedback to the "out" node of its associated pair level shifter 806. Similarly, the "out_" output node of the level shifter 806 is provided as feedback to the "out" node of its associated pair level shifter 804. Similarly, the "out_" output node of the level shifter 808 is provided as feedback to the "out" node of its associated pair level shifter 810. The "out_" output node of the level shifter 810 is provided as feedback to the "out" node of its associated pair level shifter 808. The feedback configuration is used by the clock generation circuit 802 in the generation of the four transistor gate control signals "CLK1POS_", "CLK1NEG_", "CLK2POS", and "CLK2NEG".

Summary

A novel RF switch is provided wherein the switch is fabricated using an SOI CMOS process. Fabricating the switch on an SOI substrate results in lack of substrate bias and allows the integration of key CMOS circuit building blocks with the RF switch elements. Integration of the CMOS building blocks with RF switch elements provides a fully integrated RF switch solution that requires use of only a single external power supply (i.e., the negative power supply voltage is generated internally by a charge pump circuit integrated with the RF switch). This results in improvements in RF switch isolation, insertion loss and compression. In one embodiment, the RF switch has a 1 dB compression point exceeding approximately 1 Watt, an insertion loss of less than approximately 0.5 dB, and switch isolation as high as approximately 40 dB. The inventive switch also provides improvements in switching times.

A number of embodiments of the present method and apparatus have been described. Nevertheless, it will be understood that various modifications may be made without departing from the spirit and scope of the method and apparatus.

Accordingly, it is to be understood that the present method and apparatus is not to be limited by the specific illustrated embodiments, but only by the scope of the appended claims.

What is claimed is:

1. An RF switching circuit comprising:
a switch transistor grouping,
a shunt transistor grouping coupled with the switch transistor grouping and including a node with a reference voltage;
control logic configured to output a first control signal and a second control signal; and
a voltage generator coupled with the control logic, the voltage generator comprising a charge pump and being configured to generate a voltage substantially more negative than the reference voltage;
wherein:
the switch transistor grouping is configured to receive the first control signal;
the shunt transistor grouping is configured to receive the second control signal; and
the switch transistor grouping and/or the shunt transistor grouping comprise a plurality of stacked transistors.

2. The RF switching circuit of claim 1, wherein the first control signal and the second control signal are switchable between respective higher and lower voltages than the reference voltage.

3. The RF switching circuit of claim 1, wherein the reference voltage is ground.

4. The RF switching circuit of claim 3, wherein the switch transistor grouping or the shunt transistor grouping comprise a plurality of stacked field effect transitor (FETs) in which the respective FETs have a gate that is insulated from its channel.

5. The RF switching circuit of claim 3, wherein the RF switching circuit includes a semiconductor-on-insulator (SOI) substrate.

6. The RF switching circuit of claim 3, wherein the shunt transistor grouping and/or the switch transistor grouping respectively comprise a plurality of stacked FETs; and
further comprising:
a plurality of switch gate resistors; and
a plurality of shunt gate resistors;
wherein:
the resistance value of the gate resistors respectively is at least 30 k ohms.

7. The RF switching circuit of claim 6, wherein the RF switching circuit is capable of passing and/or capable of not passing one or more high-power RF signals in connection with RF transmission of RF signals.

8. The RF switching circuit of claim 4, wherein the RF switching circuit includes a semiconductor-on-insulator (SOI) substrate.

9. The RF switching circuit of claim 8, wherein the SOI substrate comprises a thin-film semiconductor layer.

10. The RF switching circuit of claim 9, wherein the SOI substrate comprises at least a thin-film semiconductor layer and an insulating layer, wherein respective sources and drains of the respective FETs of the plurality of stacked FETs extend through an entire thickness of the semiconductor layer to the insulating layer.

11. The RF switching circuit of claim 1, further comprising:
an oscillator coupled with the charge pump, the charge pump being configured to receive clocking input signals from the oscillator;
a level shifting circuit coupled with the control logic; and
an RF buffer circuit isolating RF signal energy between the charge pump and the control logic.

12. An RF switching circuit comprising:
a switch transistor grouping comprising a plurality of stacked transistors;
a shunt transistor grouping, comprising another plurality of stacked transistors, coupled with the switch transistor grouping and including a grounded node;
control logic configured to output a first control signal and a second control signal; and
a voltage generator comprising a charge pump coupled with the control logic, the voltage generator being configured to generate a voltage substantially more negative than ground;
wherein:
the switch transistor grouping is configured to receive the first control signal;
the shunt transistor grouping is configured to receive the second control signal,
the RF switching circuit is implemented with semiconductor-on-insulator (SOI) technology; and
the RF switching circuit to pass and/or to not pass one or more high-power RF signals in connection with RF transmission of RF signals.

13. An on-chip method of switching RF signals, comprising:

inputting an RF signal to a switch transistor grouping comprised of a plurality of stacked transistors implemented with semiconductor-on-insulator (SOI) technology;

generating a first control signal and a second control signal;

in an ON state of the switch transistor grouping: enabling the switch transistor grouping using the first control signal and disabling a shunt transistor grouping, comprised of another plurality of stacked transistors implemented with SOI technology, using the second control signal, thereby passing the RF signal; and in an OFF state of the switch transistor grouping: disabling the switch transistor grouping using the first control signal and enabling the shunt transistor grouping using the second control signal, thereby not passing the RF signal;

wherein the passing the RF signal comprises passing a high-power RF signal in connection with RF transmission of RF signals; and wherein the not passing the RF signal comprises not passing a high-power RF signal in connection with RF transmission of RF signals.

14. The method of claim 13, wherein the switch transistor grouping and the shunt transistor grouping comprise field effect transitor (FETs) and the FETs respectively are coupled to gate resistors of at least 30 K ohms.

\* \* \* \* \*

UNITED STATES PATENT AND TRADEMARK OFFICE
CERTIFICATE OF CORRECTION

PATENT NO. : 10,622,993 B2
APPLICATION NO. : 16/167389
DATED : April 14, 2020
INVENTOR(S) : Mark L. Burgener, James S. Cable and Robert H. Benton Page 1 of 1

It is certified that error appears in the above-identified patent and that said Letters Patent is hereby corrected as shown below:

In the Claims

Column 28, Line 42, Claim 11, Line 7, after "buffer circuit" replace "isolating" with --to isolate--.

Signed and Sealed this
Nineteenth Day of January, 2021

Andrei Iancu
*Director of the United States Patent and Trademark Office*